(12) United States Patent
Salek et al.

(10) Patent No.: US 10,515,834 B2
(45) Date of Patent: Dec. 24, 2019

(54) MULTI-STATION TOOL WITH WAFER TRANSFER MICROCLIMATE SYSTEMS

(71) Applicant: Lam Research Corporation, Fremont, CA (US)

(72) Inventors: Mohsen Salek, Saratoga, CA (US); Richard M. Blank, San Jose, CA (US); Richard Howard Gould, Fremont, CA (US); Efrain Quiles, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 268 days.

(21) Appl. No.: 15/285,843

(22) Filed: Oct. 5, 2016

(65) Prior Publication Data

US 2017/0125272 A1    May 4, 2017

Related U.S. Application Data

(60) Provisional application No. 62/286,241, filed on Jan. 22, 2016, provisional application No. 62/240,404, filed on Oct. 12, 2015.

(51) Int. Cl.
*H01L 21/673* (2006.01)
*H01L 21/67* (2006.01)
(Continued)

(52) U.S. Cl.
CPC .. *H01L 21/67393* (2013.01); *H01L 21/67017* (2013.01); *H01L 21/6719* (2013.01);
(Continued)

(58) Field of Classification Search
CPC ......... H01L 21/67745; H01L 21/67393; H01L 21/67017; H01L 21/67161; H01L 21/6773;
(Continued)

(56) References Cited

U.S. PATENT DOCUMENTS 4,306,655 A * 12/1981 Smith ................ G11B 23/0236
    206/387.14
4,453,785 A * 6/1984 Smith ................ G11B 23/0236
    206/307.1
(Continued)

FOREIGN PATENT DOCUMENTS

JP      2015082577       4/2015
KR    20150088798 A *    8/2015    ....... H01L 21/67772
(Continued)

OTHER PUBLICATIONS

"N2 purge LP for EFEM/Process tool," Rorze Automation & Robotics, 1 pg. Downloaded Oct. 7, 2015.

*Primary Examiner* — Glenn F Myers
(74) *Attorney, Agent, or Firm* — Weaver Austin Villeneuve & Sampson LLP

(57) ABSTRACT

Systems and techniques for forming buffer gas microclimates around semiconductor wafers in environments external to a semiconductor processing chamber are disclosed. Such systems may include slot doors that may allow for single wafers to be removed from a multi-wafer stack while limiting outflow of buffer gas from a multi-wafer storage system, as well as buffer gas distributors that move in tandem with robot arms used to transport wafers for at least some of the movements of such robot arms.

17 Claims, 46 Drawing Sheets

(51) Int. Cl.
*H01L 21/677* (2006.01)
*H01L 21/687* (2006.01)

(52) U.S. Cl.
CPC .. *H01L 21/67126* (2013.01); *H01L 21/67161* (2013.01); *H01L 21/67178* (2013.01); *H01L 21/67201* (2013.01); *H01L 21/67389* (2013.01); *H01L 21/67766* (2013.01); *H01L 21/67772* (2013.01); *H01L 21/67778* (2013.01); *H01L 21/67781* (2013.01); *H01L 21/68707* (2013.01)

(58) Field of Classification Search
CPC ........... H01L 21/6778; H01L 21/68707; H01L 21/67736; H01L 21/67727; H01L 21/67386
USPC .......................................................... 414/940
See application file for complete search history.

(56) References Cited

U.S. PATENT DOCUMENTS

| | | | |
|---|---|---|---|
| 5,080,549 A | 1/1992 | Goodwin et al. | |
| 5,255,970 A * | 10/1993 | Theosabrata | A47B 81/067 312/107 |
| 5,720,387 A * | 2/1998 | Young | G11B 33/0444 206/308.1 |
| 6,183,183 B1 * | 2/2001 | Goodwin | H01L 21/6838 118/719 |
| 6,393,334 B1 | 5/2002 | Lewis et al. | |
| 6,540,467 B1 * | 4/2003 | Zohni | H01L 21/6732 206/710 |
| 6,645,355 B2 * | 11/2003 | Hanson | H01L 21/67173 204/198 |
| 6,652,212 B2 | 11/2003 | Kimoto et al. | |
| 7,115,891 B2 | 10/2006 | Komatsu | |
| 7,153,079 B2 * | 12/2006 | Miyano | H01L 21/67092 414/416.01 |
| 7,311,488 B2 * | 12/2007 | Park | H01L 21/67724 414/663 |
| 7,377,736 B1 | 5/2008 | Fujii et al. | |
| 7,635,244 B2 | 12/2009 | Sakiya | |
| 8,827,695 B2 | 9/2014 | Hsiao et al. | |
| 9,048,271 B2 | 6/2015 | Oosterlaken | |
| 2001/0048866 A1 | 12/2001 | Sakiya et al. | |
| 2002/0033606 A1 | 3/2002 | Kimoto et al. | |
| 2002/0106267 A1 | 8/2002 | Fujii et al. | |
| 2003/0023343 A1 * | 1/2003 | Tomita | H01L 21/67259 700/221 |
| 2004/0262548 A1 | 12/2004 | Komatsu | |
| 2005/0036856 A1 | 2/2005 | Yamashita | |
| 2005/0078312 A1 | 4/2005 | Fukuzaki et al. | |
| 2005/0079042 A1 | 4/2005 | Maeda | |
| 2005/0088003 A1 * | 4/2005 | Halpin | H01L 21/68707 294/64.3 |
| 2005/0191155 A1 | 9/2005 | Sakiya | |
| 2006/0100740 A1 | 5/2006 | Sakiya et al. | |
| 2006/0151450 A1 | 7/2006 | You et al. | |
| 2006/0184275 A1 | 8/2006 | Hosokawa et al. | |
| 2006/0216137 A1 | 9/2006 | Sakata et al. | |
| 2006/0244034 A1 | 11/2006 | Sakurai et al. | |
| 2007/0035184 A1 | 2/2007 | Sakiya | |
| 2007/0107317 A1 | 5/2007 | Takahagi et al. | |
| 2007/0170161 A1 | 7/2007 | Yoo et al. | |
| 2007/0209593 A1 | 9/2007 | Aggarwal et al. | |
| 2008/0019816 A1 | 1/2008 | Sato | |
| 2009/0016862 A1 * | 1/2009 | Gould | H01L 21/67363 414/225.01 |
| 2009/0287345 A1 | 11/2009 | Yamasaki et al. | |
| 2010/0167503 A1 * | 7/2010 | Lei | H01L 21/67173 438/478 |
| 2011/0097787 A1 | 4/2011 | Yamashita | |
| 2011/0124093 A1 | 5/2011 | Yanashita | |
| 2011/0130864 A1 | 6/2011 | Hirota | |
| 2012/0240710 A1 | 9/2012 | Yokoyama | |
| 2013/0085606 A1 | 4/2013 | Tagashira | |
| 2013/0226335 A1 | 8/2013 | Kraus et al. | |
| 2014/0119858 A1 * | 5/2014 | Koike | H01L 21/6773 414/222.13 |
| 2014/0262979 A1 | 9/2014 | Bonora et al. | |
| 2014/0284366 A1 | 9/2014 | Cho et al. | |
| 2014/0342571 A1 | 11/2014 | Park et al. | |
| 2014/0363258 A1 | 12/2014 | Iwamoto et al. | |
| 2015/0024671 A1 | 1/2015 | Taniyama et al. | |
| 2015/0030416 A1 | 1/2015 | Sakiya et al. | |
| 2015/0101482 A1 | 4/2015 | Chou et al. | |
| 2015/0128441 A1 | 5/2015 | Segawa et al. | |
| 2015/0170945 A1 | 6/2015 | Segawa et al. | |
| 2015/0183678 A1 | 7/2015 | Park et al. | |
| 2015/0221538 A1 | 8/2015 | Ochiai et al. | |
| 2015/0262854 A1 | 9/2015 | You et al. | |
| 2015/0287625 A1 | 10/2015 | Fujimoto et al. | |

FOREIGN PATENT DOCUMENTS

| | | | |
|---|---|---|---|
| WO | WO-03105216 A1 * | 12/2003 | ........ H01L 21/67727 |
| WO | 2011046129 | 4/2011 | |
| WO | 2013157462 | 10/2013 | |
| WO | 2014069291 | 5/2014 | |
| WO | 2014159916 | 10/2014 | |
| WO | 2015005192 | 1/2015 | |
| WO | 2015045582 | 4/2015 | |
| WO | 2015095050 | 6/2015 | |

* cited by examiner

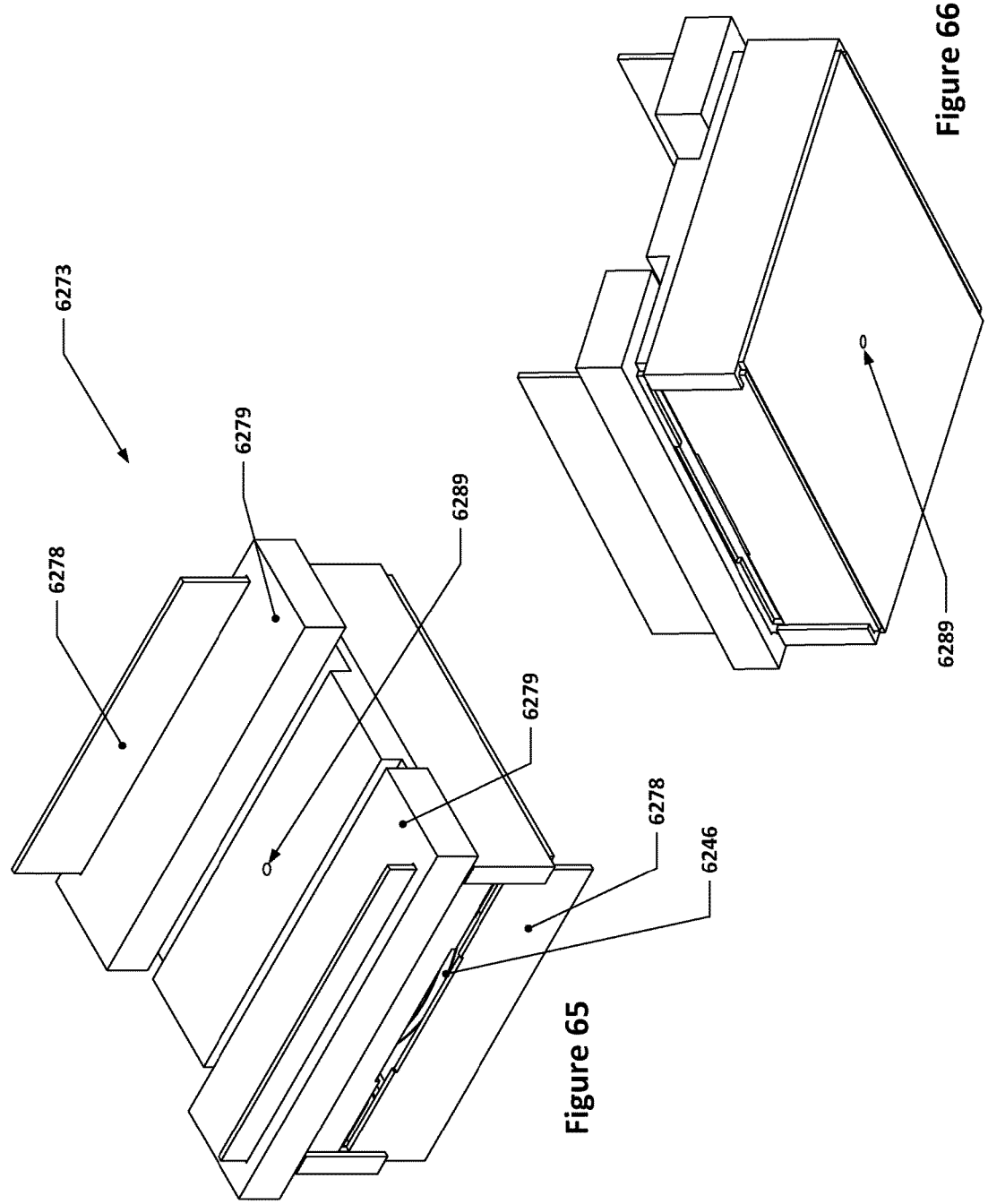

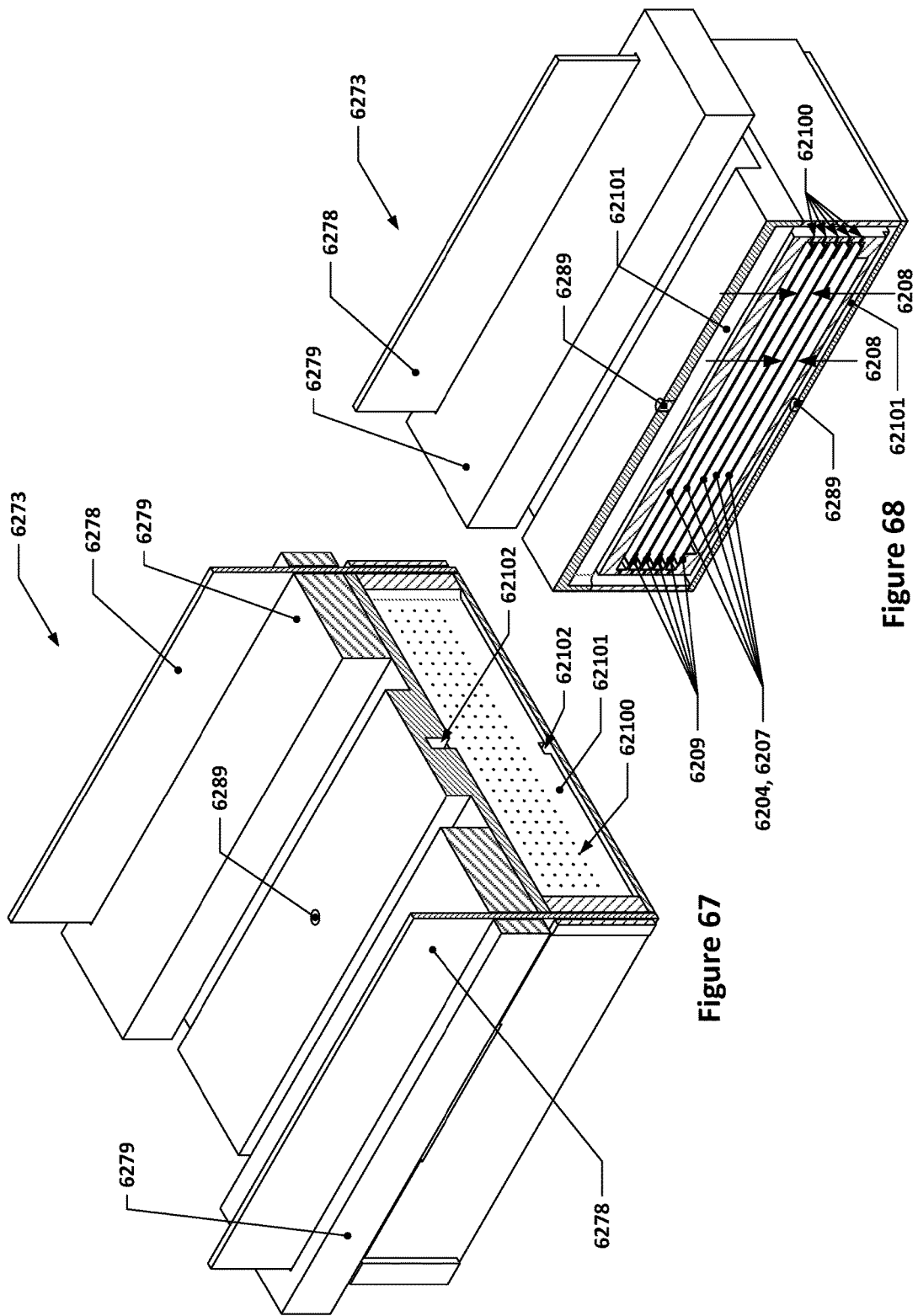

MULTI-STATION TOOL WITH WAFER TRANSFER MICROCLIMATE SYSTEMS

CROSS-REFERENCE TO RELATED APPLICATIONS

This application claims benefit of priority under 35 U.S.C. § 119(e) from pending U.S. Provisional Patent Application Nos. 62/240,404, filed on Oct. 12, 2015, and 62/286,241, filed Jan. 22, 2016, which are hereby incorporated herein by reference in their entireties for all purposes.

BACKGROUND

In semiconductor processing facilities, it is common for semiconductor wafers to be transported from semiconductor processing tool to semiconductor processing tool using a front-opening unified pod (FOUP). A FOUP typically includes a carrier housing with a vertical stack of wafer support structures, e.g., shelves that protrude from the side walls of the housing, that support a plurality of wafers in a spaced-apart stack. A typical FOUP may hold 25 or 30 wafers, although FOUPs with other capacities are possible. The wafers are typically spaced apart within the FOUP so that a wafer handling robot may insert an end effector between adjacent wafers in the stack and lift a wafer up and withdraw it without disturbing the other wafers.

FOUPs typically include a removable FOUP door that may be used to seal the FOUP from the ambient environment; a FOUP may be filled with a buffer gas of some sort that protects the wafers within the FOUP from conditions of the ambient environment within the semiconductor processing facility, e.g., from moisture or oxygen. The buffer gas may, for example, be clean dry air, nitrogen, or any other gas that is deemed more desirable than the facility air. The buffer gas is not, however, the same as the facility air that is typically flowed through the EFEM.

SUMMARY

Details of one or more implementations of the subject matter described in this specification are set forth in the accompanying drawings and the description below. Other features, aspects, and advantages will become apparent from the description, the drawings, and the claims.

In some implementations, an apparatus may be provided with a robot arm, an end effector attached to the robot arm and configured to support a semiconductor wafer during movement of the robot arm, and a buffer gas distributor configured to flow a buffer gas across a facing surface of the semiconductor wafer when the semiconductor wafer is supported by the end effector. In such implementations, the buffer gas distributor may be configured to move in tandem with the end effector during at least some movements of the robot arm, the buffer gas distributor and end effector may be spaced apart along the vertical axis such that the end effector and the buffer gas distributor are insertable into a stack of semiconductor wafers arrayed along an axis perpendicular to the semiconductor wafers, and the buffer gas distributor and the end effector may each be sized to fit within inter-wafer gaps in the stack of semiconductor wafers.

In some additional such implementations, the buffer gas distributor may be fixed in space with respect to the end effector and may move in tandem with the end effector during all movements of the robot arm.

In some additional or alternative such implementations, the array of semiconductor wafers may have an inter-wafer array spacing defined by wafer-supporting features in one or more pieces of equipment such as a front-opening unified pod, a wafer stocker, a wafer buffer, a load-lock, a multi-wafer cassette, or a side-by-side multi-wafer cassette. In some further such implementations, the portion of the buffer gas distributor that overlaps with the semiconductor wafer when the semiconductor wafer is supported by both the end effector and a wafer-supporting feature of the one or more pieces of equipment and when the buffer gas distributor is viewed along a first direction that is perpendicular to the semiconductor wafer may have a shape that does not overlap with the wafer-supporting features in the one or more pieces of equipment when viewed along the first direction. In some further such implementations, each wafer-supporting feature may have a gap that faces towards the end effector and the buffer gas distributor may have a width in a direction perpendicular to a long axis of the buffer gas distributor that is smaller than the gap.

In some implementations of the apparatus, the buffer gas distributor, in regions that overlap with the semiconductor wafer when the semiconductor wafer is supported by the end effector, may be no more than 9 mm thick along a direction that is normal to the semiconductor wafer, and the buffer gas distributor may include a bottom surface that faces the end effector, a top surface that faces in the opposite direction from the bottom surface of the buffer gas distributor, one or more side surfaces that span between the top surface of the buffer gas distributor and the bottom surface of the buffer gas distributor, one or more first gas distribution ports arranged on the bottom surface of the buffer gas distributor, a plurality of second gas distribution ports arranged on the side surfaces of the buffer gas distributor, and gas distribution passages configured to supply buffer gas to the one or more first gas distribution ports and the plurality of second gas distribution ports.

In some implementations of the apparatus, the buffer gas distributor may not extend across all of the semiconductor wafer when the semiconductor wafer is supported by the end effector and the buffer gas distributor is viewed along a first direction that is perpendicular to the semiconductor wafer.

In some further such implementations of the apparatus, when the semiconductor wafer is supported by the end effector and the buffer gas distributor is viewed along the first direction that is perpendicular to the semiconductor wafer, the buffer gas distributor may extend across at least 90% of the diameter of the semiconductor wafer in a second direction passing through a center axis of the semiconductor wafer and a mechanical interface joining the end effector to the robot arm and may extend only partially across the semiconductor wafer in a third direction that is perpendicular to both the first direction and the second direction.

In some implementations of the apparatus, at least the outermost half of the buffer gas distributor may be configured so as to not overlap with the semiconductor wafer when the semiconductor wafer is supported by the end effector and when viewed along an axis parallel to the semiconductor wafer.

In some implementations of the apparatus, the portion of the buffer gas distributor that extends over the semiconductor wafer when the semiconductor wafer is supported by the end effector may be configured so as to not overlap with the semiconductor wafer when viewed along an axis parallel to the semiconductor wafer.

In some implementations, an apparatus for processing semiconductor wafers may be provided. In such implementations, the apparatus may include an enclosure, an interface configured to support a multi-wafer storage system having N wafer support structures arrayed along a vertical axis, and a wall. The wafer support structures may be sized to support semiconductor wafers of diameter D, N may be an integer greater than 1, and each semiconductor wafer support structure may be spaced apart from any adjacent wafer support structure or wafer support structures in the array by an average distance d. The wall may include a horizontal slot with a width greater than D and a height less than (N−1)·d, the wall may have a height greater than (2·N−1)·d, the apparatus may be configured to provide for relative translation between the horizontal slot and the interface along the vertical axis, the wall may be positioned so as to be proximate to an opening of the multi-wafer storage system through which the semiconductor wafers, when the multi-wafer storage system is supported by the interface, may be loaded into or unloaded from the multi-wafer storage system, and the wall through which the semiconductor wafers may be loaded into or unloaded from the multi-wafer storage system may provide a flow restriction barrier between an interior volume of the multi-wafer storage system and an interior volume of the enclosure when the multi-wafer storage system is supported by the interface.

In some such implementations, the apparatus may further include a first buffer gas port configured to deliver a first buffer gas into the enclosure and a second buffer gas port configured to deliver a second buffer gas into the multi-wafer storage system when the multi-wafer storage system is supported by the interface.

In some additional or alternative implementations, the apparatus may further include a robot arm, an end effector attached to the robot arm and configured to support a semiconductor wafer during movement of the robot arm, and a buffer gas distributor configured to flow a first buffer gas across a facing surface of the semiconductor wafer when the semiconductor wafer is supported by the end effector. In such implementations, the buffer gas distributor may be configured to move in tandem with the end effector during at least some movements of the robot arm, the buffer gas distributor and end effector may be spaced apart such that the end effector and the buffer gas distributor are insertable through the horizontal slot and into an array of semiconductor wafers supported by the array of wafer support structures when the multi-wafer storage system is installed in the apparatus and stocked with the semiconductor wafers, and the buffer gas distributor and the end effector may each be sized to fit within inter-wafer gaps in the array of semiconductor wafers.

In some implementations, the apparatus may further include a first buffer gas port configured to deliver a second buffer gas into the enclosure and a second buffer gas port configured to deliver a third buffer gas into the multi-wafer storage system when the multi-wafer storage system is supported by the interface.

In some implementations, the first buffer gas, the second buffer gas, and the third buffer gas may all be provided by way of a facility nitrogen gas source.

In some implementations, the buffer gas distributor may be fixed in space with respect to the end effector and may move in tandem with the end effector during all movements of the robot arm.

In some implementations, the apparatus may further include the multi-wafer storage system, and the multi-wafer storage system may be supported by the interface.

In some implementations, the multi-wafer storage system may be a front-opening unified pod, a wafer stocker, a wafer buffer, a multi-wafer cassette, or a load-lock.

In some implementations, the apparatus may further include a drive mechanism configured to translate the wall along the vertical axis with respect to the enclosure; in other or additional such implementations, the drive mechanism may be configured to translate the interface along the vertical axis with respect to the enclosure or to translate both the interface and the wall in such a direction relative to one another.

In some implementations, the apparatus may further include a robot arm and an end effector attached to the robot arm and configured to support a semiconductor wafer during movement of the robot arm. In such implementations, the horizontal slot may have a middle portion having a first dimension along the vertical axis that is larger than corresponding second dimensions along the vertical axis of flanking portions of the horizontal slot located on opposing sides of the middle portion, the middle portion may be wider than a width of the portion of the end effector that is configured to support the semiconductor wafer during movement of the robot arm, the end effector may have wafer contact surfaces configured to contact a semiconductor wafer when the semiconductor wafer is supported by the end effector, the end effector may have one or more first bottom surfaces facing away from the wafer contact surfaces and located within the outer perimeter of the semiconductor wafer when the semiconductor wafer is supported by the end effector and the end effector is viewed along a direction that is perpendicular to the semiconductor wafer, and the first dimension may be greater than or equal to the second dimension plus a vertical distance between a bottommost surface of the one or more first bottom surfaces of the end effector and the wafer contact surfaces.

In some such implementations, the end effector may have one or more first upper surfaces that face away from the one or more first bottom surfaces and that pass through the horizontal slot when the end effector is used to place a semiconductor wafer into the multi-wafer storage system and the first dimension may be greater than or equal to a vertical distance between the bottommost surface of the one or more first bottom surfaces of the end effector and an uppermost surface of the one or more first upper surfaces of the end effector.

In some implementations of the apparatus, the apparatus may further include a buffer gas distributor configured to flow a buffer gas across a facing surface of the semiconductor wafer when the semiconductor wafer is supported by the end effector. The buffer gas distributor may be configured to move in tandem with the end effector during at least some movements of the robot arm, the buffer gas distributor and end effector may be spaced apart such that the end effector and the buffer gas distributor are insertable into an array of semiconductor wafers supported by the array of wafer support structures when the multi-wafer storage system is installed in the apparatus and stocked with the semiconductor wafers, the buffer gas distributor and the end effector may each be sized to fit within inter-wafer gaps in the array of semiconductor wafers, the buffer gas distributor may have one or more first upper surfaces that face away from the one or more first bottom surfaces and that pass through the horizontal slot when the end effector is used to remove a semiconductor wafer from the multi-wafer storage system, and the first dimension may be greater than or equal to a vertical distance between the bottommost surface of the one or more first bottom surfaces of the end effector and an uppermost surface of the one or more first upper surfaces of the buffer gas distributor.

In some implementations, an apparatus may be provided that includes a plurality of wafer processing chambers positioned in different locations, a chassis that supports the wafer processing chambers at the different locations, one or more multi-wafer cassettes, each multi-wafer cassette having N wafer support structures arranged along a vertical axis, one or more robot arms each having an end effector configured to support a semiconductor wafer during movement of that robot arm, and at least one buffer gas microclimate system. The buffer gas microclimate system may include at least one slot-door mechanism that may be part of each of the one or more multi-wafer cassettes, one or more buffer gas distributors configured to flow buffer gas across facing surfaces of semiconductor wafers supported by the one or more end effectors, or both at least one slot-door mechanism that may be part of each of the one or more multi-wafer cassettes and one or more buffer gas distributors configured to flow buffer gas across facing surfaces of semiconductor wafers supported by the one or more end effectors. In such implementations, the one or more robot arms may be configured to transfer semiconductor wafers from and to the one or more multi-wafer cassettes to the plurality of wafer processing chambers, the wafer support structures may be sized to support semiconductor wafers of diameter D, N may be an integer greater than 1, and each semiconductor wafer support structure may be spaced apart from any adjacent wafer support structure or wafer support structures in the array by an average distance d.

In some implementations of the apparatus, the at least one buffer gas microclimate system may include the at least one slot-door mechanism that may be part of each of the one or more multi-wafer cassettes. In such an implementation, each multi-wafer cassette may have a front opening sized to allow wafers to be inserted into or withdrawn from the multi-wafer cassette, and each slot-door mechanism may include a door with a horizontal slot having a width greater than D and a height less than $(N-1) \cdot d$ and a drive mechanism configured to translate, responsive to a mechanical input, the door vertically relative to the wafer support structures of the multi-wafer cassette of which that slot-door is a part. Each door may have a height greater than $(2 \cdot N-1) \cdot d$ and each door may be positioned in front of the front opening of the multi-wafer cassette of which that door is a part.

In some implementations, the at least one buffer gas microclimate system may include the one or more buffer gas distributors configured to flow buffer gas across facing surfaces of the semiconductor wafers supported by the one or more end effectors. In such implementations, each of the one or more buffer gas distributors may be associated with a different one of the one or more end effectors, each buffer gas distributor may be configured to move in tandem with the associated end effector during at least some movements of the robot arm of which the associated end effector is a part, each buffer gas distributor and associated end effector may be spaced apart such that that buffer gas distributor and associated end effector are insertable into a stack of N semiconductor wafers supported by the N wafer support structures when the N semiconductor wafers are supported by the N wafer support structures, and each buffer gas distributor and associated end effector may each be sized to fit within inter-wafer gaps in the stack of N semiconductor wafers.

In some implementations of the apparatus having the one or more buffer gas distributors, the at least one buffer gas microclimate system may also include at least one slot-door mechanism that may be part of each of the one or more multi-wafer cassettes. In such implementations, each multi-wafer cassette may have a front opening sized to allow wafers to be inserted into or withdrawn from the multi-wafer cassette and each slot-door mechanism may include a door with a horizontal slot having a width greater than D and a height less than $(N-1) \cdot d$ and a drive mechanism configured to translate, responsive to a mechanical input, the door vertically relative to the wafer support structures of the multi-wafer cassette of which that slot-door is a part. Each door may have a height greater than $(2 \cdot N-1) \cdot d$ and each door may be positioned in front of the front opening of the multi-wafer cassette of which that door is a part.

In some implementations of the apparatus, the apparatus may further include a horizontal wafer cassette conveyor configured to receive at least one of the one or more multi-wafer cassettes and translate the received at least one of the one or more multi-wafer cassettes between horizontal locations along a horizontal axis. In such an implementation, the wafer processing chambers may be positioned in spaced-apart locations on either side of the horizontal wafer cassette conveyor, and a first robot arm of the one or more robot arms may be configured to transport semiconductor wafers between a first multi-wafer cassette of the one or more multi-wafer cassettes and a first wafer processing chamber of the wafer processing chambers, a second wafer processing chamber of the wafer processing chambers, a third wafer processing chamber of the wafer processing chambers, and a fourth wafer processing chamber of the wafer processing chambers when the first multi-wafer cassette is at least positioned in a first horizontal location of the horizontal locations. The first wafer processing chamber and the second wafer processing chamber may be located on a first side of the horizontal wafer cassette conveyor, the third wafer processing chamber and the fourth wafer processing chamber may be located on a second side of the horizontal wafer cassette conveyor, and the first side of the horizontal wafer cassette conveyor may be on an opposite side of the horizontal wafer cassette conveyor from the second side of the horizontal wafer cassette conveyor.

In some such implementations of the apparatus, the apparatus may further include one or more vertical wafer cassette conveyors. Each vertical wafer cassette conveyor may be associated with a different one of the horizontal locations, and a first vertical wafer cassette conveyor of the one or more vertical wafer cassette conveyors may be associated with the first horizontal location. Each vertical wafer cassette conveyor may include one or more mechanical interfaces, and each mechanical interface of each vertical wafer cassette conveyor may be configured to interface with a multi-wafer cassette of the one or more multi-wafer cassettes when that mechanical interface is vertically aligned with that multi-wafer cassette and that multi-wafer cassette is positioned in the horizontal location associated with that vertical wafer cassette conveyor and is supported by the horizontal wafer cassette conveyor in a baseline vertical location. Each vertical wafer cassette conveyor may be configured to translate the one or more mechanical interfaces included in that vertical wafer cassette conveyor, and each multi-wafer cassette with which those one or more mechanical interfaces are interfaced, along a vertical axis to one or more vertical cassette locations, which may be at vertical locations at elevations other than the elevation of the baseline vertical location. In such implementations, the first robot arm may be configured to transport semiconductor wafers between the first multi-wafer cassette and the first wafer processing chamber, the second wafer processing chamber, the third wafer processing chamber, and the fourth wafer processing chamber when the first multi-wafer cassette is positioned in the first horizontal location and is also positioned in a first vertical cassette location of the one or more vertical cassette locations by the first vertical wafer cassette conveyor.

In some further such implementations, each mechanical interface may include at least one buffer gas port, and each multi-wafer cassette may include at least one buffer gas inlet. The at least one buffer gas inlet of each multi-wafer cassette may align with the at least one buffer gas port of each mechanical interface when that multi-wafer cassette is interfaced with that mechanical interface, thereby allowing buffer gas to be introduced to an interior volume of that multi-wafer cassette via that at least one buffer gas port and at least one buffer gas inlet.

In some implementations of the apparatus, a second vertical wafer cassette conveyor of the one or more vertical wafer cassette conveyors may be associated with a second horizontal location of the horizontal locations, the first robot arm may be interposed between the first horizontal location and the second horizontal location, each multi-wafer cassette may also include a rear opening that is also sized to allow semiconductor wafers to be inserted into or withdrawn from that multi-wafer cassette and that is opposite the front opening of that multi-wafer cassette, the at least one slot-door mechanism that may be part of each of the one or more multi-wafer cassettes may include—for each multi-wafer cassette—a second slot-door mechanism, the door of each second slot-door mechanism may be positioned in front of the rear opening of the multi-wafer cassette of which that second slot-door mechanism is a part, the second multi-wafer cassette is one of the one or more multi-wafer cassettes, and the first robot arm may also be configured to transport semiconductor wafers between a second multi-wafer cassette and the first wafer processing chamber, the second wafer processing chamber, the third wafer processing chamber, and the fourth wafer processing chamber when the second multi-wafer cassette is positioned in the second horizontal location and in the first vertical cassette location by the second vertical wafer cassette conveyor.

In some implementations of the apparatus, the apparatus may further include one or more vertical robot arm conveyors, as well as a fifth wafer processing chamber of the wafer processing chambers, a sixth wafer processing chamber of the wafer processing chambers, a seventh wafer processing chamber of the wafer processing chambers, and an eighth wafer processing chamber of the wafer processing chambers. The fifth wafer processing chamber, the sixth wafer processing chamber, the seventh wafer processing chamber, and the eighth wafer processing chamber may be located above the first wafer processing chamber, the second wafer processing chamber, the third wafer processing chamber, and the fourth wafer processing chamber, and each of the one or more vertical robot arm conveyors may be interposed between neighboring vertical wafer cassette conveyors. Each vertical robot arm conveyor may be configured to translate a corresponding one of the one or more robot arms along the vertical axis to one or more vertical robot arm locations. A first vertical robot arm location of the one or more vertical robot arm locations may be associated with the first vertical cassette location, and a second vertical robot arm location of the one or more vertical robot arm locations may be associated with a second vertical cassette location of the one or more vertical cassette locations different from the first vertical cassette location. The first robot arm may be configured to transport semiconductor wafers between the first multi-wafer cassette and the first wafer processing chamber, the second wafer processing chamber, the third wafer processing chamber, and the fourth wafer processing chamber when the first multi-wafer cassette is positioned in the first horizontal location and the first vertical cassette location and the first robot arm is positioned at the first vertical robot arm location, and the first robot arm may be further configured to transport semiconductor wafers between the first multi-wafer cassette and the fifth wafer processing chamber, the sixth wafer processing chamber, the seventh wafer processing chamber, and the eighth wafer processing chamber when the first multi-wafer cassette is positioned in the first horizontal location and the second vertical cassette location and the first robot arm is positioned at the second vertical robot arm location.

In some further such implementations, the apparatus may include a ninth wafer processing chamber of the wafer processing chambers, a tenth wafer processing chamber of the wafer processing chambers, an eleventh wafer processing chamber of the wafer processing chambers, a twelfth wafer processing chamber of the wafer processing chambers, a thirteenth wafer processing chamber of the wafer processing chambers, a fourteenth wafer processing chamber of the wafer processing chambers, a fifteenth wafer processing chamber of the wafer processing chambers, and a sixteenth wafer processing chamber of the wafer processing chambers. The ninth wafer processing chamber, tenth wafer processing chamber, thirteenth wafer processing chamber, and fourteenth wafer processing chamber may be located on the first side of the horizontal wafer cassette conveyor, and the eleventh wafer processing chamber, twelfth wafer processing chamber, fifteenth wafer processing chamber, and sixteenth wafer processing chamber may be located on the second side of the horizontal wafer cassette conveyor. Furthermore, the thirteenth wafer processing chamber, the fourteenth wafer processing chamber, the fifteenth wafer processing chamber, and the sixteenth wafer processing chamber may be located above the ninth wafer processing chamber, the tenth wafer processing chamber, the eleventh wafer processing chamber, and the twelfth wafer processing chamber, and the second horizontal location may be interposed between the first robot arm and a second robot arm of the one or more robot arms. The second robot arm may be configured to transport semiconductor wafers between the second multi-wafer cassette and the ninth wafer processing chamber, the tenth wafer processing chamber, the eleventh wafer processing chamber, and the twelfth wafer processing chamber when the second multi-wafer cassette is positioned in the second horizontal location and the first vertical cassette location and the second robot arm is positioned at the first vertical robot arm location, and the second robot arm may be further configured to transport semiconductor wafers between the second multi-wafer cassette and the thirteenth wafer processing chamber, the fourteenth wafer processing chamber, the fifteenth wafer processing chamber, and the sixteenth wafer processing chamber when the second multi-wafer cassette is positioned in the second horizontal location and the second vertical cassette location and the second robot arm is positioned at the second vertical robot arm location.

In some further such implementations of the apparatus, the at least one buffer gas microclimate system may include the one or more buffer gas distributors configured to flow buffer gas across facing surfaces of the semiconductor wafers supported by the one or more end effectors. Each of the one or more buffer gas distributors may be associated with a different one of the one or more end effectors, each buffer gas distributor may be configured to move in tandem with the associated end effector during at least some movements of the robot arm of which the associated end effector is a part, each buffer gas distributor and associated end effector may be spaced apart such that that buffer gas distributor and associated end effector are insertable into a stack of N semiconductor wafers supported by the N wafer support structures when the N semiconductor wafers are supported by the N wafer support structures, and each buffer gas distributor and associated end effector may each be sized to fit within inter-wafer gaps in the stack of N semiconductor wafers.

In some implementations of the apparatus, the apparatus may also include a horizontal wafer cassette conveyor configured to receive at least one of the one or more multi-wafer cassettes and translate the received at least one of the one or more multi-wafer cassettes between horizontal locations along a horizontal axis. In such implementations, the wafer processing chambers may be positioned in spaced-apart locations on either side of the horizontal wafer cassette conveyor, and a first robot arm of the one or more robot arms may be configured to transport semiconductor wafers between a first multi-wafer cassette of the one or more multi-wafer cassettes and a first wafer processing chamber of the wafer processing chambers, a second wafer processing chamber of the wafer processing chambers, a third wafer processing chamber of the wafer processing chambers, and a fourth wafer processing chamber of the wafer processing chambers when the first multi-wafer cassette is at least positioned in a first horizontal location of the horizontal locations. In such an implementation, the first robot arm may be associated with a first buffer gas distributor of the one or more buffer gas distributors, the first wafer processing chamber and the second wafer processing chamber may be located on a first side of the horizontal wafer cassette conveyor, the third wafer processing chamber and the fourth wafer processing chamber may be located on a second side of the horizontal wafer cassette conveyor, and the first side of the horizontal wafer cassette conveyor may be on an opposite side of the horizontal wafer cassette conveyor from the second side of the horizontal wafer cassette conveyor.

In some such implementations of the apparatus, the apparatus may further include one or more vertical wafer cassette conveyors. Each vertical wafer cassette conveyor may be associated with a different one of the horizontal locations, and a first vertical wafer cassette conveyor of the one or more vertical wafer cassette conveyors may be associated with the first horizontal location. Each vertical wafer cassette conveyor may include one or more mechanical interfaces, each of which may be configured to interface with a multi-wafer cassette of the one or more multi-wafer cassettes when that mechanical interface is vertically aligned with that multi-wafer cassette and that multi-wafer cassette is positioned in the horizontal location associated with that vertical wafer cassette conveyor and is supported by the horizontal wafer cassette conveyor in a baseline vertical location. Each vertical wafer cassette conveyor may be configured to translate the one or more mechanical interfaces included in that vertical wafer cassette conveyor, and each multi-wafer cassette with which those one or more mechanical interfaces are interfaced, along a vertical axis to one or more vertical cassette locations. The vertical cassette locations may be located at elevations different from the elevation that the the baseline vertical location is located at, and the first robot arm may be configured to transport semiconductor wafers between the first multi-wafer cassette and the first wafer processing chamber, the second wafer processing chamber, the third wafer processing chamber, and the fourth wafer processing chamber when the first multi-wafer cassette is positioned in the first horizontal location and is also positioned in a first vertical cassette location of the one or more vertical cassette locations by the first vertical wafer cassette conveyor.

In some additional such implementations, each mechanical interface may include at least one buffer gas port, each multi-wafer cassette may include at least one buffer gas inlet, and the at least one buffer gas inlet of each multi-wafer cassette may align with the at least one buffer gas port of each mechanical interface when that multi-wafer cassette is interfaced with that mechanical interface, thereby allowing buffer gas to be introduced to an interior volume of that multi-wafer cassette via that at least one buffer gas port and at least one buffer gas inlet.

In some implementations of the apparatus, a second vertical wafer cassette conveyor of the one or more vertical wafer cassette conveyors is associated with a second horizontal location of the horizontal locations, the first robot arm may be interposed between the first horizontal location and the second horizontal location, each multi-wafer cassette may also include a rear opening that is also sized to allow semiconductor wafers to be inserted into or withdrawn from that multi-wafer cassette and that is opposite the front opening of that multi-wafer cassette, the second multi-wafer cassette is one of the one or more multi-wafer cassettes, and the first robot arm may also be configured to transport semiconductor wafers between a second multi-wafer cassette and the first wafer processing chamber, the second wafer processing chamber, the third wafer processing chamber, and the fourth wafer processing chamber when the second multi-wafer cassette is positioned in the second horizontal location and in the first vertical cassette location by the second vertical wafer cassette conveyor.

In some such implementations, the apparatus may further include one or more vertical robot arm conveyors, a fifth wafer processing chamber of the wafer processing chambers, a sixth wafer processing chamber of the wafer processing chambers, a seventh wafer processing chamber of the wafer processing chambers, and an eighth wafer processing chamber of the wafer processing chambers. The fifth wafer processing chamber, the sixth wafer processing chamber, the seventh wafer processing chamber, and the eighth wafer processing chamber may be located above the first wafer processing chamber, the second wafer processing chamber, the third wafer processing chamber, and the fourth wafer processing chamber, and each of the one or more vertical robot arm conveyors may be interposed between neighboring vertical wafer cassette conveyors. Each vertical robot arm conveyor may be configured to translate a corresponding one of the one or more robot arms along the vertical axis to one or more vertical robot arm locations. A first vertical robot arm location of the one or more vertical robot arm locations may be associated with the first vertical cassette location, and a second vertical robot arm location of the one or more vertical robot arm locations may be associated with a second vertical cassette location of the one or more vertical cassette locations different from the first vertical cassette location. The first robot arm may be configured to transport semiconductor wafers between the first multi-wafer cassette and the first wafer processing chamber, the second wafer processing chamber, the third wafer processing chamber, and the fourth wafer processing chamber when the first multi-wafer cassette is positioned in the first horizontal location and the first vertical cassette location and the first robot arm is positioned at the first vertical robot arm location, and the first robot arm may be further configured to transport semiconductor wafers between the first multi-wafer cassette and the fifth wafer processing chamber, the sixth wafer processing chamber, the seventh wafer processing chamber, and the eighth wafer processing chamber when the first multi-wafer cassette is positioned in the first horizontal location and the second vertical cassette location and the first robot arm is positioned at the second vertical robot arm location.

In some such implementations, the apparatus may further include a ninth wafer processing chamber of the wafer processing chambers, a tenth wafer processing chamber of the wafer processing chambers, an eleventh wafer processing chamber of the wafer processing chambers, a twelfth wafer processing chamber of the wafer processing chambers, a thirteenth wafer processing chamber of the wafer processing chambers, a fourteenth wafer processing chamber of the wafer processing chambers, a fifteenth wafer processing chamber of the wafer processing chambers, and a sixteenth wafer processing chamber of the wafer processing chambers. The ninth wafer processing chamber, tenth wafer processing chamber, thirteenth wafer processing chamber, and fourteenth wafer processing chamber may be located on the first side of the horizontal wafer cassette conveyor, and the eleventh wafer processing chamber, twelfth wafer processing chamber, fifteenth wafer processing chamber, and sixteenth wafer processing chamber may be located on the second side of the horizontal wafer cassette conveyor. Furthermore, the thirteenth wafer processing chamber, the fourteenth wafer processing chamber, the fifteenth wafer processing chamber, and the sixteenth wafer processing chamber may be located above the ninth wafer processing chamber, the tenth wafer processing chamber, the eleventh wafer processing chamber, and the twelfth wafer processing chamber. The second horizontal location may be interposed between the first robot arm and a second robot arm of the one or more robot arms. The second robot arm may be configured to transport semiconductor wafers between the second multi-wafer cassette and the ninth wafer processing chamber, the tenth wafer processing chamber, the eleventh wafer processing chamber, and the twelfth wafer processing chamber when the second multi-wafer cassette is positioned in the second horizontal location and the first vertical cassette location and the second robot arm is positioned at the first vertical robot arm location, and the second robot arm may be further configured to transport semiconductor wafers between the second multi-wafer cassette and the thirteenth wafer processing chamber, the fourteenth wafer processing chamber, the fifteenth wafer processing chamber, and the sixteenth wafer processing chamber when the second multi-wafer cassette is positioned in the second horizontal location and the second vertical cassette location and the second robot arm is positioned at the second vertical robot arm location.

In some such implementations, the at least one buffer gas microclimate system may also include the at least one slot-door mechanism that may be part of each of the one or more multi-wafer cassettes. In such implementations, each multi-wafer cassette may have a front opening sized to allow wafers to be inserted into or withdrawn from the multi-wafer cassette, and each slot-door mechanism may include a door with a horizontal slot having a width greater than D and a height less than $(N-1) \cdot d$, and a drive mechanism configured to translate, responsive to a mechanical input, the door vertically relative to the wafer support structures of the multi-wafer cassette of which that slot-door is a part. Each door may have a height greater than $(2 \cdot N-1) \cdot d$; and each door may be positioned in front of the front opening of the multi-wafer cassette of which that door is a part.

In some implementations, an equipment front end module (EFEM) for a semiconductor processing tool may be provided. The EFEM may include one or more walls at least partially defining an interior volume of the EFEM, a wafer handling robot configured to move wafers within the interior volume of the EFEM, a buffer gas port configured to deliver a buffer gas supplied through the buffer gas port to the interior volume of the EFEM, a buffer gas control valve, the buffer gas control valve configured to regulate the flow of the buffer gas through the buffer gas port, and a controller, the controller including one or more processors communicatively connected with a memory and with the buffer gas control valve. The memory may include computer-executable instructions for causing the controller to determine when a wafer is being moved within the interior volume by the robot, transition, responsive at least in part to determining that a wafer is being moved within the interior volume of the EFEM by the robot, the buffer gas control valve to a first flow state to cause the buffer gas to flow into the interior volume of the EFEM, determine when a wafer is not being moved within the interior volume of the EFEM by the robot, and transition, responsive at least in part to determining that a wafer is not being moved within the interior volume of the EFEM by the robot, the buffer gas control valve to a second flow state in which the flow rate of the buffer gas is lower than in the first flow state.

In some such implementations, the EFEM may further include a facility air control valve configured to regulate flow of facility air through the interior volume of the EFEM. The facility air control valve may be communicatively connected with the one or more processors of the controller, and the memory may further include computer-executable instructions for causing the controller to: transition, responsive at least in part to determining that a wafer is not being moved within the interior volume of the EFEM by the robot, the facility air control valve to a third flow state to cause the facility air to flow into the interior volume of the EFEM, and transition, responsive at least in part to determining that a wafer is being moved within the interior volume of the EFEM by the robot, the facility air control valve to a fourth flow state in which the flow rate of the facility air is lower than in the third flow state.

In some implementations of the EFEM, the EFEM may further include one or more loading interfaces configured to interface with one or more front-opening unified pods (FOUPs) such that wafers may be transferred from one of the one or more FOUPs into an interior volume of the EFEM or from the interior volume of the EFEM into one of the one or more FOUPs. The EFEM may also include one or more loadlock interfaces configured to interface with one or more loadlocks through which wafers may be transferred into a processing area of the semiconductor processing tool from the interior volume of the EFEM or from the processing area of the semiconductor processing tool into the interior volume of the EFEM.

In some implementations of the EFEM, the robot may include a multi-wafer end effector that is configured to support multiple semiconductor wafers simultaneously.

In some implementations, an equipment front end module (EFEM) for a semiconductor processing tool may be provided that includes one or more walls at least partially defining an interior volume of the EFEM, one or more partition walls dividing the interior volume of the EFEM into a first interior sub-volume and a second interior sub-volume, a buffer gas port configured to deliver a buffer gas supplied through the buffer gas port to the second interior sub-volume, a first wafer handling robot configured to move wafers within the first interior sub-volume, a second wafer handling robot configured to move wafers within the second interior sub-volume, a first gas handler configured to flow facility air through the first interior sub-volume, and a second gas handler configured to flow the buffer gas through the second interior sub-volume.

In some implementations, a wafer handling robot for a semiconductor processing tool may be provided. The wafer handling robot may include a robot arm, an end effector configured to support a semiconductor wafer, and a buffer gas distributor configured to flow a buffer gas across the upper surface of the semiconductor wafer when the semiconductor wafer is supported by the end effector. The end effector may be located at an end of the robot arm, the buffer gas distributor may be supported, directly or indirectly, by the robot arm, and the buffer gas distributor may be configured to move in tandem with the end effector for at least some movements of the robot arm.

In some implementations of the wafer handling robot, the buffer gas distributor may include a gas distribution paddle and a support arm. The gas distribution paddle may have a first surface facing towards, and offset from, the end effector. The first surface may include one or more buffer gas distribution ports configured to direct the buffer gas towards the end effector, and the support arm may support the gas distribution paddle and may be supported by the robot arm.

In some implementations of the wafer handling robot, the gas distribution paddle may have a substantially circular shape and may have an outer diameter that is larger than ±10% of the diameter of the semiconductor wafer that the end effector is configured to support.

In some such implementations of the wafer handling robot, the wafer handling robot may further include a rotational pivot that joins the support arm with the robot arm, and the rotational pivot may be configured to rotate the gas distribution paddle from a first position where the gas distribution paddle is centered over the semiconductor wafer when the end effector is supporting semiconductor wafer to a second position where the gas distribution paddle is not centered over the semiconductor wafer when the end effector is supporting semiconductor wafer.

In some other or additional such implementations, the wafer handling robot may include a translation mechanism that joins the support arm with the robot arm, and the translation mechanism may be configured to translate the gas distribution paddle from a first position where the gas distribution paddle is centered over the semiconductor wafer when the end effector is supporting semiconductor wafer to a second position where the gas distribution paddle is not centered over the semiconductor wafer when the end effector is supporting semiconductor wafer.

In some implementations of the wafer handling robot, the gas distribution paddle may include one or more side buffer gas distribution ports on one or more sides of the gas distribution paddle, and the side buffer gas distribution ports may be configured to flow the buffer gas in one or more directions within ±30° of parallel with a wafer support plane defined by the end effector.

In some implementations, an apparatus for interfacing with a front opening unified pod (FOUP) for use in semiconductor manufacturing may be provided. The FOUP may include a removable FOUP door and a plurality of wafer support structures arranged in a vertical stack, each wafer support structure configured to support a semiconductor wafer of diameter D. The apparatus may include a platform configured to receive a FOUP, a door, the door including a horizontal slot with a width greater than D and a height less than a total height of the vertical stack of the wafer support structures, a front-opening interface mechanism (FIM), wherein the FIM is configured to remove the removable FOUP door from the FOUP after the FOUP is positioned on the platform, and a drive unit configured to move the door along a vertical axis.

In some such implementations, the height of the horizontal slot may be less than 50% of the total height of the vertical stack of the wafer support structures.

In some implementations, the FOUP may have an average separation distance between adjacent wafer support structures and the height of the horizontal slot may be less than 300% of the average separation distance.

In some implementations, the apparatus may further include a buffer gas supply port configured to flow a buffer gas into the FOUP when the FOUP is positioned on the platform.

In some implementations, an apparatus for interfacing with a front opening unified pod (FOUP) for use in semiconductor manufacturing may be provided. The FOUP may include a removable FOUP door and a plurality of wafer support structures arranged in a vertical stack, each wafer support structure configured to support a semiconductor wafer of diameter D. The apparatus may include a platform configured to receive a FOUP, a vertical drive mechanism configured to move the platform along a vertical axis, a wall, the wall including a horizontal slot with a width greater than D and a height less than a total height of the vertical stack of the wafer support structures, and a front-opening interface mechanism (FIM), wherein the FIM is configured to remove the removable FOUP door from the FOUP after the FOUP is positioned on the platform and after the platform is vertically positioned so as to align the FOUP door with the FIM.

In some implementations, the height of the horizontal slot may be less than 50% of the total height of the vertical stack of the wafer support structures.

In some implementations, the FOUP may have an average separation distance between adjacent wafer support structures and the height of the horizontal slot is less than 300% of the average separation distance.

In some implementations, the FOUP may have an average separation distance between adjacent wafer support structures and the height of the horizontal slot is less than 300% of the average separation distance.

In some implementations, the apparatus may further include a buffer gas supply port configured to flow a buffer gas into the FOUP when the FOUP is positioned on the platform.

BRIEF DESCRIPTION OF THE DRAWINGS

The various implementations disclosed herein are illustrated by way of example, and not by way of limitation, in the figures of the accompanying drawings, in which reference numerals with the same last two digits refer to similar elements in different implementations (in some instances involving 5-digit reference numerals, the last three digits of five-digit reference numbers may be the same instead of only the last two digits).

FIGS. 65 and 66 depict top- and bottom-isometric views of an example multi-wafer cassette that may be used in the example multi-station semiconductor processing tool of FIG. 62.

FIGS. 67 and 68 depict different cutaway views of the example multi-wafer cassette of FIG. 65.

Figure 1:
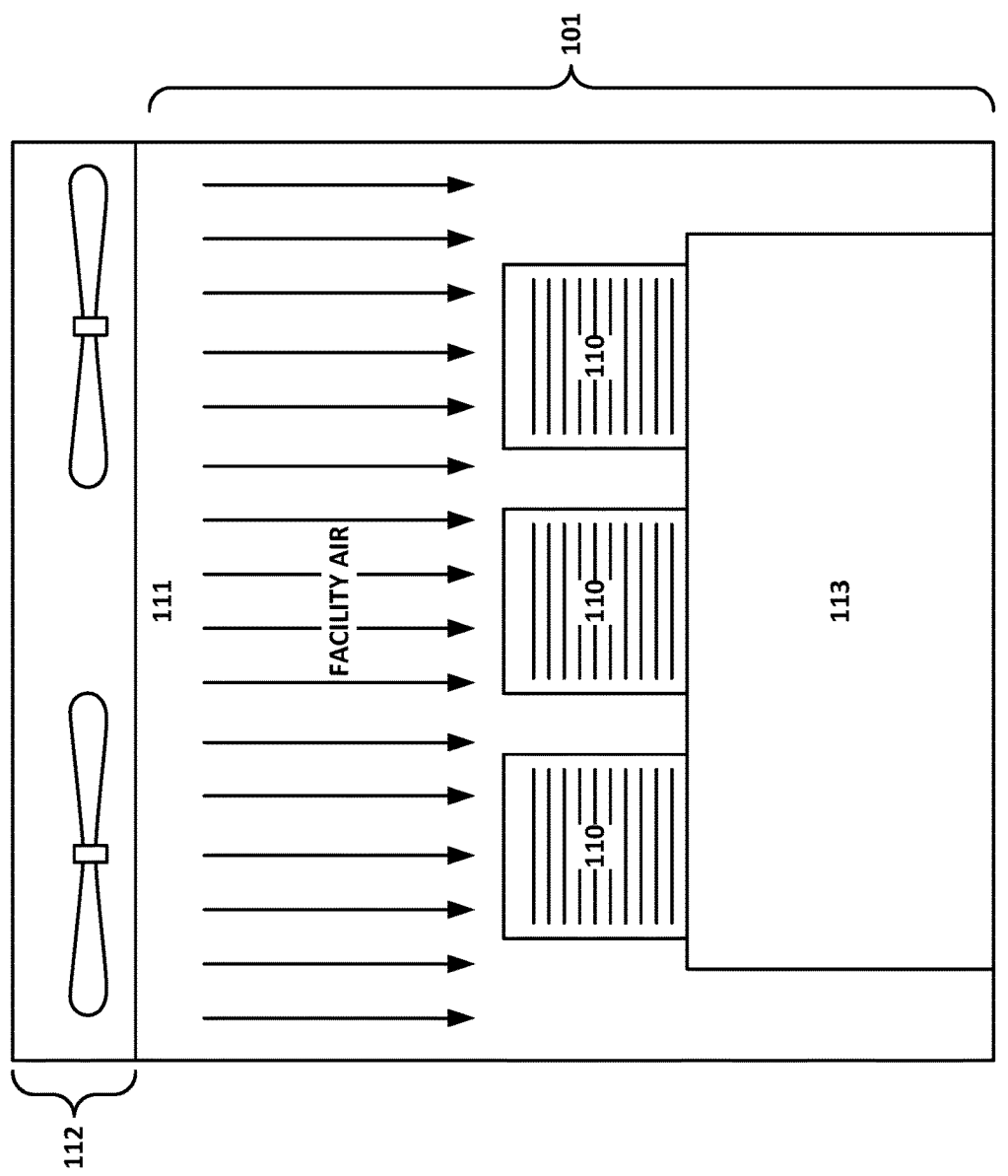
FIG. 1 depicts an example EFEM in which facility air is flowed downwards through the interior volume of the EFEM.

The implementations shown in the Figures are intended to be representative illustrations, and are not to be viewed as limiting the disclosed concepts to only the structures depicted. It is to be understood that other implementations that differ from the depicted examples may also fall within the scope of this disclosure and the accompanying claims.

DETAILED DESCRIPTION

Discussed herein are various techniques, systems, and apparatuses for providing enhanced wafer protection using a buffer gas, which may also be referred to as a "purge" gas. Buffer gases are largely or completely inert/non-reactive with respect to semiconductor wafers, and may, when a wafer is surrounded by such buffer gas, prevent or mitigate damage to the wafer. It is to be understood that for each of the implementations discussed below, such buffer gas may be any of a variety of such gases and may be provided by facility sources of such gases, e.g., a facility nitrogen gas source.

In a typical semiconductor processing facility, a FOUP may be transported from semiconductor processing tool to semiconductor processing tool by way of an overhead transport system, e.g., an overhead tramway that picks up FOUPs from above, lifts them clear of the semiconductor processing tool, moves them to another semiconductor processing tool, and then lowers the FOUP down to the other semiconductor processing tool.

Each semiconductor processing tool may have a load port unit, which may have platforms, interfaces, or stages for receiving FOUPs. The load port units may be adjacent to an equipment front end module (EFEM) that includes one or more wafer transfer robots; the EFEM may also include one or more loadlocks or other adjacent structures that serve as an interface to the portions of the semiconductor processing tool that perform semiconductor processing operations. EFEMs typically have large interior volumes, and are equipped with gas handlers. The gas handler is typically configured to draw facility air in and push it through the EFEM interior volume. Such gas handlers may typically provide air flows of several hundred cubic feet per minute or higher, e.g., 1200 cubic feet per minute. While the facility air is typically filtered before it reaches the interior volume, e.g., by an ultra-low particulate air (ULPA) filter, the facility air may still have levels of moisture, oxygen, and/or other contaminants that may adversely affect features on a processed wafer. Wafers that are transferred through the EFEM and that are exposed to facility air may be damaged by such contaminants during such transit. This has only recently become a recognized issue due to the shrinking size of semiconductor features; the potential damage caused by such exposure did not previously present a significant risk since the feature size of wafers only recently became small enough that such damage could interfere with the proper operation of the circuits formed on a wafer. Wafers may be exposed to facility air in other contexts as well, not just in the context of an EFEM.

Some or all of the present inventors determined that such potential contamination/damage could be prevented or mitigated by generating a "microclimate" of buffer gas around a semiconductor wafer as it transited the EFEM or other structure. Several potential techniques for creating and managing such microclimates are discussed below.

It is to be understood that the various concepts discussed below may be implemented in isolation or in various permutations and combinations. A combinatory approach may provide better protection from contamination to the wafers than using only a single one of the concepts discussed herein in isolation. Moreover, many of the concepts discussed herein may include features similar to those included in other concepts discussed herein. In such instances, similar structures in different embodiment may be referred to in the Figures using the same last two digits. Unless indicated otherwise, the discussion of such a feature in the context of one embodiment is generally equally applicable to the corresponding feature, as indicated by the use of the same last two digits in the feature numbering in the drawings, in other embodiments.

EFEM Microclimates

As discussed, earlier, EFEMs present a particularly troublesome environment with respect to wafer contamination. Some strategies for mitigating this risk are discussed below.

Figure 2:
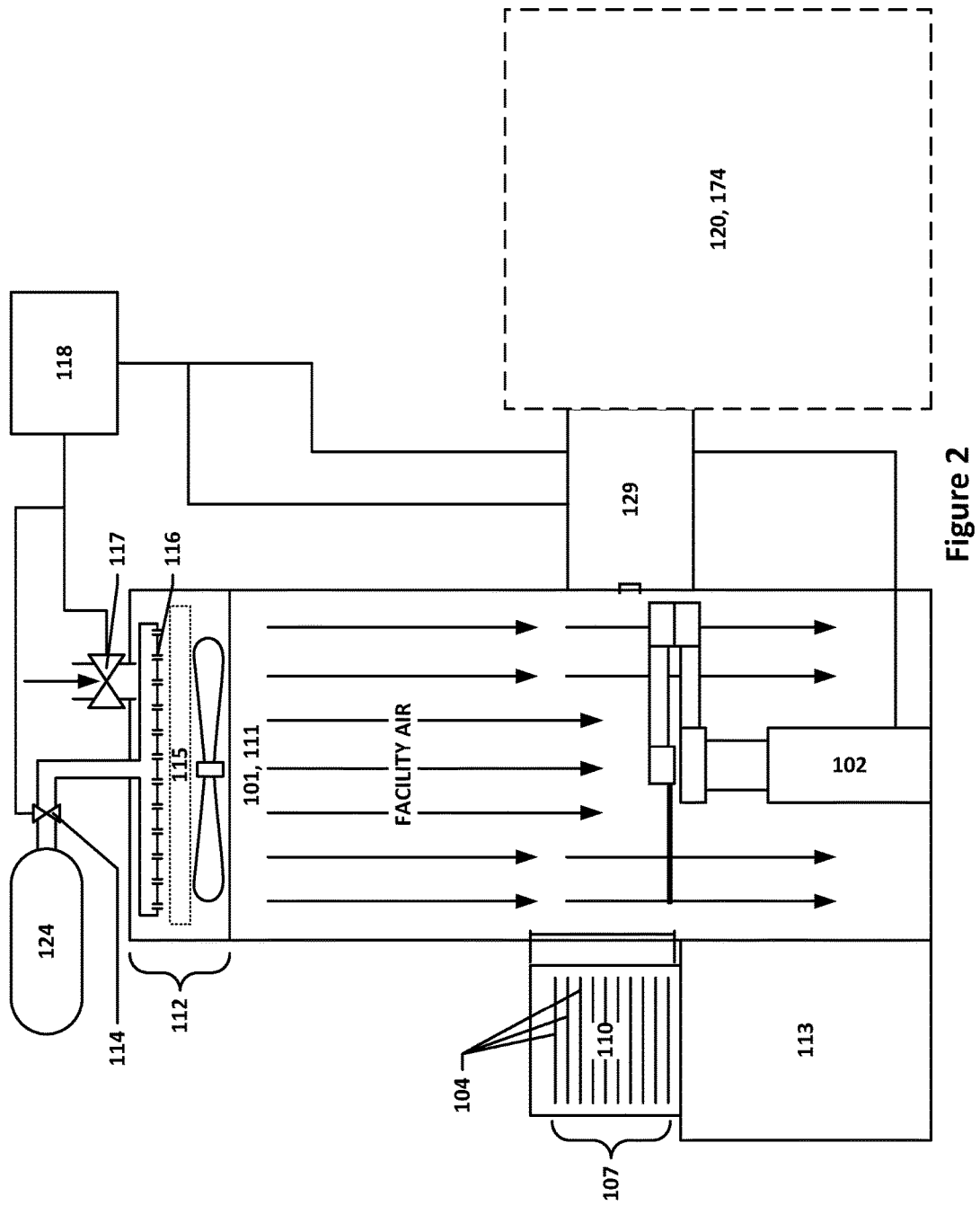
FIGS. 2 and 3 depict side views of the example EFEM of FIG. 1.

In FIG. 1, an EFEM 111 is shown in which facility air is flowed downwards through the interior volume of the EFEM 111. A load port unit 113 with three platforms for receiving FOUPs 110 may be connected with the EFEM 111. FIG. 2 depicts a side view of the EFEM 111 of FIG. 1. As can be seen, the gas handler 112 is connected with a buffer gas supply 124, which may be a facility gas source or an accumulator that may store a large volume of buffer gas to allow a buffer gas flow that exceeds the capacity of the facility buffer gas supply. The buffer gas supply 124 may be connected to a buffer gas distributor 116 or distribution system that may be configured to distribute the buffer gas within the gas handler 112 (or within another location) such that the buffer gas may flow through the wafer transit area of the EFEM 111. The flow of buffer gas from the buffer gas supply 124 may be controlled by a buffer gas control valve 114, which may, in turn, be controlled by a controller 118. The flow of facility air through the gas handler 112 may similarly be controlled by a facility air control valve 117 that is also controlled by the controller 118.

During non-wafer-transfer operations, such as in FIG. 2, the controller 118 may keep the buffer gas control valve 114 closed and the facility air control valve 117 open, allowing facility air to be flowed through the EFEM 111 (this maintains a positive pressure within the EFEM 111, and prevents particulates and other contaminants from entering the EFEM 111 except through the filtration system of the gas handler 112).

Figure 3:
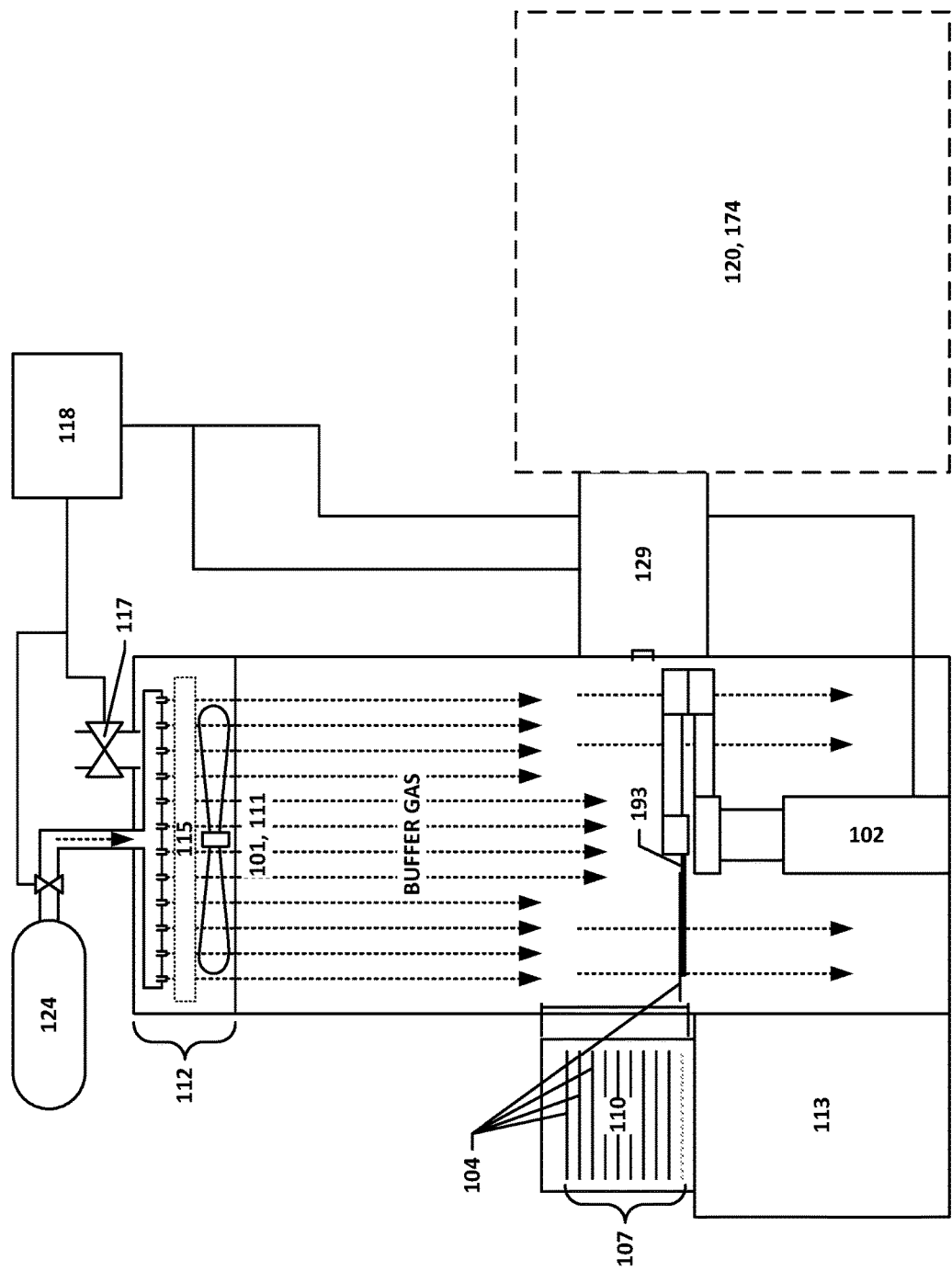

When wafers are being transferred within the interior volume of the EFEM 111, such as in FIG. 3 (in which the bottommost wafer has been withdrawn from a stack 107 of wafers 104 in the FOUP 110 by an end effector 193 of a robot arm 102 in order to allow it to be transferred to load-lock 129, which leads to a transfer chamber 120 and/or one or more wafer processing chambers 174), the controller 118 may control the buffer gas control valve 114 such that buffer gas is allowed to flow into the gas handler 112 and into the EFEM 111 interior volume. At the same time, the controller 118 may cause the facility air control valve 117 (which may be a facility air shutoff damper or other flow control device, for example) to close so as to limit the amount of facility air that flows through the EFEM 111 interior volume. Thus, the atmosphere in the interior volume of the EFEM 111 may be switched between facility air during times when wafers are not transiting the interior volume and buffer gas when wafers are transiting the interior volume. It is to be understood that such gas flows may be digital, e.g., the buffer gas flow or the facility air flow may be either completely on or completely off, or one or both such flows may be managed so that there are intermediate flow levels used. For example, during buffer gas delivery, the facility air control valve may be set to flow a reduced level of facility air such that the EFEM environment experiences a blend of buffer gas and facility air. Accordingly, the control valves used may be, depending on the implementation, either shut-off valves or flow control valves. In some implementations of such systems, the EFEM 111 may be configured to recirculate the gas that is flowed through the EFEM 111, e.g., by having a gas return passage that transports gas from the bottom of the EFEM 111 up to the upper part of the EFEM 111, where such recirculated gas may be re-introduced into the interior volume of the EFEM 111. In some such implementations, or in alternative or additional implementations, the EFEM 111 may not switch back and forth between facility air and buffer gas. For example, when wafers are initially delivered to an EFEM in a FOUP, the EFEM may have facility air within it which may be evacuated and replaced with buffer gas. This buffer gas may then be used continuously the entire time the FOUP is docked (it may be recirculated and periodically replenished to replace buffer gas lost to leaks and other escape paths, or it may simply be flowed continuously).

In various implementations, the gas handler 112 or fan filter unit may also include a condenser and heater system 115 that may be used to remove moisture from the gas that is flowed through the gas handler 112 (through condensing it out); the heater may be used to raise the temperature of such gas after the condensation process lowers the gas temperature.

Figure 4:
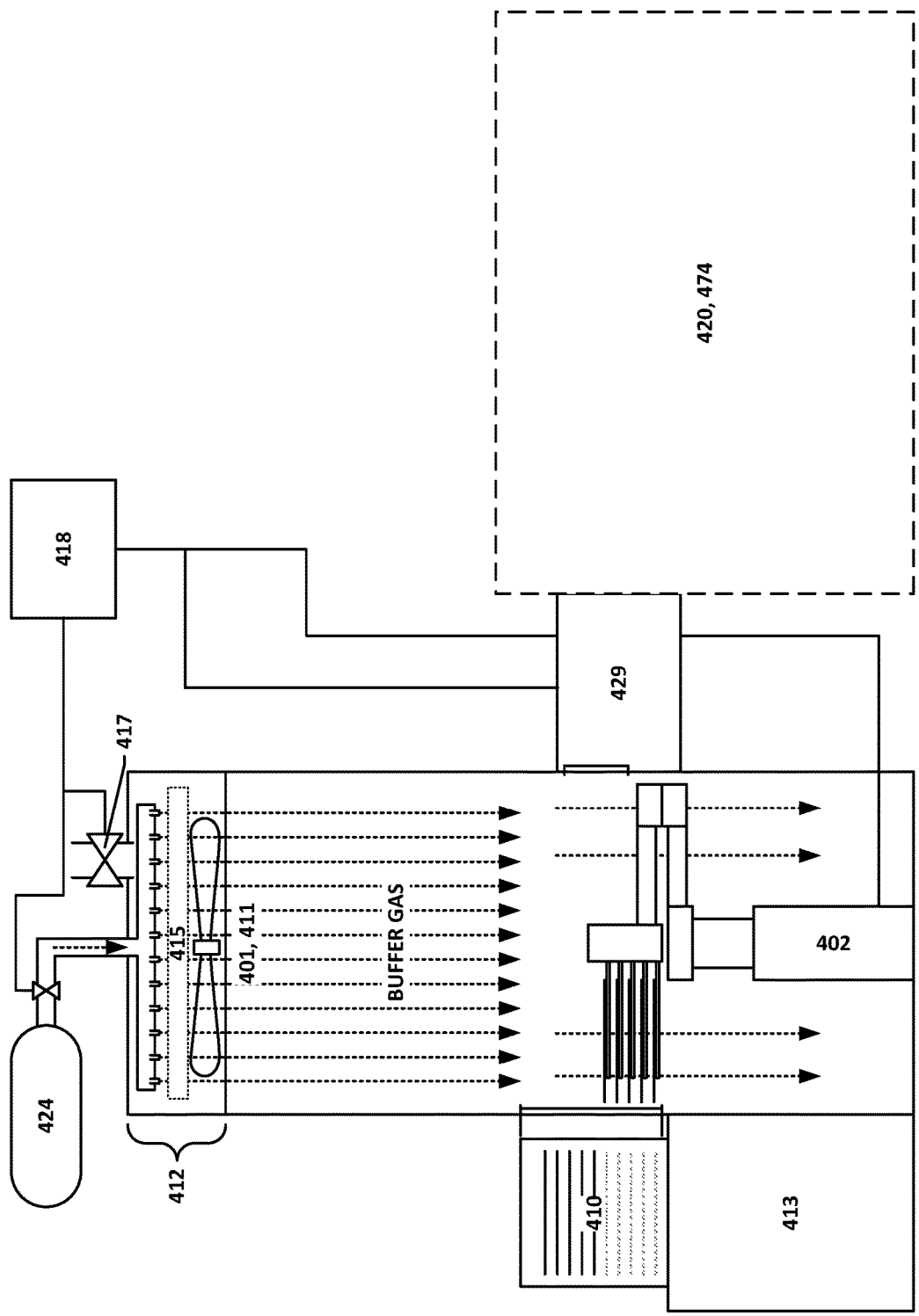
FIG. 4 depicts an alternate example EFEM design with a multi-wafer end effector.

Since some buffer gases, such as $N_2$, are a) expensive and b) a safety risk (nitrogen, for example, can pose a suffocation risk if significant quantities are introduced into the ambient environment of a semiconductor processing facility—such as may occur if 1200 cubic feet per minute are flowed through hundreds of EFEMs for semiconductor processing tools that are not hermetically sealed), it may be desirable to curtail the flow of buffer gas to a short interval. In such cases, it may be desirable to use a multi-wafer end effector, i.e., an end effector configured to support and carry multiple wafers simultaneously. In this manner, multiple wafers may transit the EFEM simultaneously, as shown in FIG. 4, while the buffer gas is flowing—this avoids having to flow the buffer gas for additional intervals for the extra wafers that are transported by the end effectors. For example, in FIG. 4, the robot arm 402 is equipped with a 5-wafer end effector 493 that is able to lift and transport five semiconductor wafers 104 simultaneously. The other systems shown in FIG. 4 operate in a manner similar to the corresponding systems in FIG. 1.

Figure 5:
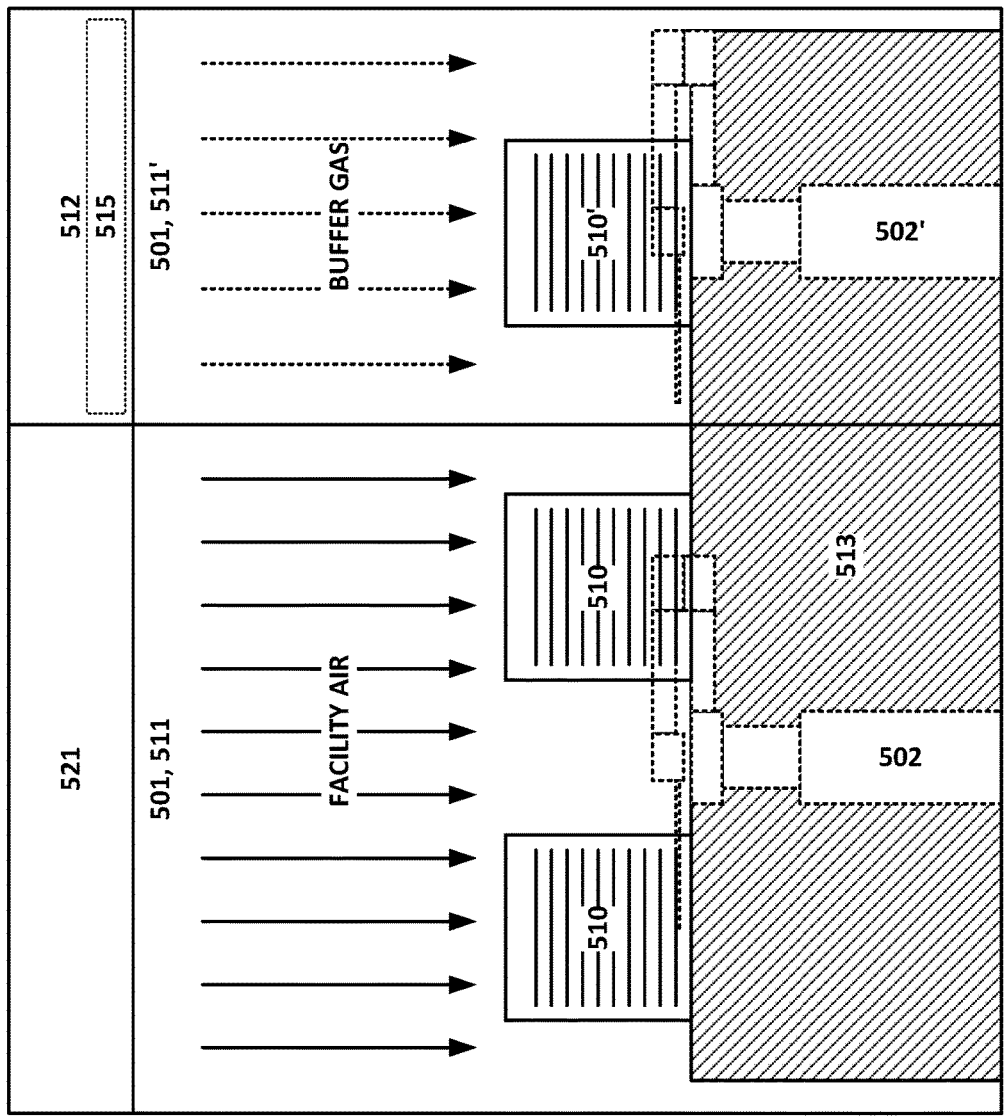
FIG. 5 depicts an example partitioned EFEM in which the EFEM has facility air and buffer gas EFEM partitions.

Another potential technique for buffer gas microclimate generation is to use an EFEM that has an interior barrier or partition wall that separates the interior volume of the EFEM into two sub-volumes: a first interior sub-volume and a second interior sub-volume. The first interior sub-volume may have facility air circulated through it, whereas the second interior sub-volume may have buffer gas circulated through it. In these types of implementations, each sub-volume may have its own wafer handling robot. FIG. 5 depicts such an implementation. In FIG. 5, the enclosure 501 has a facility-air EFEM 511 and a buffer gas EFEM 511'. Each EFEM 511 and 511' may have a corresponding robot arm 502 and 502', respectively, that may be used to transport semiconductor wafers from FOUPs 510 on load port unit 513 into and out of their respective EFEMs 511 and 511'. The facility-air EFEM 511 may be equipped with a facility air handler 521, and the buffer gas EFEM 511' may be equipped with a buffer gas handler 512, which may optionally include a condenser/heater unit 515 to condition the buffer gas environment.

Wafer Transfer Robot Microclimates

Whereas the above techniques and systems facilitate the production and maintenance of a buffer gas environment within an EFEM, some or all of the present inventors also conceived of alternative or supplemental techniques that may be used to generate a much more localized buffer gas microclimate in the immediate vicinity of a semiconductor wafer as it transits the interior volume of the EFEM. Such techniques may be used in the context of a buffer-gas equipped EFEM, such as those discussed earlier, or may be used in normal facility-air EFEM units.

Figure 6:
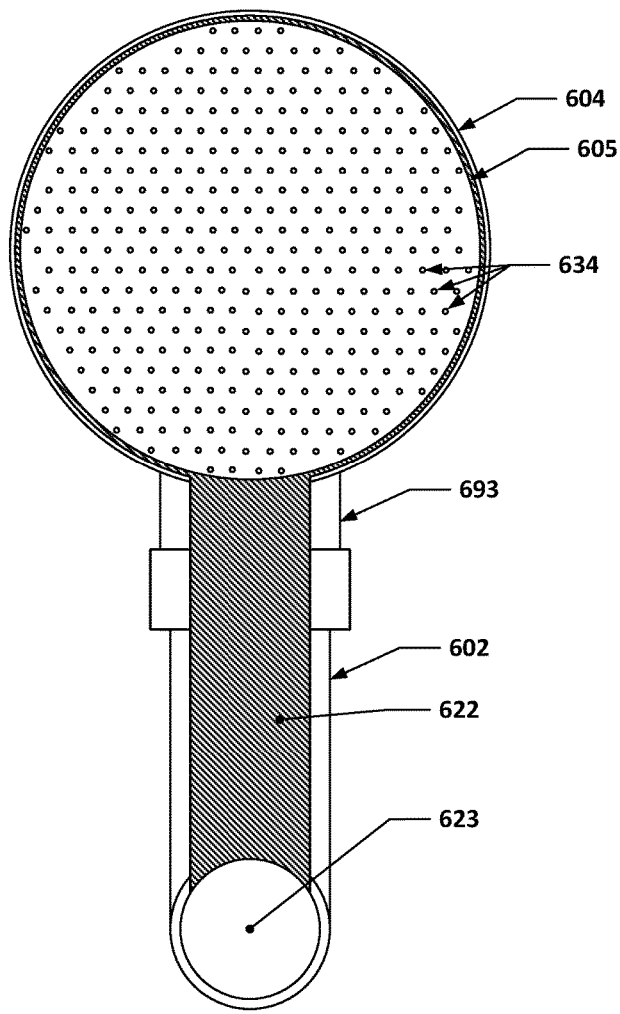
FIGS. 6 and 7 depict top and side views, respectively, of an example buffer gas distributor.
Figure 7:
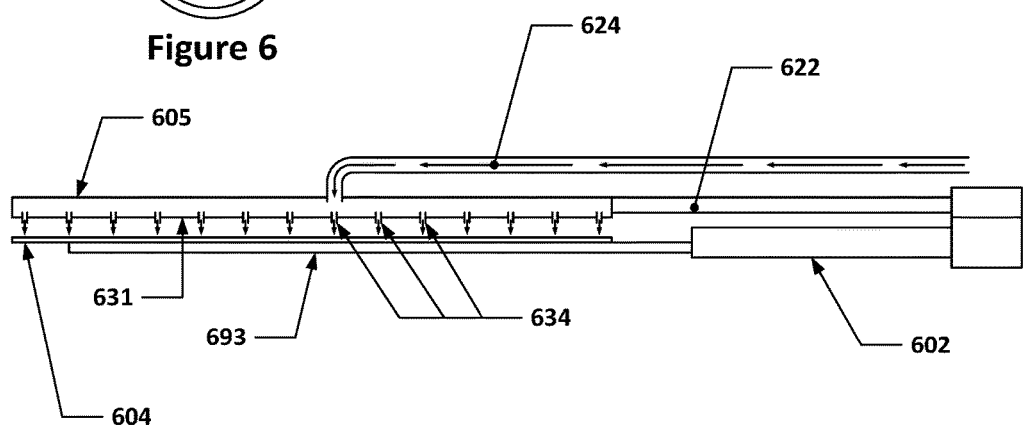

In such techniques, the wafer handling robot may be equipped with a buffer gas distributor that is configured to distribute the buffer gas directly over the wafer. In some such implementations, such as the one shown in FIGS. 6 and 7, the buffer gas distributor 605 may be substantially circular and generally the same size as the wafer 604. The buffer gas distributor 605 may be offset from the wafer 604 such that there is a gap between the buffer gas distributor 605 and a facing surface, i.e., a surface that faces the buffer gas distributor, of the wafer 604 when the wafer 604 is supported by an end effector 693 of the robot arm 602; this gap may be on the order of a few millimeters, e.g., one centimeter or less. One or more buffer gas distribution ports 634 may be located in a first surface, e.g., bottom surface 631, of the buffer gas distributor 605 that faces the wafer 604 when the wafer 604 is supported by the end effector 693; when buffer gas is flowed through the buffer gas distributor 605 and out of the buffer gas distribution ports 634, the buffer gas may flow across the wafer 604 and act as a gaseous, protective layer. Additionally, the buffer gas distributor 605 may also serve as a physical barrier that obstructs the flow of facility air towards the wafer 604. Thus, when the buffer gas distributor 605 is centered over the wafer 604 and buffer gas is flowed through it, the wafer 604 may be protected from the facility air flow by both the buffer gas distributor 605 itself, as well as the buffer gas flowed from the buffer gas distributor 605. As shown in FIG. 7, the buffer gas may be supplied to the buffer gas distributor 605 by way of a buffer gas supply 624 which, in this example, is a tube that is connected to a facility buffer gas supply (not shown). It is to be understood that in other implementations of buffer gas distributors, such as some of those discussed herein, the buffer gas may be supplied to the buffer gas distribution ports by way of passages or plenums that are located within the body of the buffer gas distributor instead of by way of a separate passage external to the buffer gas distributor, as shown in FIG. 7.

In some such implementations, such as the one shown in FIGS. 6 through 10, the buffer gas distributor may be supported on a support arm 622 that is attached to a support arm rotational pivot 623 that allows the buffer gas distributor 605 to be swung away from the wafer 604 in a plane parallel to the wafer 604. Since FOUPs may support the wafers they contain along the edges of the wafer, a buffer gas distributor 605 that is generally the same size as the wafer 604 may interfere with such wafer supports. The support arm rotational pivot 623 may allow the buffer gas distributor to be pivoted to the side when the robot arm extends into the FOUP, thereby allowing the buffer gas distributor to not interfere with the wafer supports in the FOUP. The buffer gas distributor may be kept over the wafer as long as possible so as to shield it from the facility air flow within the EFEM. Accordingly, the buffer gas distributor may be rotated away from the wafer when the wafer has already partially left the EFEM, e.g., when it is in the FOUP vestibule, which may be 10 cm or so deep (see FIG. 10).

Figure 8:
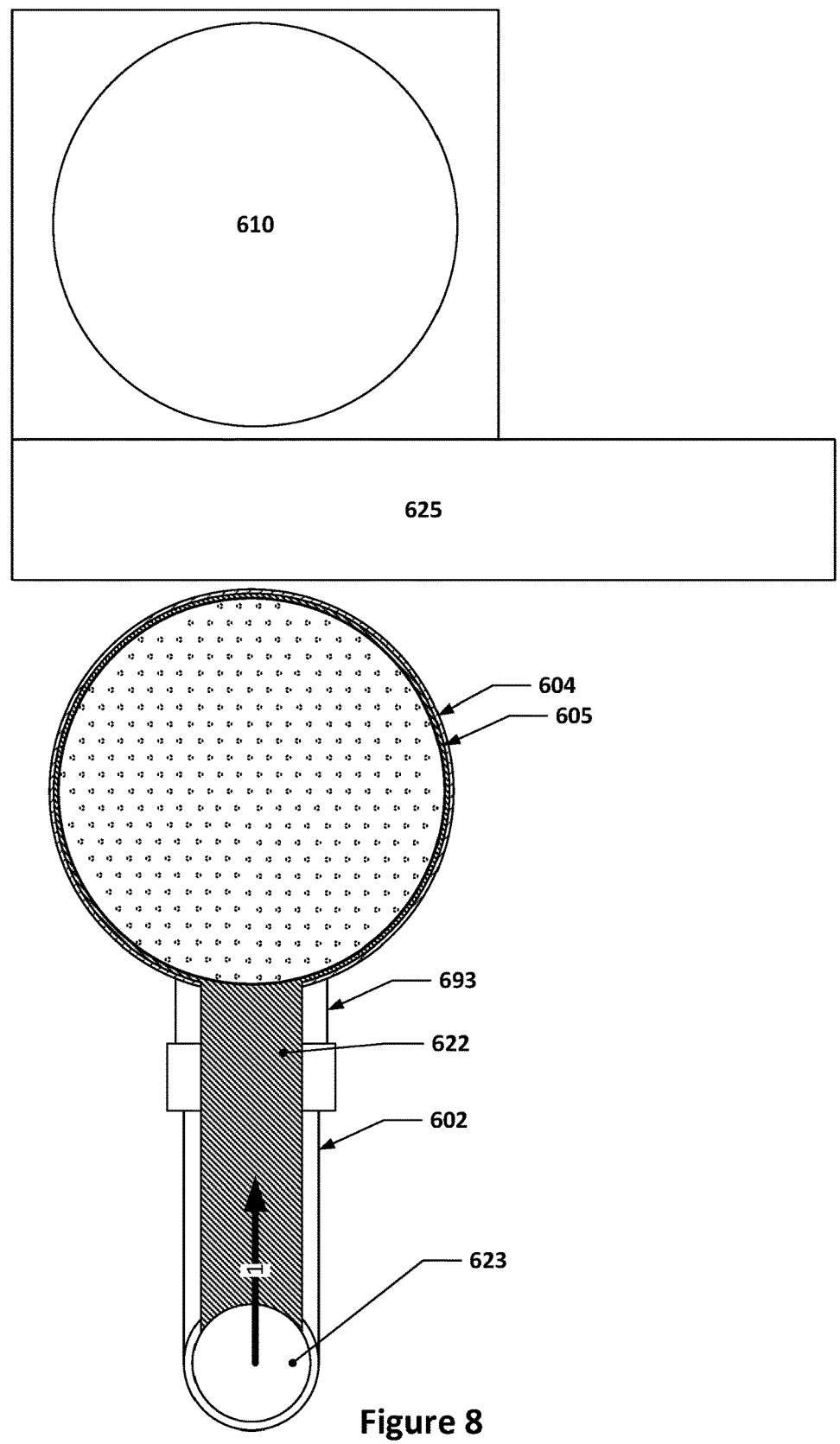
FIGS. 8 through 10 depict top views of an example rotatable buffer gas distributor during various phases of operation.
Figure 9:
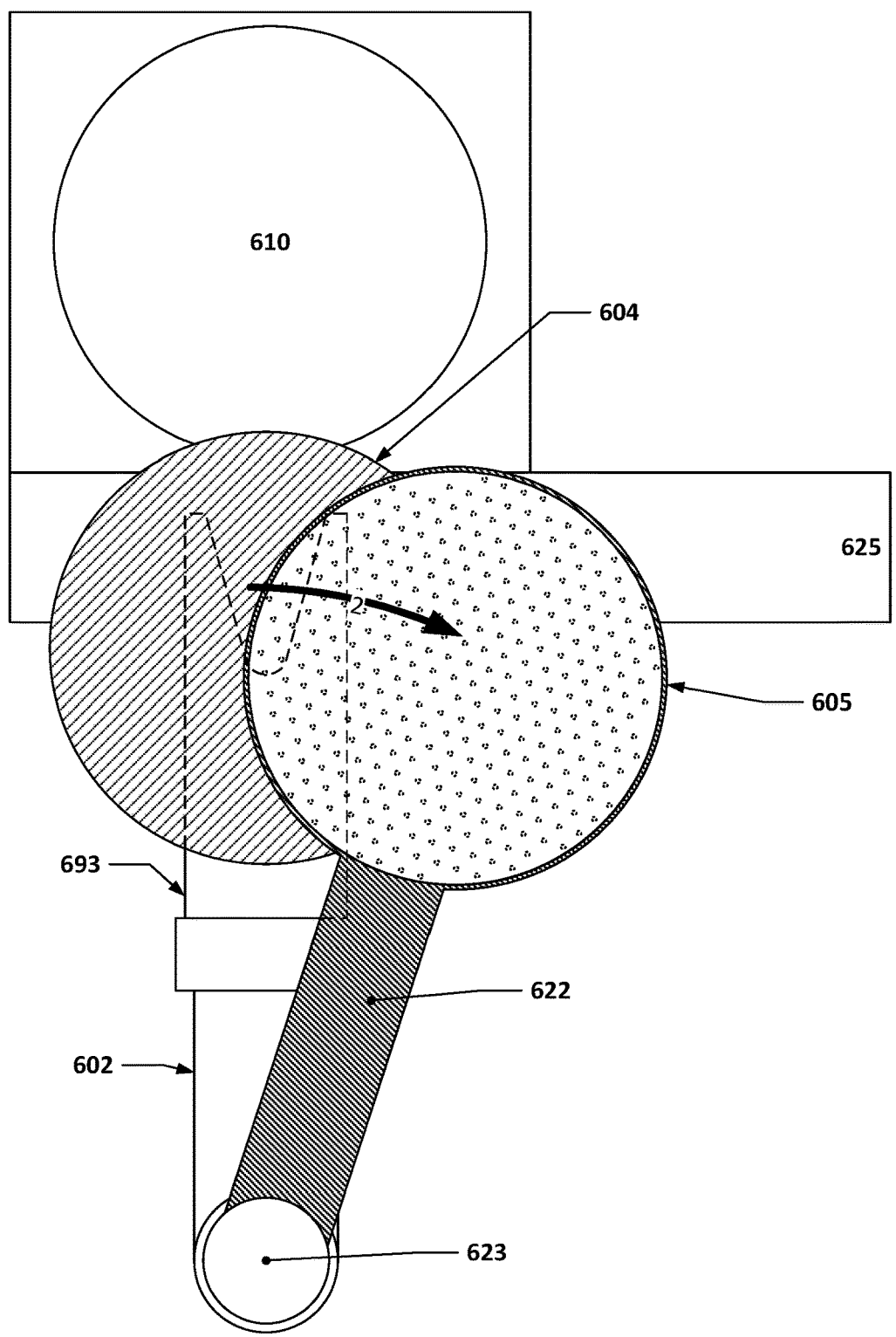
Figure 10:
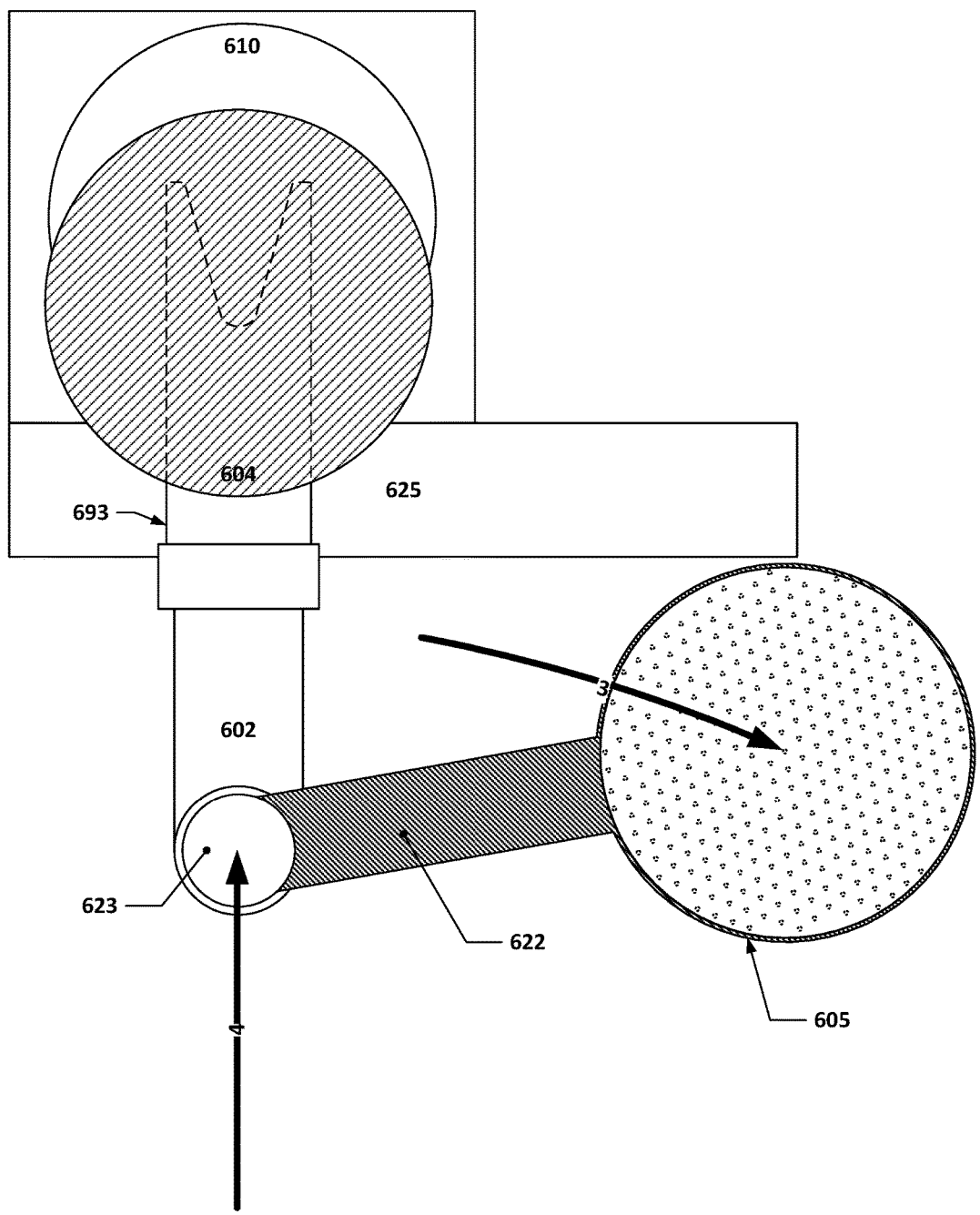

FIGS. 8 through 10 depict overhead views of the buffer gas distributor 605, wafer 604, and robot arm 602 during various stages of wafer delivery to a FOUP 610. The FOUP 610 is positioned on the outside of an EFEM (not shown); the robot arm 602 is located in the interior of the EFEM. A FOUP vestibule 625 may separate the FOUP 610 from the interior surfaces of the EFEM walls.

In FIG. 8, the robot arm 602, buffer gas distributor 605, wafer 604, and end effector 693 may all be moved together in direction 1 so as to cause the wafer 604 to approach the FOUP 610. During such movement, the buffer gas distributor may distribute buffer gas across the wafer 604, thereby at least partially shielding it from exposure to the ambient environment within the EFEM.

In FIG. 9, the robot arm 602, the wafer 604, and the end effector 693 may continue the movement along direction 1, while the support arm 622 to which the buffer gas distributor 605 is attached may rotate about the rotational pivot 623 so as to swing in a clockwise direction 2 (in other implementations, the support arm may swing in a counter-clockwise direction) so that the buffer gas distributor may pass through the FOUP vestibule 625.

In FIG. 10, the support arm 622 has continued to swing about the rotational pivot 623 in clockwise direction 3, while the end effector 693, robot arm 602, and the wafer 604 continue to translate along direction 4. As can be seen, the wafer 604 is almost entirely within the FOUP 610, and the robot arm 602, end effector 693, and wafer 604 may continue to extend into the FOUP 610 while the support arm 622 and the buffer gas distributor 605 continue to rotate until the wafer 604 is entirely within the FOUP 610.

Figure 11:
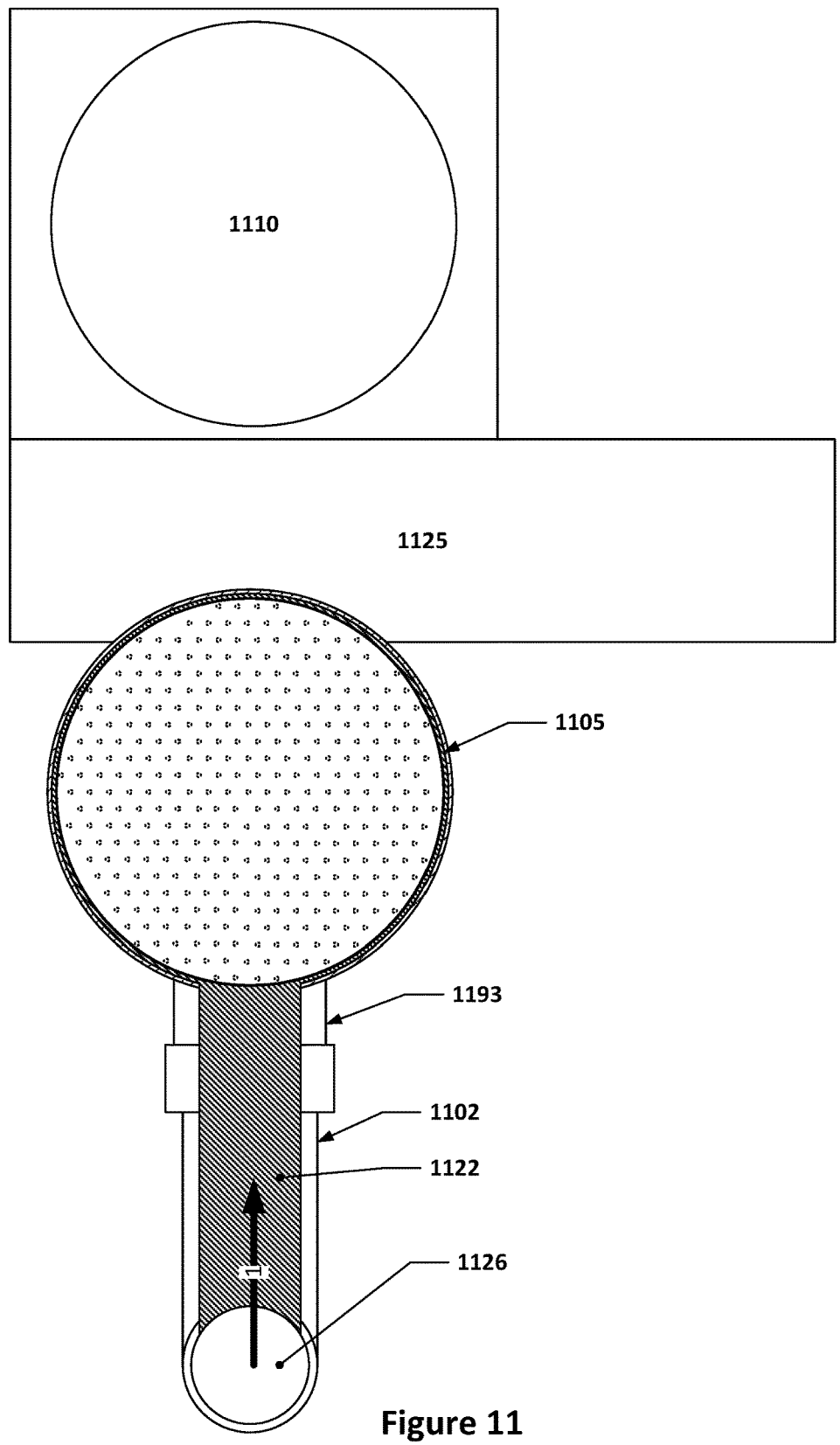
FIGS. 11 through 13 depict top views of an example translatable buffer gas distributor during various phases of operation.

FIG. 11 depicts another similar implementation in which a support arm 1122 may be connected with a robot arm 1102 using a translation mechanism 1126, e.g., a linear drive, ball screw, or other linear translation mechanism, that allows the support arm 1122 to be translated relative to the robot arm 1102. In such an implementation, as the end effector 1193 is inserted into the FOUP 1110, the buffer gas distributor 1105 may be translated away from the FOUP 1110 at the same rate, thus limiting the extent to which the buffer gas distributor extends into the FOUP. Thus, in some implementations, the buffer gas distributor may be fixed with respect to the end effector for at least some movements of the end effector, e.g., it may be fixed with respect to the end effector when the end effector is moving a wafer within the EFEM and there is no risk of the buffer gas distributor colliding with other components as it moves in tandem with the end effector.

Figure 12:
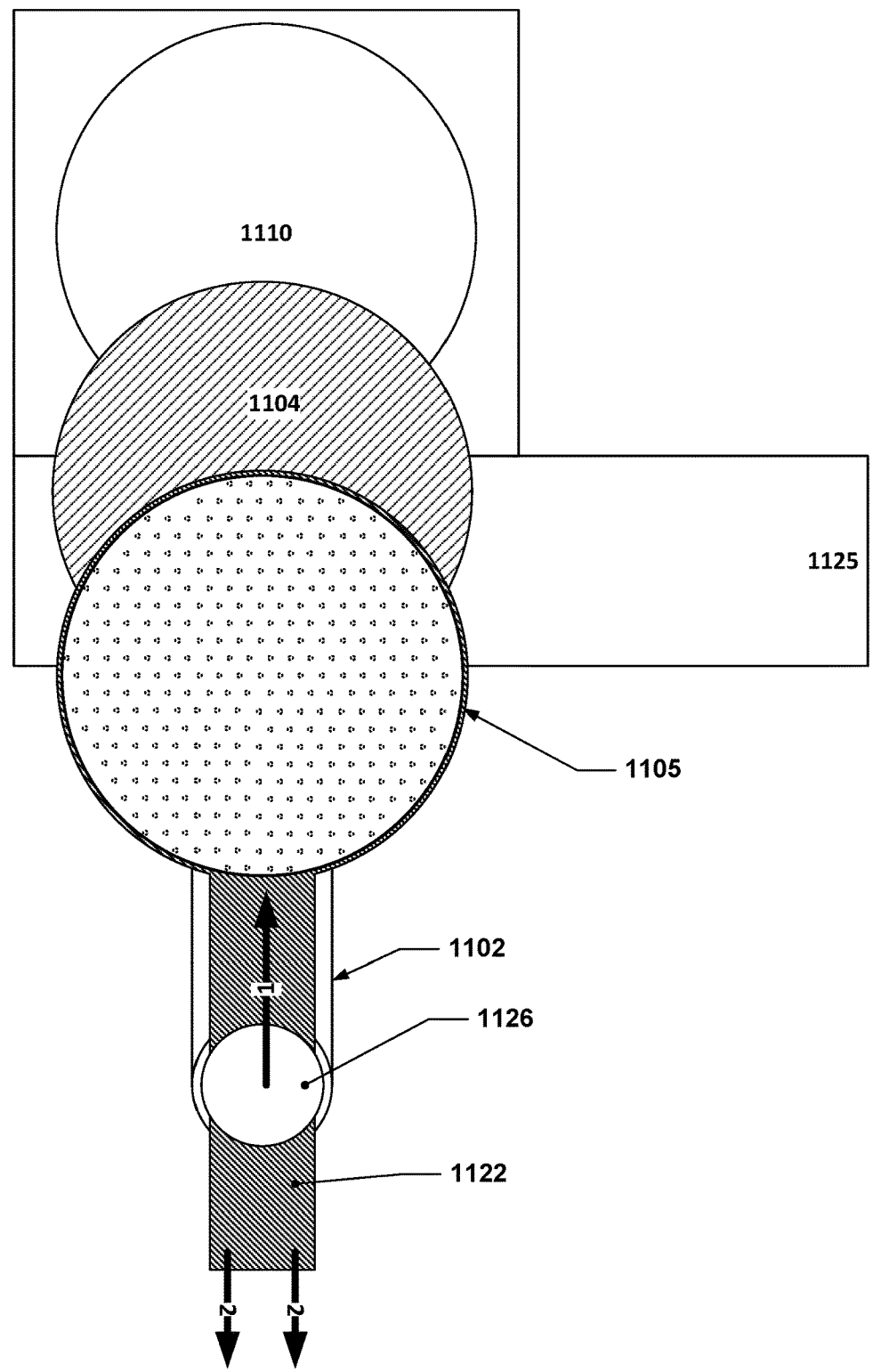
Figure 13:
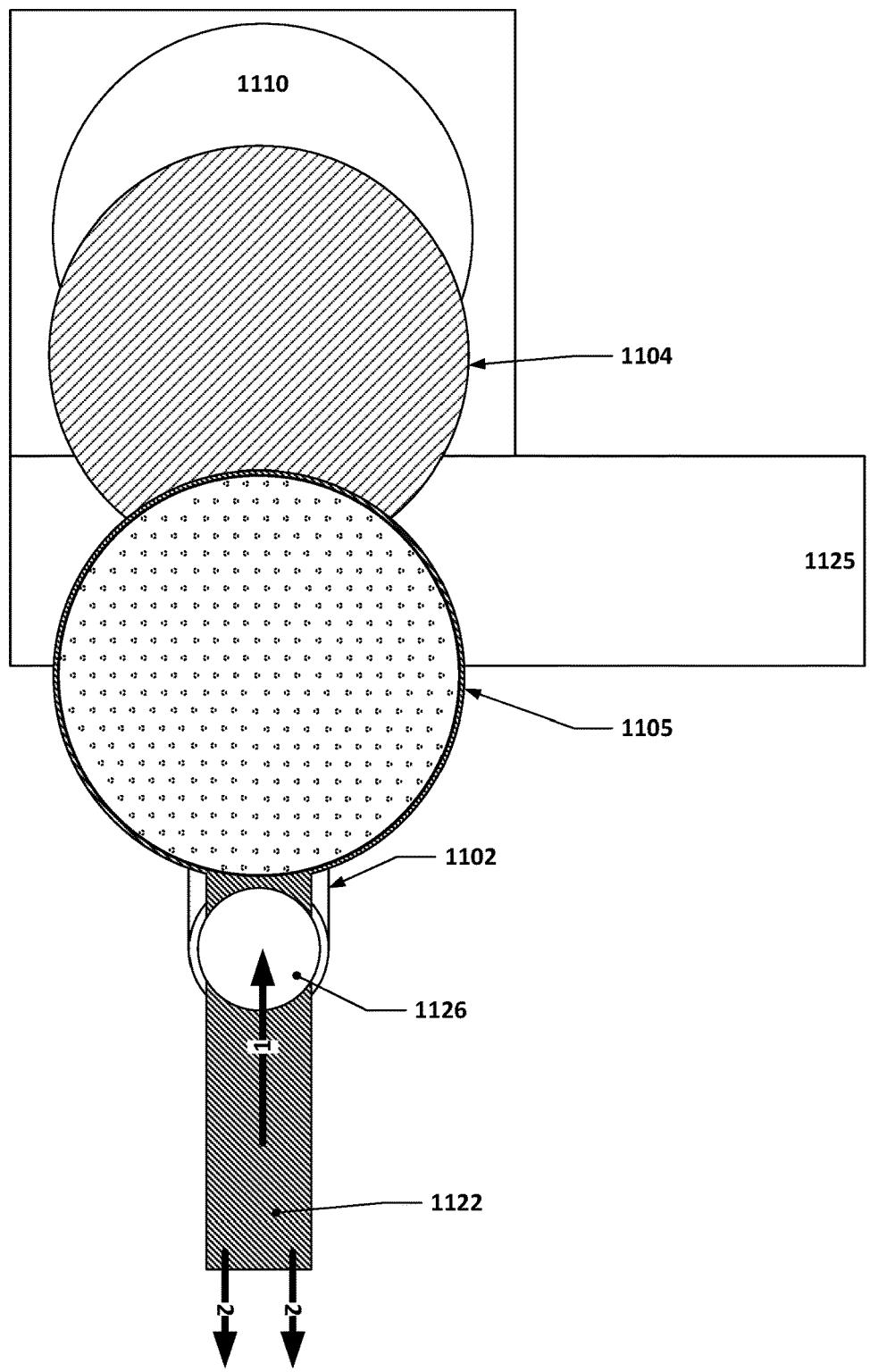

FIGS. 12 and 13 depict such an implementation as the robot arm 1102, end effector 1193, and buffer gas distributor 1105 are extended along direction 1 towards the FOUP 1110. In FIG. 13, the end effector 1193 (blocked from view), wafer 1104, translation mechanism 1126, and robot arm 1102 continue to extend into the FOUP 1110 along direction 1, while the support arm 1122 and the buffer gas distributor 1105 are translated in the opposite direction, i.e., direction 2, by the translation mechanism 1126. This causes the buffer gas distributor 1105 to "wait" in the FOUP vestibule 1125 while the wafer 1104 is placed into the FOUP 1110. In situations where a wafer 1104 is withdrawn from the FOUP 1110, the buffer gas distributor 1105 and support arm 1122 may be operated in the same manner, and then translated in direction 1 as the end effector 1193, wafer 1104, and robot arm 1102 are translated in direction 2 in order to withdraw the wafer 1104 from the FOUP 1110.

Figure 15:
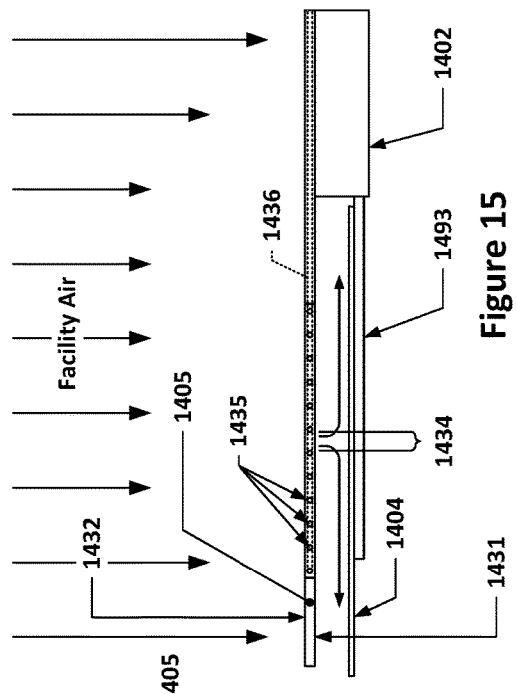
FIG. 15 depicts a side view of the example buffer gas distributor of FIG. 14.
Figure 14:
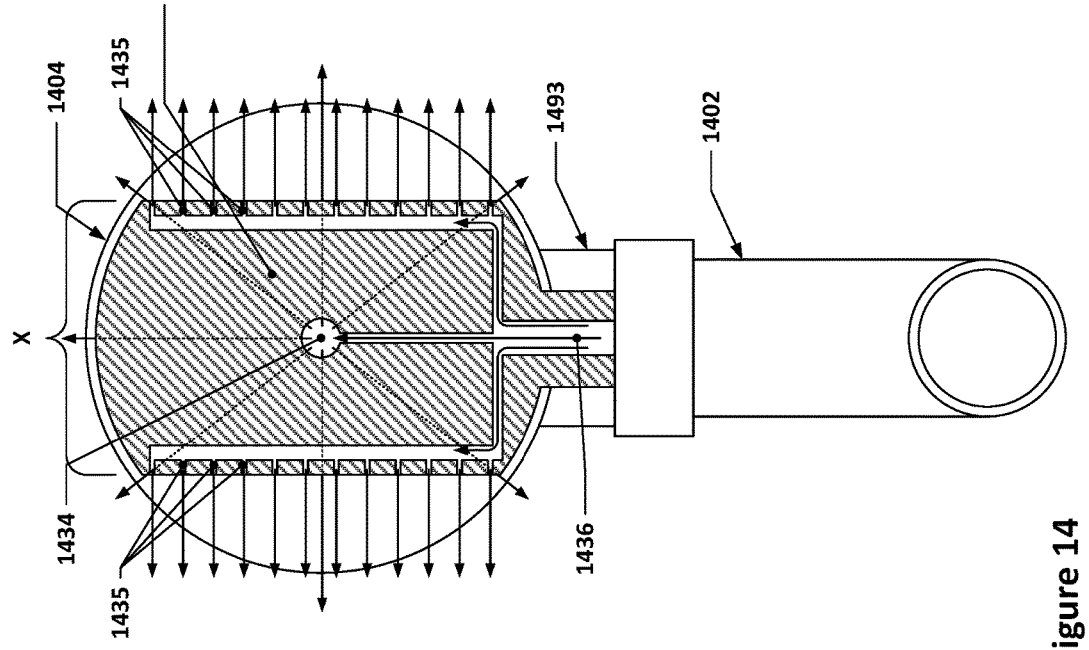
FIG. 14 depicts a top view of another example buffer gas distributor.

Another potential implementation of a buffer gas distributor is shown in FIGS. 14 and 15. In this implementation, the buffer gas distributor 1405 forms a paddle shape that does not extend all the way over the wafer 1404 in directions that are generally transverse to the long axis of the end effector. In this scenario, there may at least be chord-shaped regions of the wafer 1404 that are not shielded by the buffer gas distributor 1405. In some additional such implementations, such as the one depicted, the buffer gas distributor 1405 may also not extend completely across the wafer 1404 in a direction parallel to the long axis of the end effector (for clarity, the "long axis" of the end effector, as used herein, is an axis that passes through the center of the wafer that is supported by the end effector and that also passes through whatever mechanical interface attaches the end effector to the robot arm). For example, the buffer gas distributor 1405 may only extend across most, e.g., 90% or more, of the diameter of the wafer 1404 in such a direction so that the buffer gas distributor 1405 does not overlap with wafer support features that may lie along that direction. The buffer gas distributor 1405 may have one or more openings or buffer gas distribution ports (first gas distribution ports) 1434 facing the wafer, as well as one or more side buffer gas distribution ports (second gas distribution ports) 1435 that may flow buffer gas across the exposed areas of the wafer. The one or more first gas distribution ports 1434 may be located in a bottom surface 1431 of the buffer gas distributor 1405 that faces the end effector 1493 and may flow buffer gas downwards on the wafer 1404; this buffer gas may then flow radially outwards towards the periphery of the wafer 1404 and/or the buffer gas distributor 1405. While only one first gas distribution port 1434 is shown in this example, it is to be understood that there may be multiple such first gas distribution ports distributed across a region or regions of the bottom surface 1431, if desired. The second gas distribution ports 1435 may be located in side surfaces of the buffer gas distributor that span between the top surface 1432 and the bottom surface 1431 of the buffer gas distributor and be configured to flow buffer gas outwards in a generally horizontal direction, i.e., generally parallel to the major plane of the wafer 1404. This has the effect of producing a thin layer or curtain of buffer gas that may help protect the portions of the wafer 1404 that are not overlapped by the buffer gas distributor 1405. In implementations such as that of FIG. 14, the buffer gas may be conveyed to the first gas distribution ports 1434 and the second gas distribution ports 1435 by one or more gas distribution passages 1436 that are integral to the buffer gas distributor 1405. For example, the buffer gas distributor may be made from an aluminum plate into which the gas distribution passages 1436 have been machined; a thinner aluminum cover plate may then be brazed or otherwise bonded to the machined plate to produce the buffer gas distributor 1405. The second gas distribution ports 1435 may be machined into the plate as well, or may be drilled into the sides of the plate after the cover plate is attached.

Regardless of how, exactly, the buffer gas distributor 1405 is made, the buffer gas distributor 1405 may be designed so as to be thin enough to actually be insertable between semiconductor wafers in a multi-wafer stack of semiconductor wafers. Correspondingly, the buffer gas distributors and end effectors discussed herein may be spaced apart along the vertical axis such that the end effectors and buffer gas distributors are insertable into a spaced-apart stack of semiconductor wafers arrayed along the vertical axis, e.g., in a direction perpendicular to the wafers. Thus, the end effectors and the buffer gas distributors may each be individually sized to fit in the inter-wafer gaps between such stacked semiconductor wafers. For example, various pieces of equipment used in semiconductor manufacturing operations may support a plurality of semiconductor wafers in a vertical, spaced-apart stack or array. The FOUPs discussed in this application are an example of one such multi-wafer storage system. In a FOUP, a large number of wafers, e.g., 25 wafers, may be supported by fins, ledges, or other wafer support features protruding from the side walls of the FOUP at regularly spaced intervals. These wafer support features, and thus the wafers that they support, may be spaced apart from one another along the vertical axis, for example, such that each wafer is separated from each neighboring wafer by an inter-wafer gap of approximately 10 mm (minus the wafer thickness—for a 300 mm diameter wafer, this thickness is on the order of 0.75 mm). Of course, this spacing may vary depending on the equipment—for example, 450 mm wafers may be spaced apart by 15 mm. Thus, the buffer gas distributor 1405 may have a thickness in a direction perpendicular to the wafer 1404 and in regions that overlap with the semiconductor wafer 1404 that is less than 9 mm—allowing for movement clearances between the end effector and the buffer gas distributor would cause such a thickness to decrease, e.g., to a thickness less than on the order of perhaps a third of that inter-wafer gap distance, e.g., less than 3 mm—although the particular thickness used is, of course, dependent on the dimensional constraints of the tool in question and the above example is not to be viewed as limiting this disclosure to a thickness of 3 mm or less in all cases.

Other examples of multi-wafer storage systems with which the buffer gas distributor 1405 may be used include multi-wafer cassettes, buffers, stockers, and load-locks. A multi-wafer cassette may be used within a semiconductor processing tool to transport multiple wafers from location to location in a simultaneous manner. A buffer is a multi-wafer storage system that may be inside of an EFEM or accessible from inside of the EFEM; the buffer may be used to temporarily store wafers during or after processing before transferring them to a FOUP. For example, a semiconductor wafer may need to cool down after processing and before being placed into a FOUP (which are typically made from plastic and could therefore be damaged through contact with a hot wafer)—such a semiconductor wafer may be temporarily parked in a buffer to cool down before being conveyed into a waiting FOUP. A stocker is a system that acts as a large repository of semiconductor wafers within a semiconductor processing tool. A stocker, for example, may be able to store tens, or even hundreds, of semiconductor wafers at a time, and may even be rotatable so as to act as a carousel. Stockers may be used to store semiconductor wafers that accumulate due to a mismatch in processing times for consecutive processing steps. Load-locks are airlocks that allow wafers to be transitioned between different atmospheric environments. For example, a load-lock may be used to transfer wafers from an atmospheric environment to a near-vacuum or vacuum environment. Most load-locks transfer only one or two wafers at a time, but other load-locks may have provisions for transferring multiple wafers simultaneously. Each of these types of multi-wafer storage systems may have its own inter-wafer spacing, and a buffer gas distributor that is configured to be used with such systems may be designed to have a thickness that is less than the inter-wafer spacing or gap (minus the wafer thickness) between neighboring wafers in such systems. For example, a buffer gas distributor may have a thickness of approximately 2 mm, e.g., 0.5 mm of thickness for the top surface and the bottom surface, with another 1 mm of thickness of material in between the top and bottom surfaces.

Figure 16:
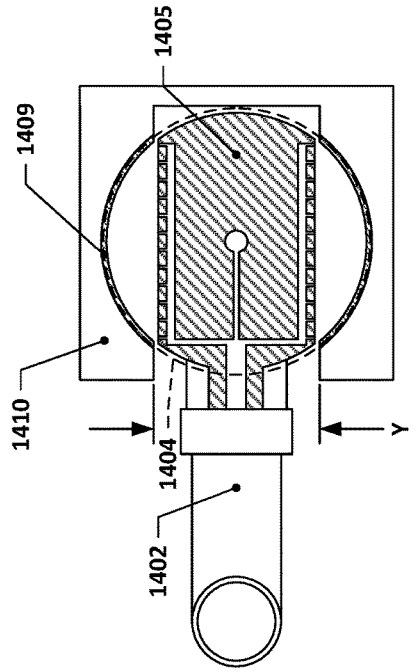
FIG. 16 depicts a top view of the buffer gas distributor of FIG. 14 inserted into a multi-wafer storage system.

Due to the reduced width X of the buffer gas distributor, the buffer gas distributor may be inserted completely into the FOUP at any elevation without interfering with the wafer support structures in the FOUP (which each have at least a gap Y that faces towards the end effector and that is larger than X). For example, if the FOUP (or other multi-wafer storage system) were empty and such a buffer gas distributor were to be inserted into the FOUP to the same extent used to place or remove wafers into or from the FOUP, as is shown in FIG. 16, the end effector 1493 and the buffer gas distributor 1405 may be moved upwards and downwards within the FOUP 1410 without colliding with the wafer support features 1409, i.e., the buffer gas distributor 1405 does not overlap with the wafer support features when in such a position and when viewed from a direction perpendicular to the wafer 1404. Such an implementation may allow the buffer gas distributor 1405 to be spaced further from the wafer 1404 or be thicker since the top surface 1432 of the buffer gas distributor may, during interactions of the end effector 1493 with a wafer, be moved past the underside of the wafer support feature 1409 that is immediately above that wafer. Thus, in some implementations, such as this implementation and other implementations discussed later, the buffer gas distributor may be fixed with respect to the end effector during all movements of the end effector.

Figure 17:
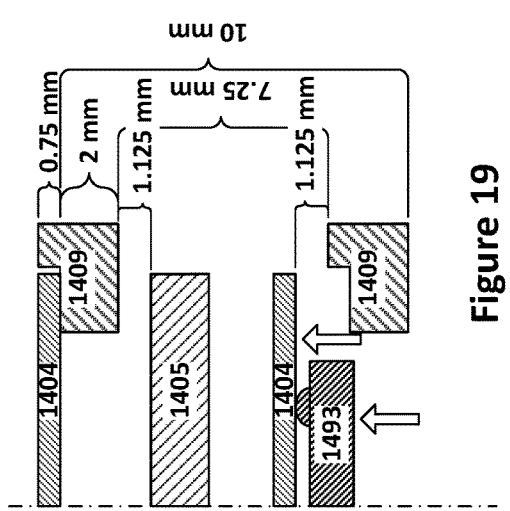
FIGS. 17 through 19 depict detail partial side section views of two example wafer support features and wafers, as well as an example end effector and an example buffer gas distributor during various phases of wafer manipulation.
Figure 18:
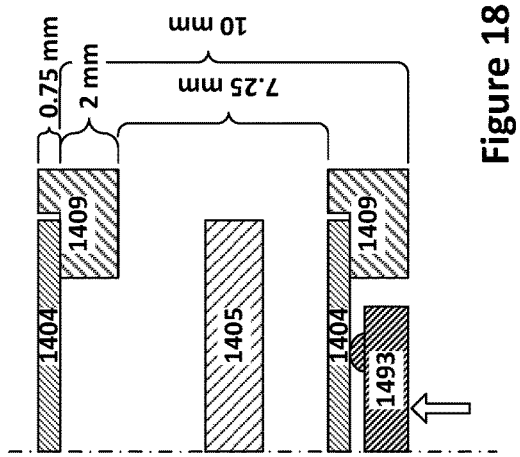
Figure 19:
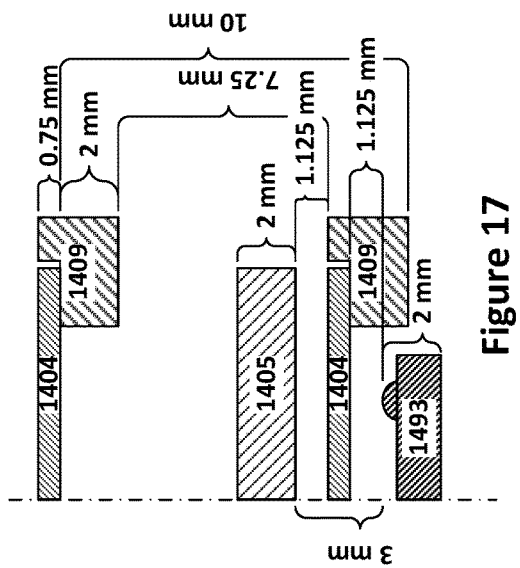

FIGS. 17 through 22 demonstrate an advantage of such a buffer gas distributor. FIGS. 17 through 19 depict detail partial side section views of two wafer support features 1409; each wafer support feature 1409 supports an edge of a corresponding wafer 1404. An end effector 1493 is shown with raised bumps that may contact the underside of the wafer 1404 with a reduced contact area than if the entire portion of the end effector 1493 that overlaps with the wafer 1404 were to contact the wafer; the portions of the end effector that actually come into contact with the wafer 1404 may be referred to herein as "contact surfaces." The wafer 1404 in FIGS. 17 through 19 is 0.75 mm thick, and the end effector 1493, the buffer gas distributor 1405, and the portions of the wafer support features 1409 that actually support the wafers 1404 are all 2 mm thick. The wafers 1404 in this example are spaced apart with a center-to-center distance of 10 mm, resulting in a 7.25 mm gap between the tops of the wafers 1404 and the bottommost surface of the wafer support features 1409 directly above those wafers 1404. Under these conditions, if it desired to maintain the maximum possible clearances between the wafer 1404 and the buffer gas distributor 1405 and the end effector 1493 during insertion of the end effector 1493 and the buffer gas distributor 1405 into the wafer stack, as well as between the wafer support features 1409 and the wafer 1404 and the buffer gas distributor 1405 during removal of the wafer 1404, the end effector 1493 and the buffer gas distributor 1405 will only be offset from the wafer 1404 by a distance of 1.125 mm during insertion of the end effector 1493 and the buffer gas distributor 1405 into the wafer stack. After the end effector 1493 and the buffer gas distributor 1405 have been fully inserted into the wafer stack, the end effector 1493 and the buffer gas distributor 1405 may be raised so that the end effector 1493 contacts the wafer 1404, as shown in FIG. 18. In FIG. 19, the end effector 1493, the buffer gas distributor 1405, and the wafer 1404 have been raised further, such that there is a gap of 1.125 mm between the wafer 1404 and the top surface of the wafer support feature 1409 that previously supported it as well as a gap of 1.125 mm between the buffer gas distributor 1405 and the underside of the wafer support feature 1409 immediately above the wafer 1404 being lifted. Thus, the vertical clearances between the stationary components and the moving components during end effector insertion/removal from the wafer stack may all be maximized to 1.125 mm in this scenario.

Figure 20:
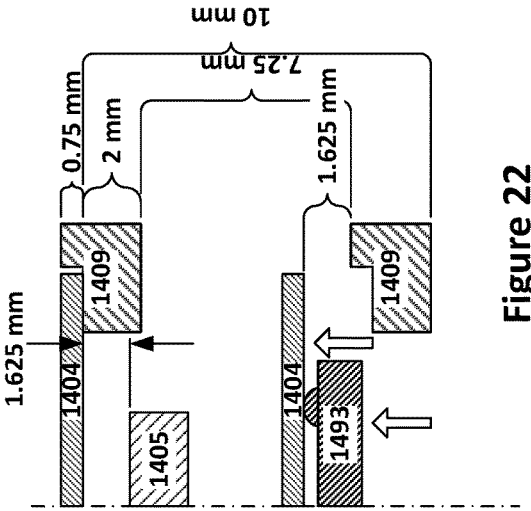
FIGS. 20 through 22 depict detail partial side section views of the two example wafer support features and wafers of FIG. 17, as well as the example end effector of FIG. 17 and a different example buffer gas distributor during various phases of wafer manipulation.
Figure 21:
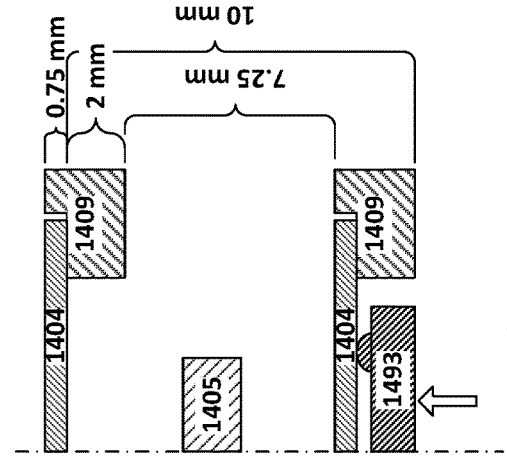
Figure 22:
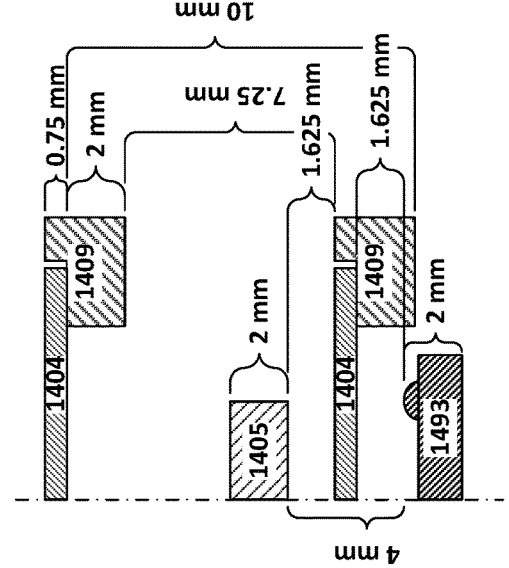

As can be seen in FIGS. 20 through 22, by reducing the width of the buffer gas distributor 1405 such that it does not overlap with the wafer supports 1409 when viewed along the vertical axis and such that the end effector 1493 and the buffer gas distributor 1405 may be inserted at any elevation in the wafer stack without contacting the wafer support features 1409, the maximum clearances between the various components in the same scenario may be increased to 1.625 mm, which is a 44% increase in clearance room. This is because the vertical clearance above the buffer gas distributor 1405 is not limited by the wafer support feature 1409 above the wafer 1404 being removed, but is instead limited by the wafer 1404 that is above the wafer 1404 that is being removed.

As is apparent from the above discussion, using a buffer gas distributor that does not, for example, extend over the entire width of wafer being transported by an associated end effector allows for the buffer gas distributor to be fully inserted into a stack of spaced-apart wafers. This allows the buffer gas to be flowed from the buffer gas distributor over the wafer during the entire time that the wafer is transported by the robot to which the end effector is connected. This is in contrast, for example, to systems in which buffer gas distributors are too large to be inserted into a wafer stack and must instead be moved relative to the end effector in order to allow the end effector to be inserted into the wafer stack without the accompaniment of the buffer gas distributor. In such systems, the wafer may be temporarily unshielded by buffer gas as it is withdrawn from the wafer stack, and may therefore be more vulnerable to contamination and/or damage from non-buffer gas atmosphere.

Figure 23:
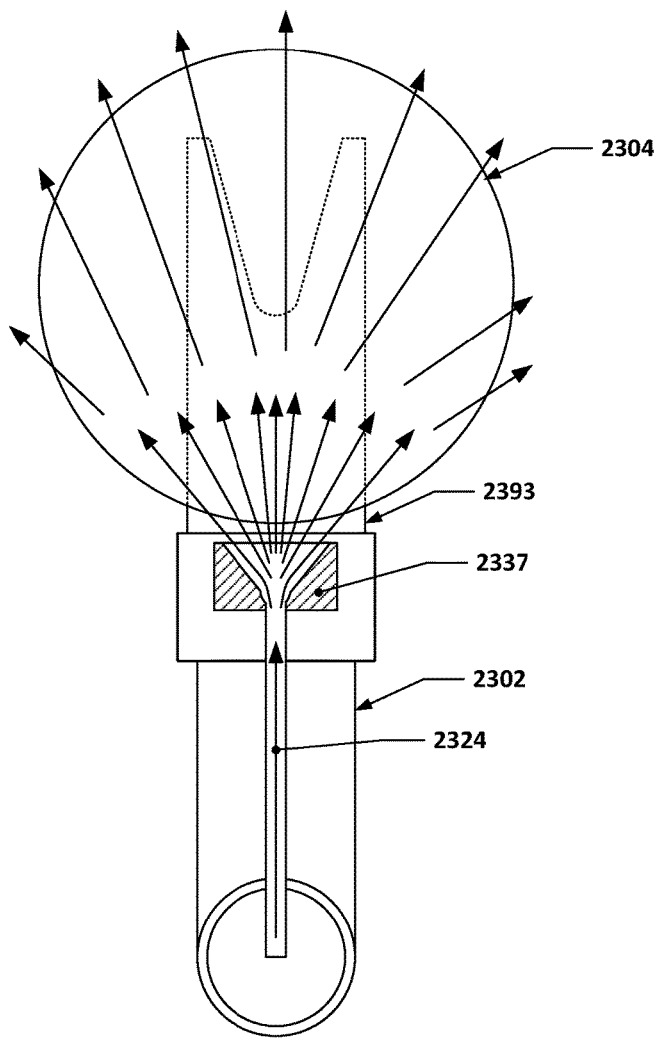
FIG. 23 depicts a top view of another example of an example buffer gas distributor.
Figure 24:
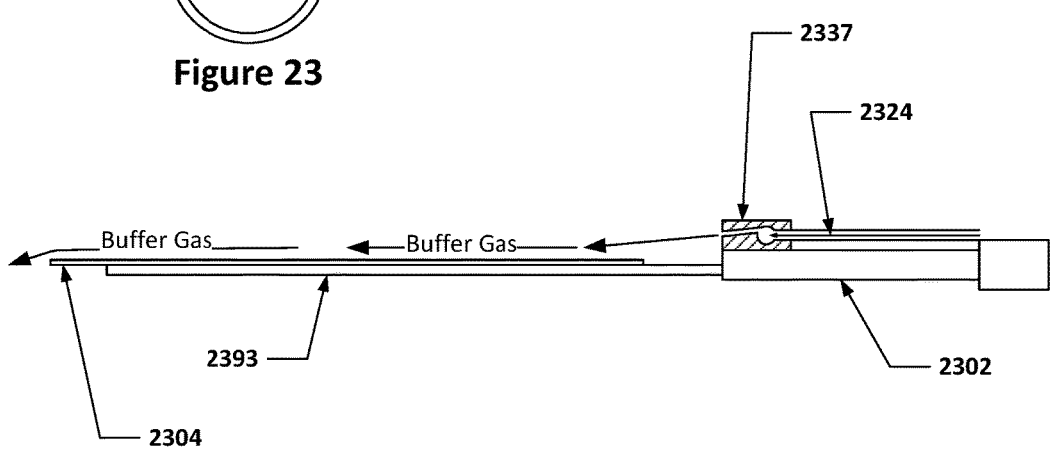
FIG. 24 depicts a side view of the example buffer gas distributor of FIG. 23.
Figure 25:
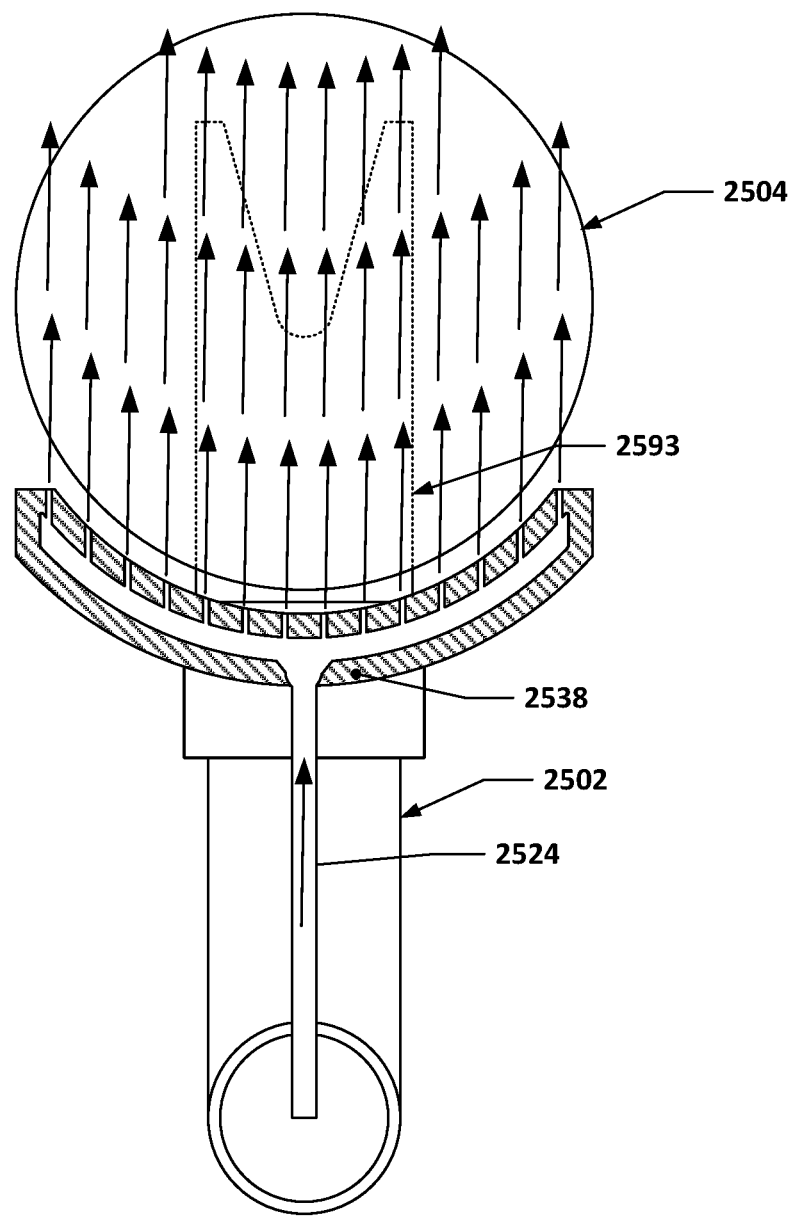
FIG. 25 depicts a top view of another example of an example buffer gas distributor.
Figures 26, 27:
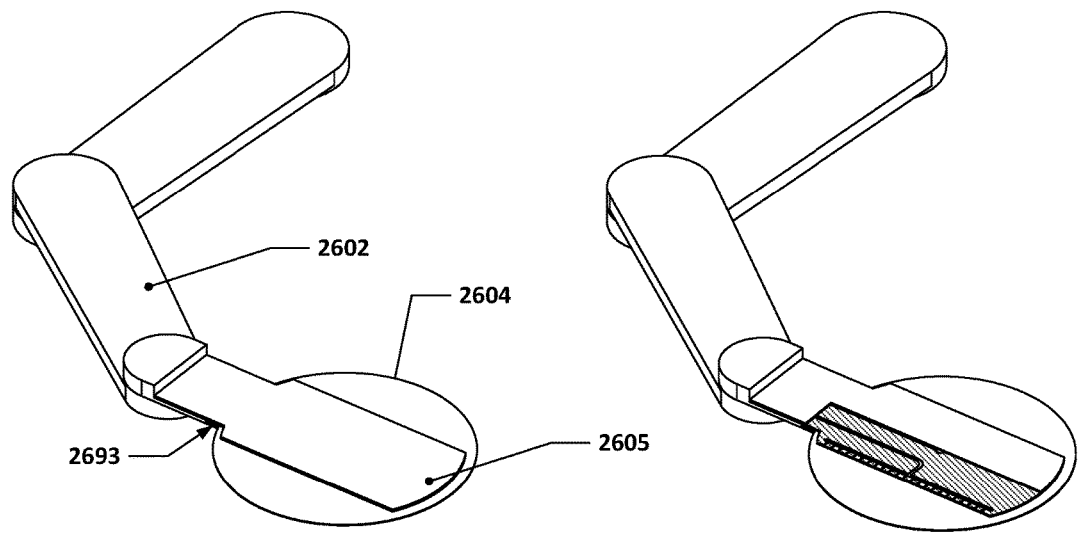
FIGS. 26 through 30 depict an isometric view, a cutaway isometric view, a detail cutaway isometric view, a side view, and a detail side view, respectively, of an example buffer gas distributor.

In some implementations, the buffer gas distributor does not need to be over the wafer at all, but may instead be, for example, a slit-fan nozzle that directs a thin layer of buffer gas over the wafer from a location at the periphery of the wafer. This approach may be the easiest to implement, although there is no direct shielding of the wafer at all using this technique, in contrast to the buffer gas distributors discussed earlier herein, in which the buffer gas distributor itself acted as an impermeable shield for at least part of the wafer against air flow approaching from above. This technique is illustrated in FIGS. 23 and 24. For example, in FIGS. 23 and 24, the robot arm 2302 is equipped with a slit-fan nozzle 2337 that is connected to a buffer gas supply 2324. The slit-fan nozzle 2337 is positioned above the plane in which a wafer 2304 is supported by an end effector 2393 of the robot arm 2302. The slit fan nozzle 2337 may direct buffer gas flow in a fan-shaped pattern across the surface of the wafer 2304, thereby providing a localized buffer gas layer over the wafer 2304. However, such arrangements may be ill suited to environments where there is substantial air flow past the wafer 2304, as there is no physical shielding of the wafer 2304 by the buffer gas distributor/slit-fan nozzle 2337. FIG. 25 depicts a similar example, except that instead of a single slit-fan nozzle 2337 that flows buffer gas outwards in a fan shape, the nozzle structure 2538 may include one or more nozzles that have an exit area or exit areas that span along a significant portion, e.g., 25% or so or more, of the outer circumference of the wafer 2504, thus providing greater certainty that a thin layer of buffer gas will be distributed across the entire exposed upper surface of the wafer 2504.

Figure 28:
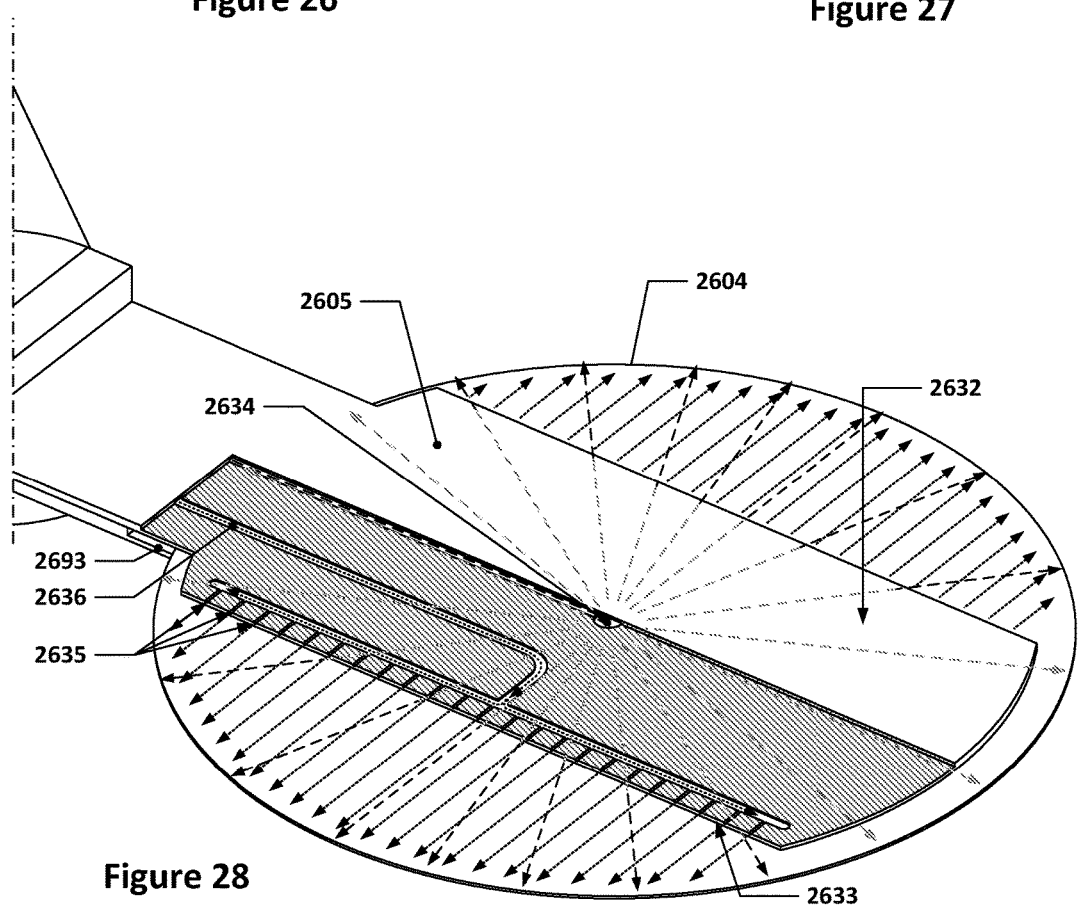
Figure 29:
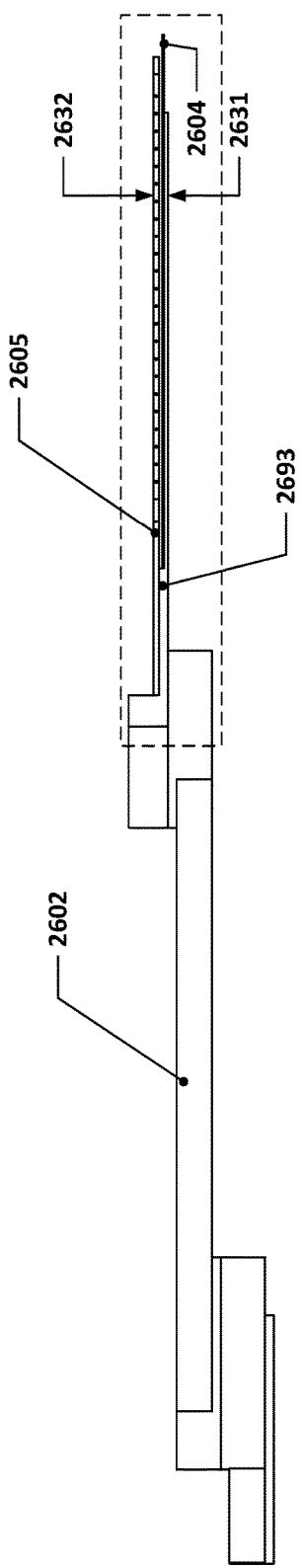
Figure 30:
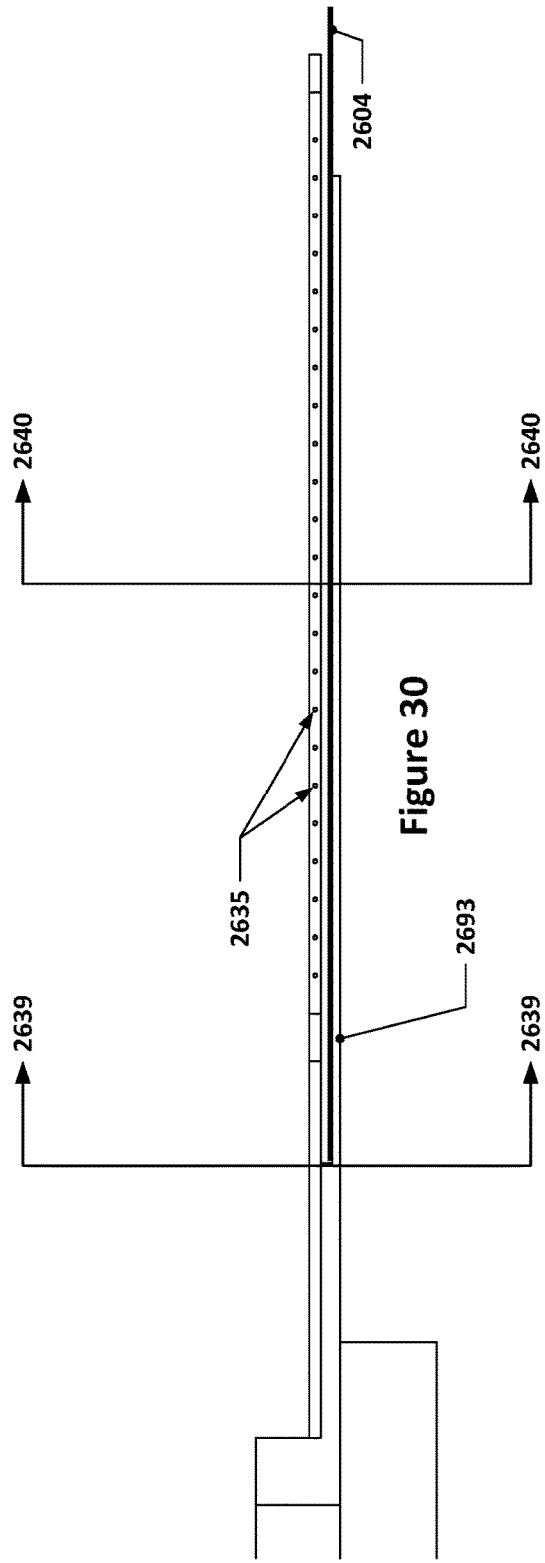

FIGS. 26 through 30 depict an isometric view, a cutaway isometric view, a detail cutaway isometric view, a side view, and a detail side view, respectively, of an example buffer gas distributor. As can be seen, a robot arm 2602 includes an end effector 2693 with a buffer gas distributor 2605. A wafer 2604 is supported by the end effector 2693. As can be seen in FIG. 28, the buffer gas distributor 2605 may have buffer gas passages 2636 that lead to a first gas distribution port 2634 located in a bottom surface of the buffer gas distributor 2605, which allows buffer gas to flow outwards across the wafer 2604 from near the center of the buffer gas distributor 2605, as shown by the radially arrayed arrows. The buffer gas passages 2636 may also supply buffer gas to a plurality of second gas distribution ports 2635 located in side surfaces 2633, which may direct buffer gas in opposing transverse directions with respect to the end effector 2693, as shown by the parallel arrows in FIG. 28. The buffer gas distributor 2605 may have an upper surface 2632 and an opposing bottom surface (not indicated). As can be seen in FIG. 30, the buffer gas distributor 2605 may be viewed as having several portions. For example, the buffer gas distributor 2605 may be divided between a portion 2639 of the buffer gas distributor 2605 is overlapping with the wafer 2604 when viewed from a direction perpendicular to the wafer, and the remainder of the buffer gas distributor, which does not. Similarly, the buffer gas distributor 2605 may be divided between an outermost half of the buffer gas distributor 2605, i.e., the outermost half 2640 of the portion 2639 (the "half" is with reference to the portion of the buffer gas distributor 2605 that overlaps with the wafer 2604, rather than the entire buffer gas distributor 2605).

As has been apparent from the above examples, the buffer gas distributors may be located above the wafers transported by the end effectors with which they are associated. Moreover, in at least some implementations, at least the outermost halves of the buffer gas distributors do not overlap with the wafers when viewed in a direction parallel to the wafer plane and perpendicular to the end effector's long axis, e.g., there is no vertical wall that extends from the undersides of the buffer gas distributors to encircle or partially encircle the wafers 2604. In some further such implementations, there may be no overlap between the buffer gas distributor 2605 and the wafer 2604 at all within the portion 2639 when viewed along a direction parallel to the wafer plane and looking along a direction perpendicular to the long axis of the end effector.

Figure 31:
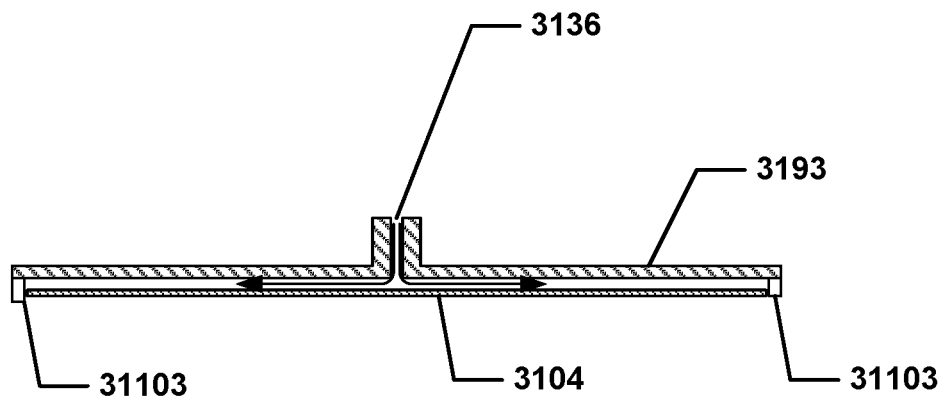
FIG. 31 depicts an example of a Bernoulli-type end effector.

Another type of buffer gas distribution system that may be used to provide a localized buffer gas environment around a wafer being transported by a robot arm in some contexts is a Bernoulli-type end effector. A Bernoulli-type end effector is one in which the wafer is not supported from below by a blade end effector or other structure, but is instead suspended beneath the end effector by way of the Bernoulli effect. In such end effectors, such as the one pictured in FIG. 31, the end effector 3193 may be a disk of generally the same or larger diameter as the wafer 3104. The disk may have a gas port 3136 in the middle; when the end effector 3193 is held in close proximity to the wafer 3104 (and the wafer 3104 is centered on the disk portion of the end effector 3193), buffer gas may be flowed through the center gas port 3136. The buffer gas will then flow radially outwards towards the edges of the wafer 3104. This radial gas flow creates a Bernoulli effect, i.e., a low-pressure region between the wafer 3104 and the end effector 3193, and the atmospheric pressure on the underside of the wafer 3104 will cause the wafer 3104 to be pushed towards the end effector 3193. At the same time, the pressure of the buffer gas flowing between the wafer 3104 and the end effector 3193 keeps the wafer 3104 from contacting the end effector 3193. The end effector 3193 may have radial stops 31103 that contact the edge of the wafer 3104 to keep the wafer 3104 centered on the disk portion of the end effector 3193 and to prevent rotation of the wafer 3104 with respect to the end effector 3193. The buffer gas that is flowed to produce the Bernoulli effect may, in addition to providing the Bernoulli effect, also provide the buffer gas microclimate discussed above. Accordingly, a Bernoulli end effector may be used, in some implementations, in place of the separate end effector and buffer gas distributor implementations discussed above.

Microclimates in FOUPs and Other Multi-wafer Storage Systems

In addition to using systems and techniques such as the buffer-gas equipped EFEMs and buffer gas distributors discussed above to mitigate or prevent wafer contamination during wafer transfer operations occurring outside of the protection of a transfer chamber or other hermetically sealed environment, wafers may also be protected within the confines of multi-wafer storage systems through the introduction of a buffer gas within the multi-wafer storage system. For example, FOUPs, as mentioned earlier, are commonly filled with a buffer gas to protect the wafers contained within them from contamination or damage. Since FOUPs are sealed during transit, they may be loaded with a charge of buffer gas that is sealed within the FOUP with the wafers being transported in the FOUP. Once a FOUP is docked at a load port, however, the door that is used to seal the main opening of the FOUP may be removed using a Front-Opening Interface Mechanism (FIM) or the like to allow the wafers contained within the FOUP to be accessed. Once the door of the FOUP has been removed, the buffer gas that may have been inside is free to diffuse into the surrounding environment (and the air in the surrounding environment is similarly free to diffuse into the FOUP). In order to counteract the loss of the buffer gas environment within the FOUP after the FOUP door has been opened, additional buffer gas may be flowed into the FOUP through one or more FOUP buffer gas ports, e.g., ports that may interface with features on the load port or other portions of a semiconductor processing tool in order to obtain buffer gas and route it to the interior of the FOUP. The FOUP buffer gas ports may be the same ports that are initially used to "charge" the FOUP with the buffer gas after the FOUP has been sealed.

A typical EFEM will be equipped with one or more load port units, which are typically designed to interface with a generally rectangular opening in the EFEM walls. A load port unit may include one or more platforms or pedestals that have locating or indexing features on them that interface with corresponding features on a FOUP. These features ensure that the FOUP is located in a desired position when placed on the platform. The load port unit may also include a door that may be slid up and down; the door is generally parallel to the removable FOUP door, and, when the load port unit is installed in the EFEM, may close off the interior of the EFEM from the ambient environment. When a FOUP is placed on the platform, the removable FOUP door of the FOUP may face the door of the load port unit. The door of the load port unit may include, for example, a front-opening interface mechanism (FIM) that may be actuated to engage with the removable FOUP door and pull it away from the FOUP, thereby unsealing the FOUP. Once the removable FOUP door is pulled away from the FOUP by the FIM, the door of the load port unit may be lowered or otherwise moved aside, carrying the removable FOUP door with it. Once the removable FOUP door is removed and slid aside, the entire stack of wafers in the FOUP may be accessible to the wafer handling robot within the EFEM.

Some or all of the present inventors determined that such an arrangement may be problematic if a buffer gas is flowed through the FOUP after the removable FOUP door is removed. Due to the large opening of the FOUP (a FOUP for carrying 300 mm wafers may have an opening at least 300 mm wide and, depending on the number of wafers, 250 mm to 300 mm or more tall), a considerable flow of buffer gas may need to be required to maintain positive pressure within the FOUP (which is generally desirable to prevent air from the EFEM from being sucked or diffused into the FOUP, where it may contaminate all of the wafers in the FOUP). This may be expensive and/or present a safety risk due the volumes of buffer gas needed to maintain such flows.

Figure 32:
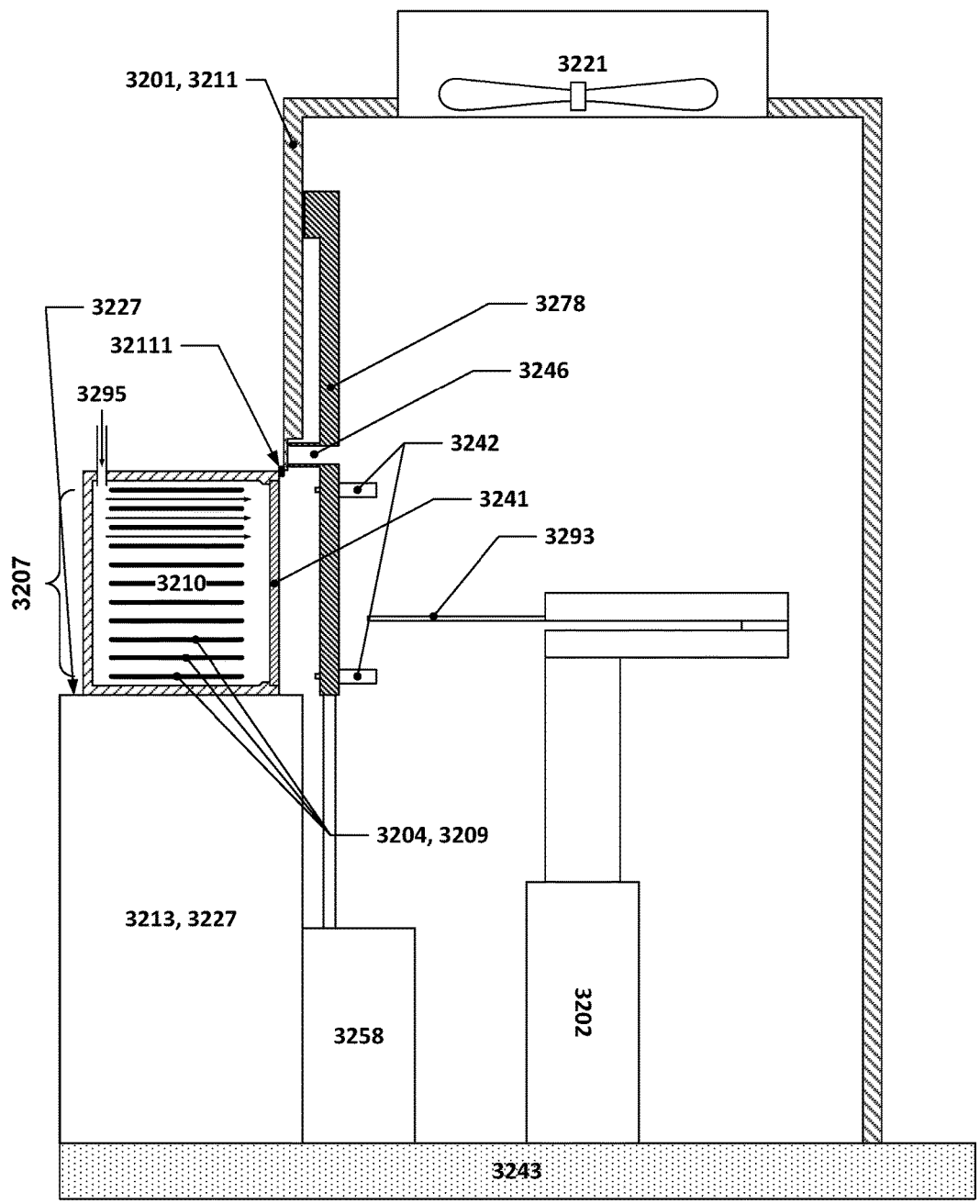
FIGS. 32 through 36 depict an example EFEM with an example door with a horizontal slot during various phases of operation.

Some or all of the present inventors determined that the door of the load port unit could be modified to reduce the amount of buffer gas flow needed to maintain positive pressure within the FOUP. As can be seen in FIG. 32, an EFEM 3211, which may be also regarded as an enclosure 3201, with a facility air handler 3221 is depicted; the EFEM 3211 may rest on a floor 3243. It is to be understood that the EFEM 3211 may alternatively be an EFEM equipped with a buffer gas system such that the interior volume of the EFEM 3211 may have buffer gas flowed through it, e.g., similar to the EFEMs of FIGS. 1 through 5. The EFEM 3211 may also be connected with one or more wafer processing chambers and/or a wafer transfer chamber via a load-lock (not shown, but see FIG. 2 for an example of how similar such structures may be arranged relative to the EFEM 3211). The EFEM 3211 may have located within it a robot arm 3202 with an end effector 3293 that may be used to transfer wafers 3204 through the EFEM. The EFEM 3211 may also be connected with a load port unit 3213 that provides or acts as an interface 3227 for supporting a FOUP 3210. The FOUP 3210 may have a buffer gas supply port or FOUP port 3295 that may be used to introduce buffer gas into the interior volume of the FOUP 3210; a FOUP seal 32111 may seal the FOUP 3210 to the EFEM 3211 to prevent buffer gas from escaping in the gap between the FOUP 3210 and the EFEM 3211 (this seal is not depicted in other views, but may nonetheless be present). It is to be understood that while the FOUP port 3295 in this example is shown located in the top of the FOUP 3210, the FOUP port 3295 may be placed in other locations as well, e.g., in the bottom of the FOUP 3210 so that it may interface with a buffer gas supply port (not shown) that is part of the interface 3227. The wafers 3204 may be supported by wafer support features (or wafer supporting features) 3209, which may be arranged along interior surfaces of the FOUP 3210 so as to space the wafers 3204 supported thereupon in a vertically separated stack of semiconductor wafers 3207. The EFEM 3211 or the load port unit 3213 may also include a movable wall or door 3278 that may be moved vertically by a drive mechanism 3258; the drive mechanism 3258 may, for example, be a linear actuator or other mechanical or electromechanical system that may be used to move the door 3278 up and down vertically. The door 3278 may have a lower half (equipped with a front-opening interface mechanism (FIM) 3242 that may be used to remove a removable FOUP door 3241 from the FOUP 3210 to allow the wafers 3204 to be removed from or placed into the FOUP 3210) and an upper half. A horizontal slot 3246 may effectively separate the two halves. In a conventional load port unit, the door would not include the horizontal slot 3246 or the upper half of the door 3278.

Figure 33:
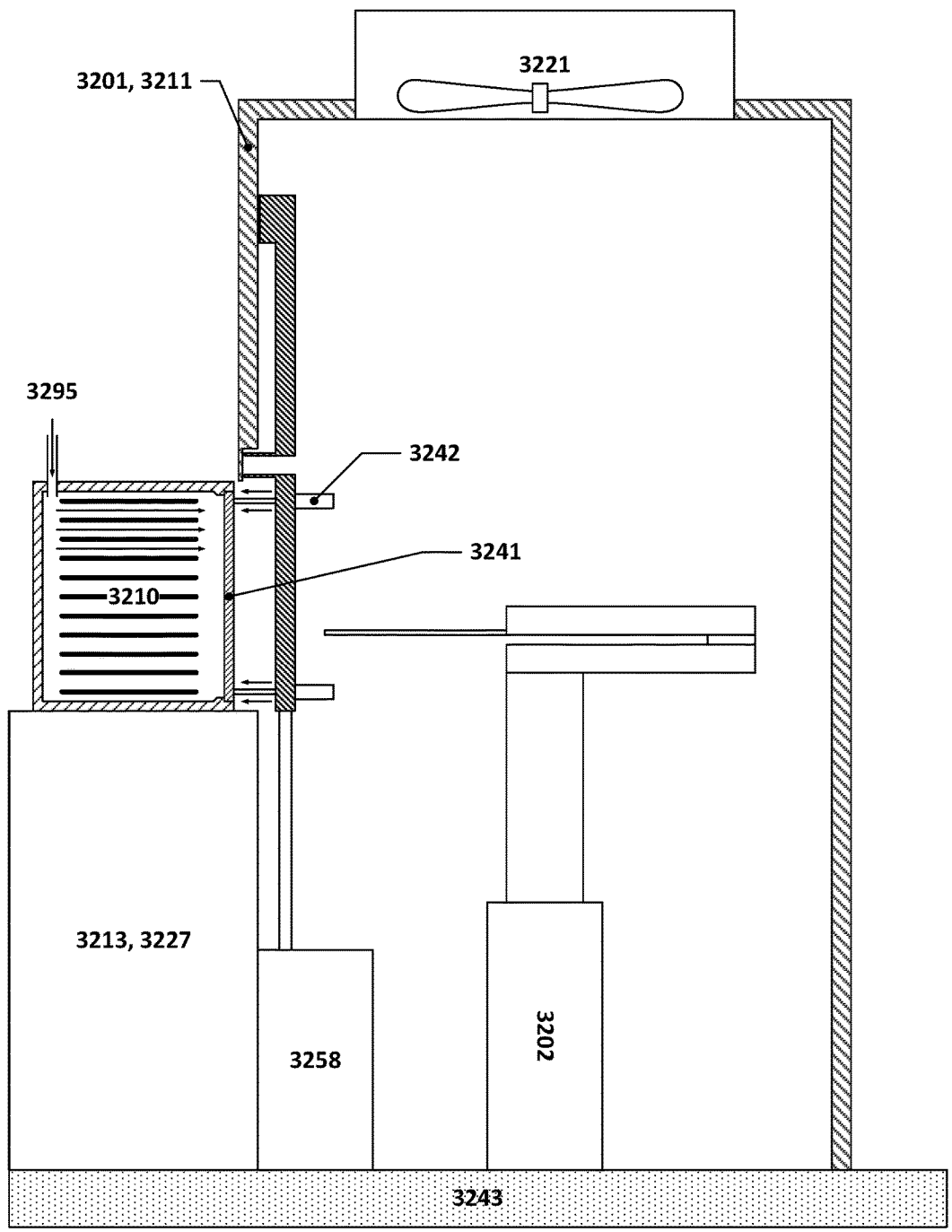
Figure 34:
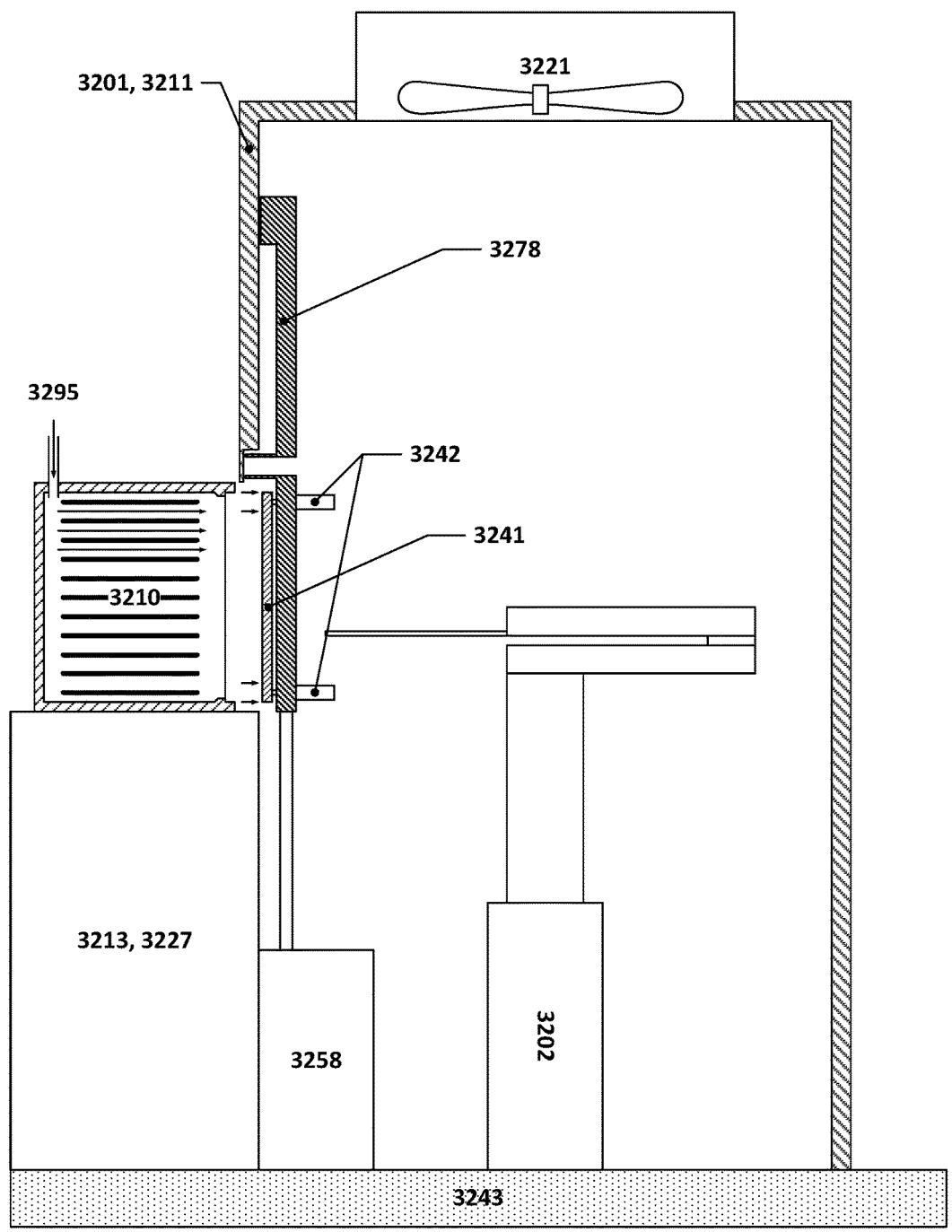
Figure 35:
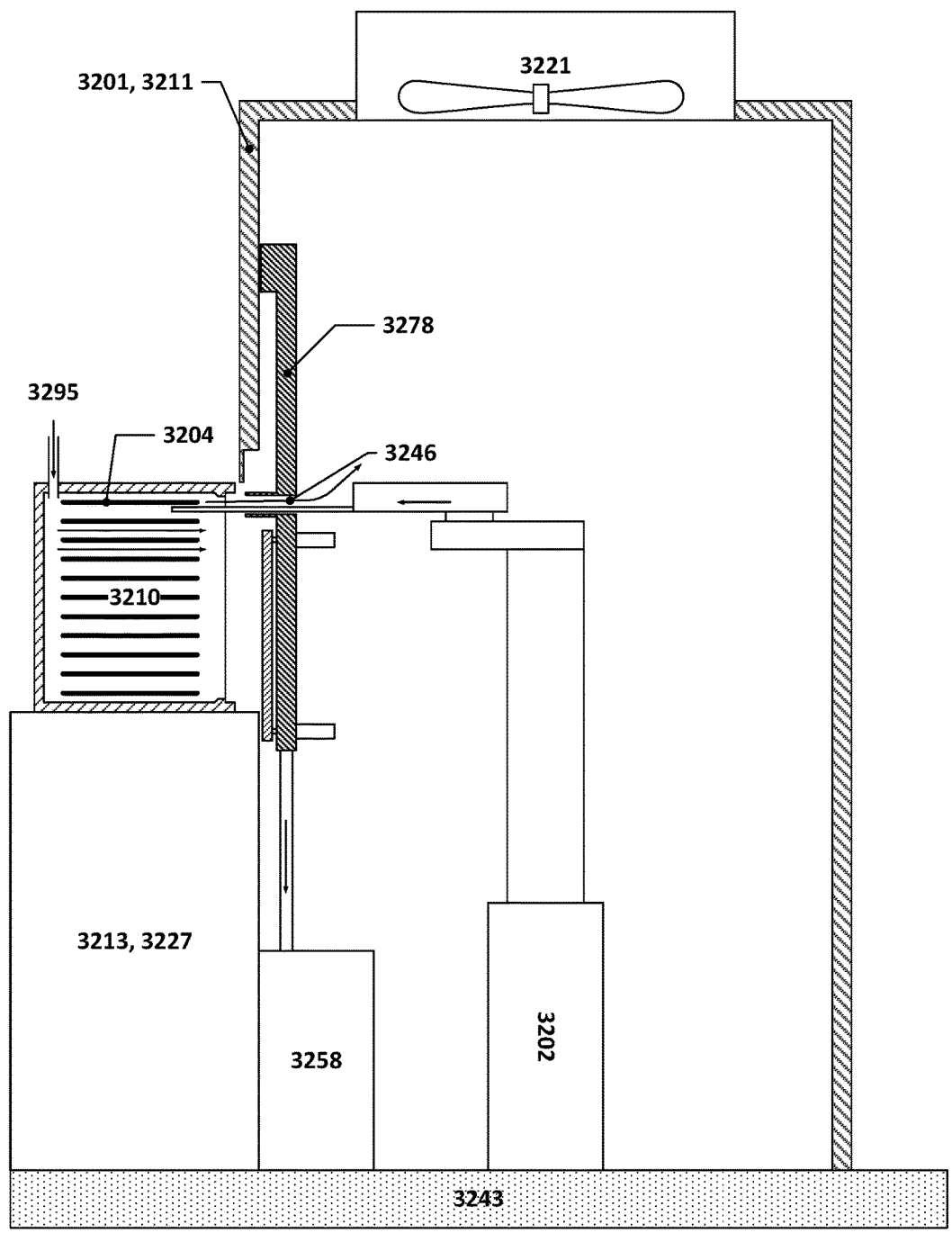
Figure 36:
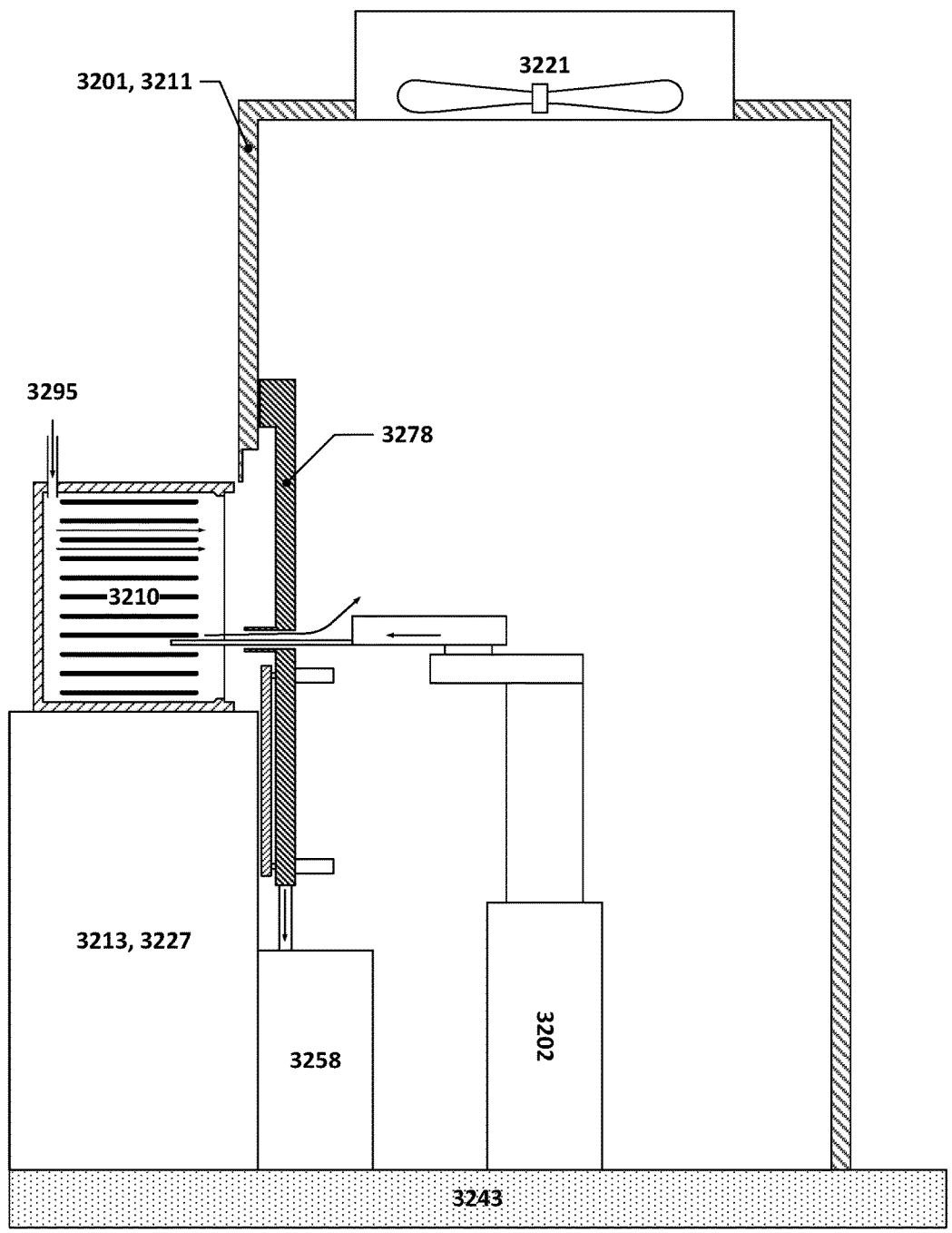

As can be seen in FIG. 33, once the FOUP 3210 is placed on the load port unit 3213/interface 3227, the FIM 3242 may extend out and interface with the removable FOUP door 3241, which may then be retracted, as is shown in FIG. 34. Once the removable FOUP door 3241 has been removed from the FOUP 3210, the door 3278 may be lowered using the drive mechanism 3258 such that the horizontal slot 3246 is lined up with one of the wafers 3204 in the FOUP 3210. The robot arm 3202 in the EFEM 3211 may then reach into the FOUP 3210 and withdraw the wafer 3204, as seen in FIG. 35. If a wafer at a different position is desired, the door of the load port unit may be moved to align the horizontal slot with that other wafer, as seen in FIG. 36. Any buffer gas that is flowed into the FOUP may flow out of the FOUP by way of the horizontal slot, which has a cross-sectional area that is considerably smaller than the cross-sectional area of the entire FOUP opening, e.g., perhaps $\frac{1}{25}^{th}$ of the area of the FOUP opening. There may also be buffer gas that escapes from the FOUP through gaps between the FOUP and the wall or door that has the horizontal slot; it may be undesirable to provide a seal in this interface to avoid undue particle generation that may be caused by rubbing between these parts. However, the flow paths provided by the horizontal slot and these gaps may still, in aggregate, provide a flow restriction barrier between an interior volume of the FOUP and an interior volume of the enclosure/EFEM. This may correspondingly reduce the amount of buffer gas flow that is needed to maintain a desired degree of positive pressure within the FOUP, thereby reducing cost and increasing safety.

Figure 37:
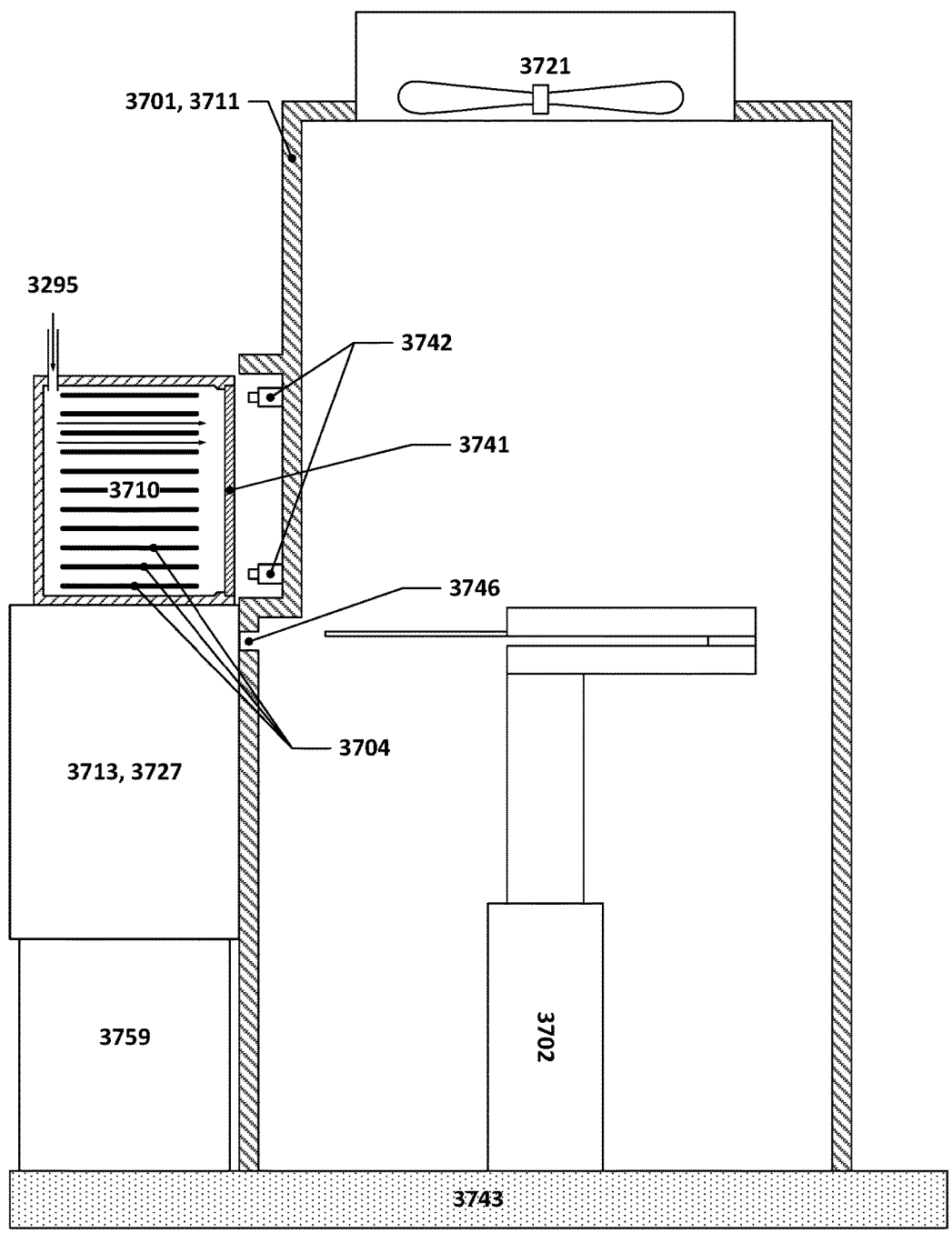
FIGS. 37 through 41 depict an example EFEM with an example wall with a horizontal slot during various phases of operation.
Figure 38:
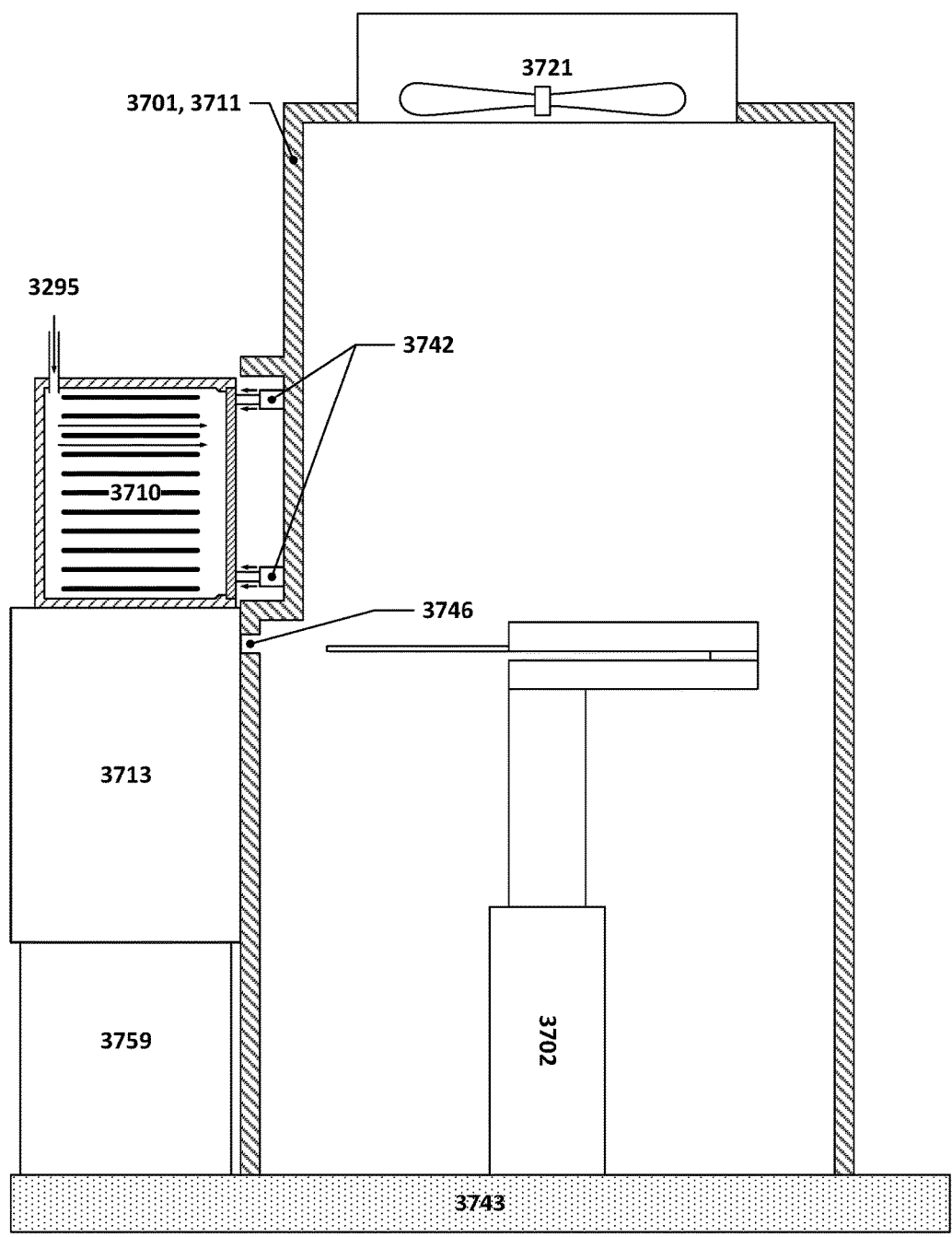
Figure 39:
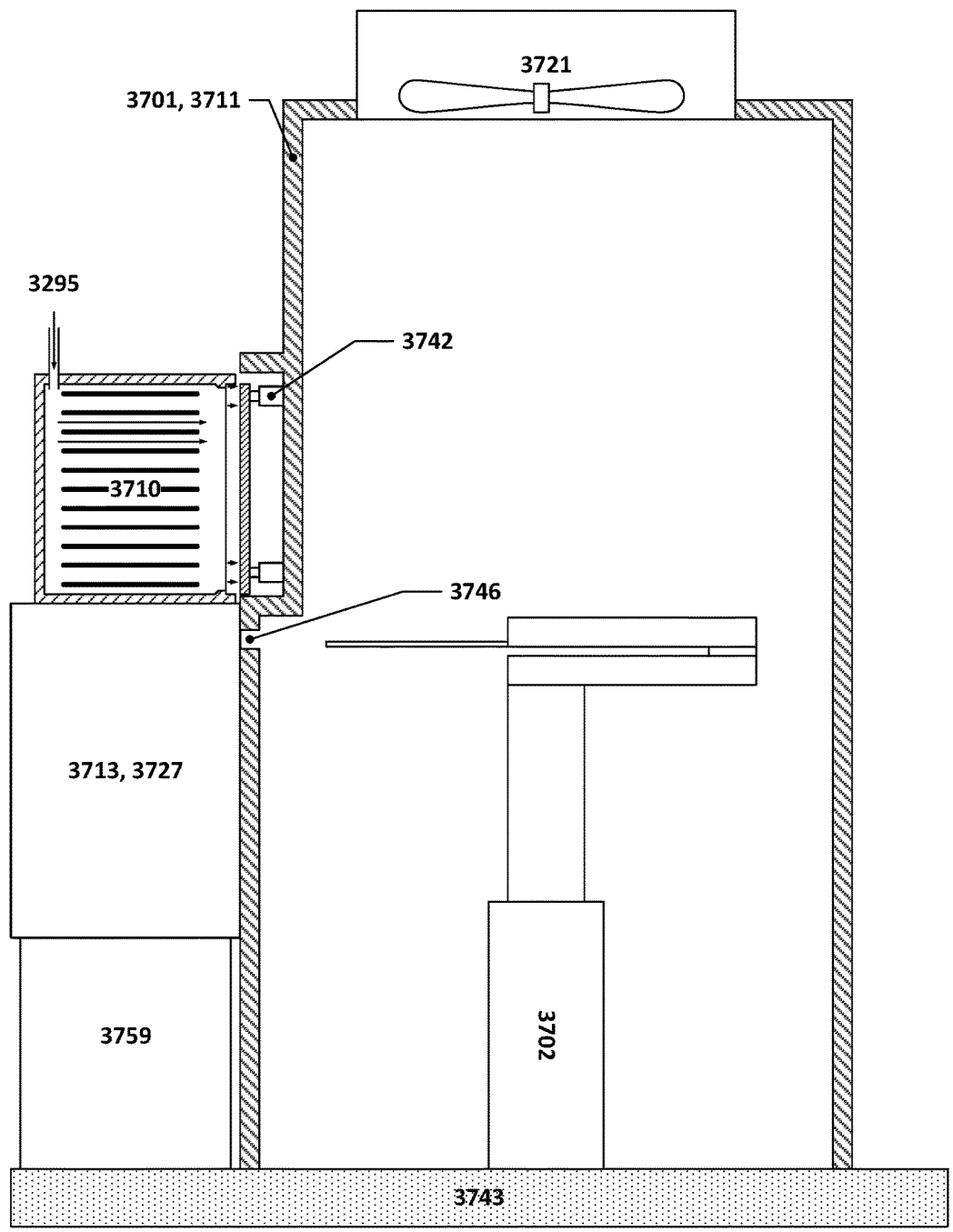
Figure 40:
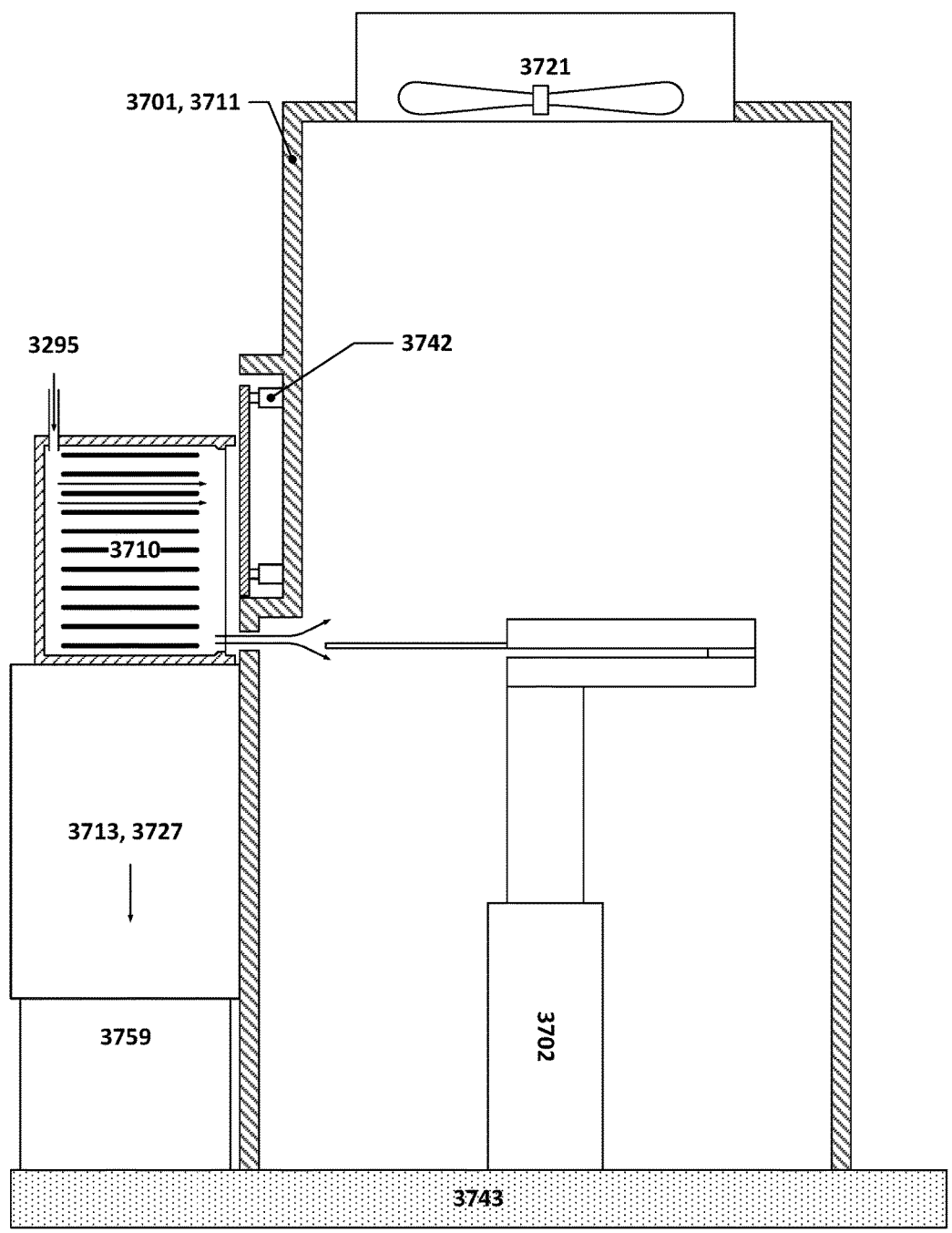
Figure 41:
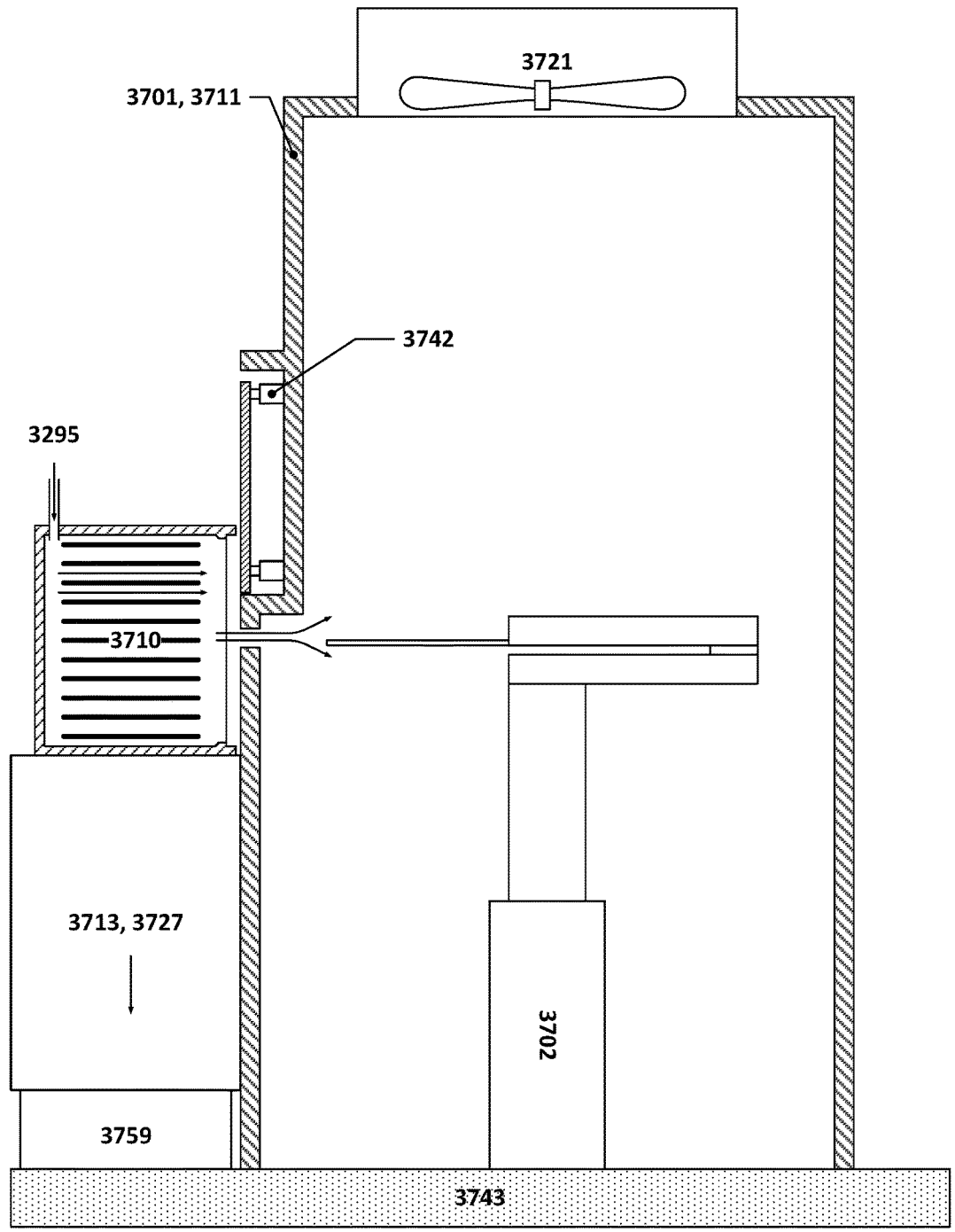

A further variant of the above-described design is shown in FIG. 37. In FIG. 37, there is no door for the load port unit 3713 and the EFEM 3711 has a wall that includes a horizontal slot 3746, which is stationary. The EFEM 3711 may also be connected with one or more wafer processing chambers and/or a wafer transfer chamber via a load-lock (not shown, but see FIG. 2 for an example of how similar such structures may be arranged relative to the EFEM 3711). The load port unit 3713 in this implementation includes a vertical drive mechanism 3759, allowing the platform or interface 3727 supporting the FOUP 3710 to be moved up and down relative to the EFEM 3711. The EFEM 3711 may include a FIM 3742 that may remove the removable FOUP door 3741 when the FOUP 3710 is in a particular vertical position (see FIGS. 38 and 39). The load port unit 3713 may then be lowered (or raised, depending on where the FIM 3742 is located) to align one of the wafers 3704 in the FOUP 3710 with the horizontal slot 3746 (see FIG. 40). If another wafer 3704 is desired, then the FOUP 3710 may be vertically positioned to align the other wafer with the horizontal slot (see FIG. 41). Implementations with either a wall or a door with a horizontal slot, as described in the above sections, may be referred to herein as "horizontal slot concepts" due to their common incorporation of a horizontal slot feature as outlined above. It is to be understood that the drive mechanisms that are used in such implementations may provide for relative vertical translation between the horizontal slot 3246 or 3746 and the interface that supports the multi-wafer storage system.

Figure 42:
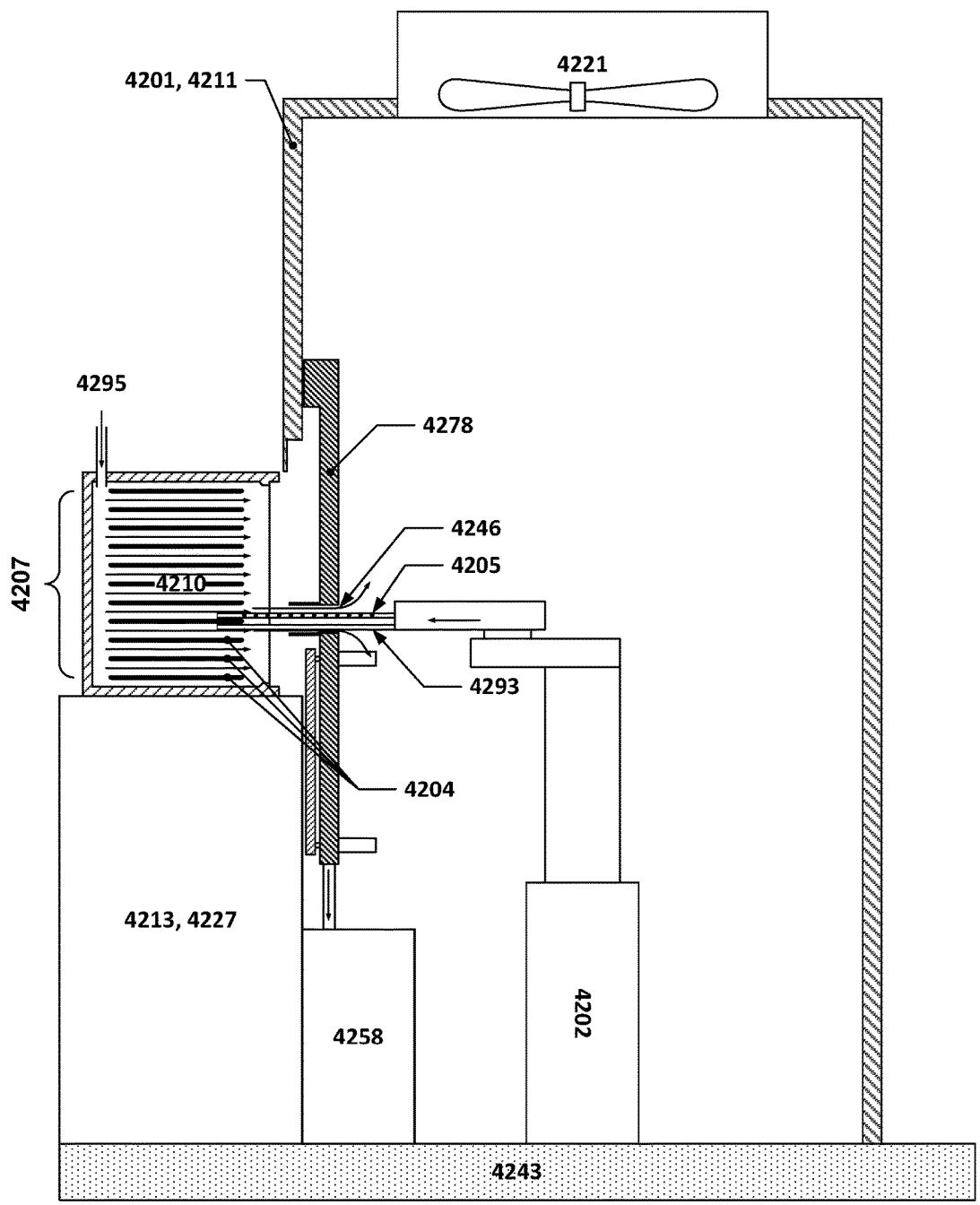
FIG. 42 depicts an example EFEM that includes a door with a horizontal slot as well as a robot arm with a buffer gas distributor.

FIG. 42 depicts a side view of another example EFEM. In FIG. 42, an EFEM 4211 is shown that is similar to the EFEM 3211 of FIGS. 32 through 36 (for example, elements in FIG. 42 that are correspond to elements in FIG. 32 are indicated with callouts having the same last two digits and the discussion of those elements with respect to FIG. 32 is equally applicable to the corresponding elements in FIG. 42), and the discussion of the elements of FIGS. 32 through 36 is equally applicable with respect to the implementation depicted in FIG. 42. The implementation of FIG. 42, however, further includes a buffer gas distributor 4205 that is insertable into the inter-wafer gaps between wafers in a wafer stack, which may be any of the buffer gas distributors discussed in this disclosure that are insertable into the stack 4207 of wafers 4204. Thus, the wafers 4204 may be protected by a constantly flowing buffer gas environment while in the docked FOUP 4210 (provided by way of a FOUP gas port 4295), and may also be protected by a constantly flowing layer of buffer gas provided by way of the buffer gas distributor 4205 while being transported through the EFEM 4211 by the robot arm 4202 and end effector 4293. In some such implementations, the EFEM 4211 may also be equipped with a buffer gas system to flow buffer gas through the entire EFEM 4211, similar to the systems described in FIGS. 1 through 5.

In such systems, the buffer gas system for the EFEM 4211 may be able to reduce the concentration of facility air in the EFEM 4211 buffer gas environment to a very low level, e.g., 100 parts per million (ppm), in locations transited by the wafer 4204, but due to various leak paths into the EFEM 4211, it may not be feasible to reduce the concentration of the facility air in the buffer gas environment of the EFEM to a a lower level than that using the EFEM buffer gas distribution system. However, by using one or both of the slot door 4246 and the buffer gas distributor 4205 in conjunction with an EFEM buffer gas distribution system, the localized environment around the wafers 4204 may be purged such that the concentration of facility air in the immediate vicinity of the wafers 4204 is further reduced, e.g., to 10 ppm or 1 ppm. Achieving such low concentration levels of facility air may, in some instances, not be feasible using the EFEM-level buffer gas distribution systems of FIGS. 1 through 5 alone, nor using the buffer gas distributors of FIGS. 7 through 30 and the horizontal slot concepts of FIGS. 32 through 41, either in combination or individually, alone. However, there may be a synergistic effect from using EFEM-level buffer gas distribution systems as discussed with reference to FIGS. 1 through 5 in combination with the buffer gas distributors of FIGS. 7 through 30 and the horizontal slot concepts of FIGS. 32 through 41, either in combination or individually, that allows such combined-approach implementations to achieve lower facility air ppm levels than is possible absent such a synergistic combination. This is because there may always be some amount of "undesirable" gas that may reach the wafer, regardless of which of the approaches or techniques discussed herein is used.

In the case of an EFEM-level buffer gas distribution system, it will generally be infeasible or impractical to hermetically seal the entire EFEM due to its size and the exorbitant costs of doing so. As a result, there will generally be leakage from the ambient facility air surrounding the EFEM into the interior volume of the EFEM even as buffer gas is flowed through the EFEM. Such facility air may become mixed with the buffer gas, and the leak rate of the facility air into the EFEM may be such that it may be difficult to attain a desired maximum level of facility air concentration within the EFEM without implementing a much more costly and impractical EFEM design that is sealed more tightly to further reduce the amount of facility air leakage into the EFEM or without using a much higher flow rate of buffer gas, which may be prohibitively expensive and may introduce safety issues since a much larger amount of buffer gas may need to be safely disposed of.

Similarly, there may also be leakage of ambient air or gas surrounding the buffer gas distributor and/or the horizontal slot concept into the areas immediately adjacent to the wafers being transported by the end effector/robot arm or remaining in the FOUP. While the amount of ambient air or gas that reaches the wafers in such implementations may be reduced by increasing the flow rate of the buffer gas, it may not be feasible or practical to increase the flow of buffer gas to the level needed to achieve a desired concentration level of ambient air or gas. Doing so, for example, may involve buffer gas flow rates that are too costly or too dangerous. In some cases, the flow rate of buffer gas may need to be increased to a level that may cause vibrations or movement of the wafers, which may be generally undesirable.

However, if an EFEM buffer gas distribution system is used in tandem with the buffer gas distributors of FIGS. 7 through 30 and the horizontal slot concepts of FIGS. 32 through 41, either in combination or individually, then the EFEM buffer gas distribution system may reduce the concentration of facility air in the ambient environment within the EFEM to a first level that is low enough that the facility air that still remains in the EFEM volume and that reaches the wafer is present in such a low amount that the further dilution provided by the buffer gas distributors of FIGS. 7 through 30 and the horizontal slot concepts of FIGS. 32 through 41, either in combination or individually, may reduce the facility air concentration level in the vicinity of the wafer to an acceptable level.

As noted earlier, a load port unit may be equipped with a movable cover plate or door having a horizontal slot in it that is sized to allow one wafer at a time to be extracted through the cover plate or door from a FOUP; the cover plate or door may be moved vertically to allow wafers to be extracted from different slot positions in the FOUP. The cover plate or door may, in effect, close off most of the open portion of the FOUP, thus restricting the flow of purge gas out of the FOUP. There may also be an enclosure volume on the back of the load port unit, i.e., interposed between the cover plate and the FOUP, that provides a closed protection volume that is filled with nitrogen. This volume may also cover the load port door mechanism, regardless of whether the load port door mechanism is closed or open. Additionally, the FOUP may be sealed to the front surface of the load port unit to prevent nitrogen flow out of that gap. In practice, the purge gas may only flow through the slot and out through the gap between the cover plate and the FOUP or enclosure volume—this gap may, for example, be on the order of one or several millimeters. Thus, the cross-sectional area through which purge gas may flow in order to leave the FOUP may be considerably reduced when using a slot door as compared with implementations in which the purge gas may flow out of the entire open portion of the FOUP, i.e., through an opening that is wider than the diameter of the wafers and that is higher than the stack height of the wafers within the FOUP.

When wafer transfers are not occurring, the cover plate, in some implementations, may also have the capability to move to a position where the slot is blocked (up or down) so that lower nitrogen flow can be used and additional wafer protection may be provided.

Figure 43:
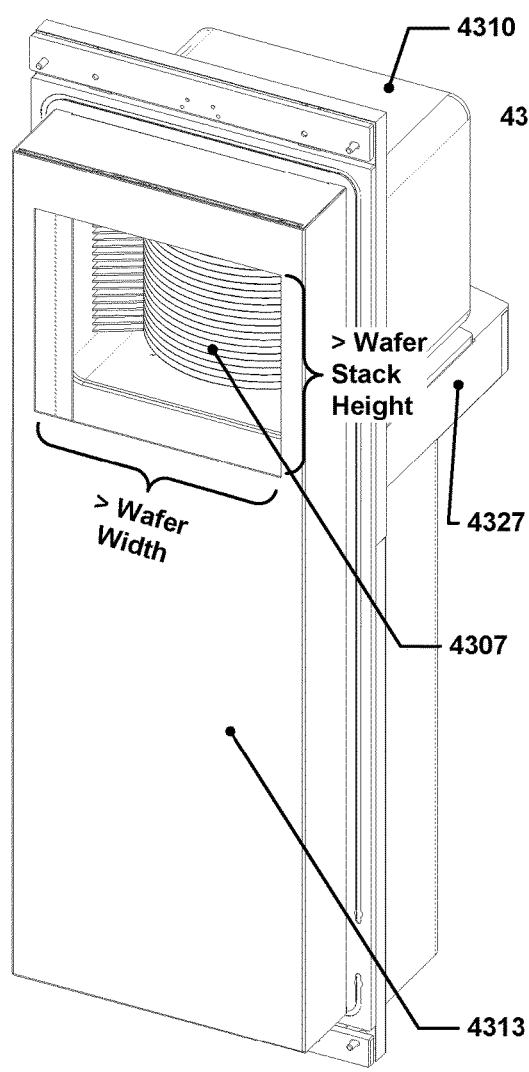
FIG. 43 depicts an example load port unit with no slot door.

FIG. 43 shows a load port unit 4313 without a slot door (it has been removed); as can be seen, the entire wafer stack 4307 may be accessed simultaneously through an opening that is greater in height than the height of the wafer stack and greater in width than the wafer diameters. If nitrogen or other buffer gas were to be flowed through the FOUP 4310 while it is resting on an interface 4327 of the load port unit 4313, the purge gas would need to be supplied at a high volumetric rate, given the size of this opening, in order to maintain a high enough overpressure in the FOUP to prevent backflow from the EFEM into the FOUP.

Figure 44:
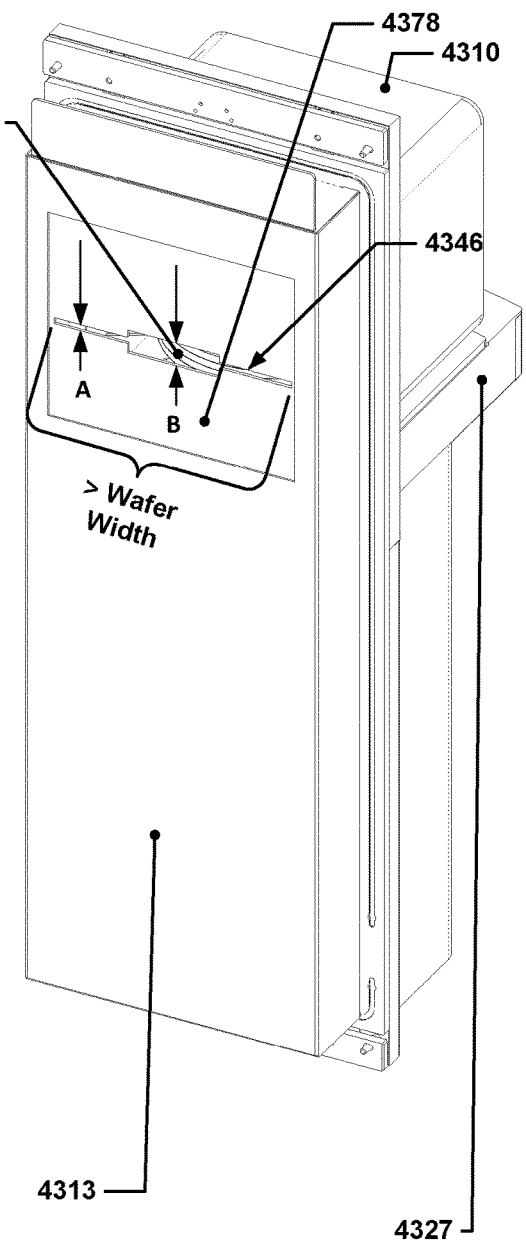
FIG. 44 depicts an example load port unit with a slot door.

FIG. 44 depicts the same load port unit 4313 as in FIG. 44, except that this load port unit 4313 is equipped with a translatable or moveable cover plate/slot door 4378. The slot door 4378 may have a horizontal slot 4346 in it that is greater in width than the wafer diameter, but, in contrast to the opening of FIG. 43, the slot may be much smaller in the vertical direction. In some implementations, the slot may be approximately the same height as the inter-wafer spacing in the wafer stack. In other implementations, such as the one shown, the horizontal slot 4346 may have two or more different heights along its length. For example, a horizontal slot 4346 may have one height ("A") that is sized to allow for wafer clearance as wafers are inserted into or removed from the FOUP but that is at least smaller than twice the inter-height wafer spacing, and a second height "B" that is larger, e.g., 2 to 3 times larger or greater, than the height "A"; this higher-height region may be sized to allow for additional clearance that may be needed for an end effector to reach into the FOUP to retrieve or place a wafer (the end effector itself may be quite thin, e.g., 1-2 mm, although it may be connected with a considerably thicker robot wrist joint or other hardware). Thus, a middle portion of the horizontal slot may have a greater height ("B") than flanking portions on either side of the middle portion, which may have lower heights ("A"). In such implementations, the width of the "B" height region may be sized slightly larger, e.g., a few mm larger or more, than the width of the end effector and/or robot arm components that may pass through the slot door at the increased-height area. It is to be understood that such varying-height horizontal slots may be used, if desired, in any of the horizontal slot concepts discussed herein. In some such instances, the middle portion of the horizontal slot may extend below the flanking portions to accommodate the additional thickness of the end effector, but may otherwise be flush with the flanking portions along the top edge. In other implementations, middle portion may extend above the flanking portions, but be flush with the bottom edge of the flanking portions. And in yet other implementations, the middle portion may extend above and below the flanking portions. The slot door may be moved vertically within the load port unit so as to move the slot up and down.

Figure 46:
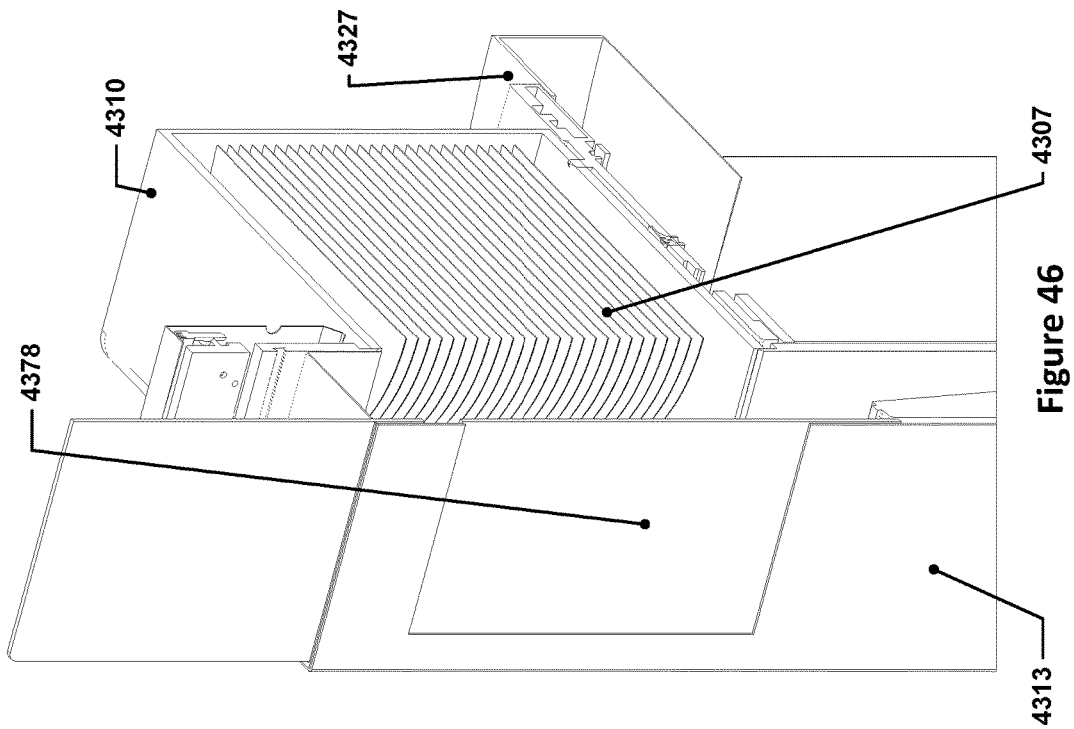
FIGS. 45 and 46 depict isometric cutaway views of the example load port unit of FIG. 44 with the slot door in two alternative "closed" positions.
Figure 45:
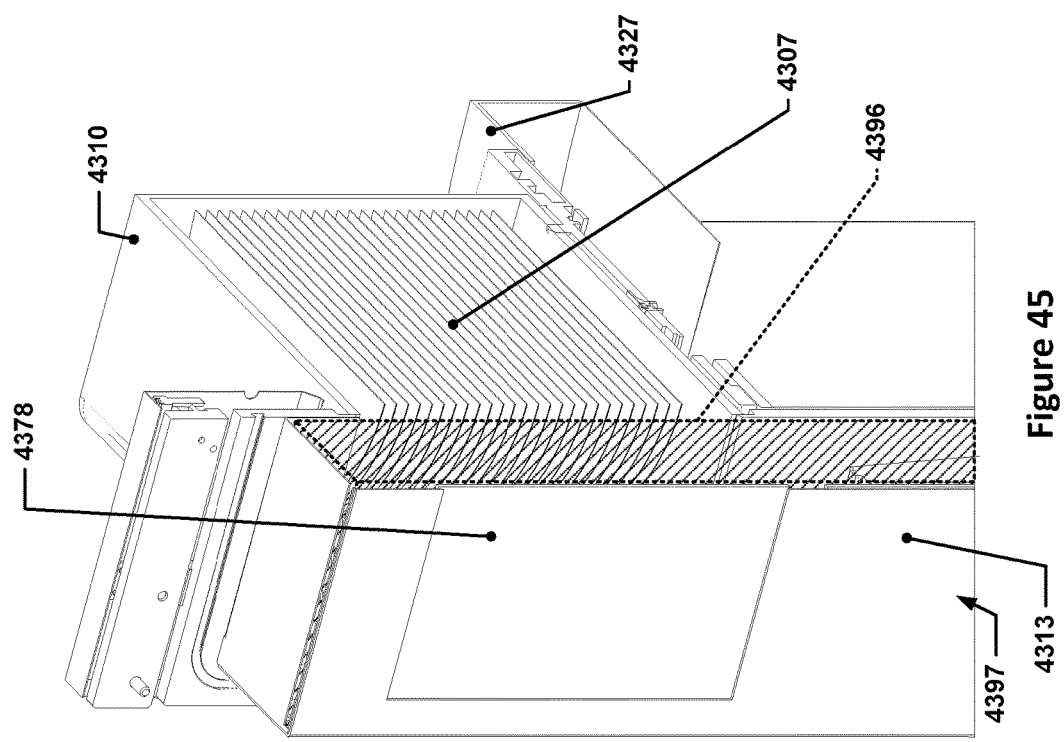
Figure 49:
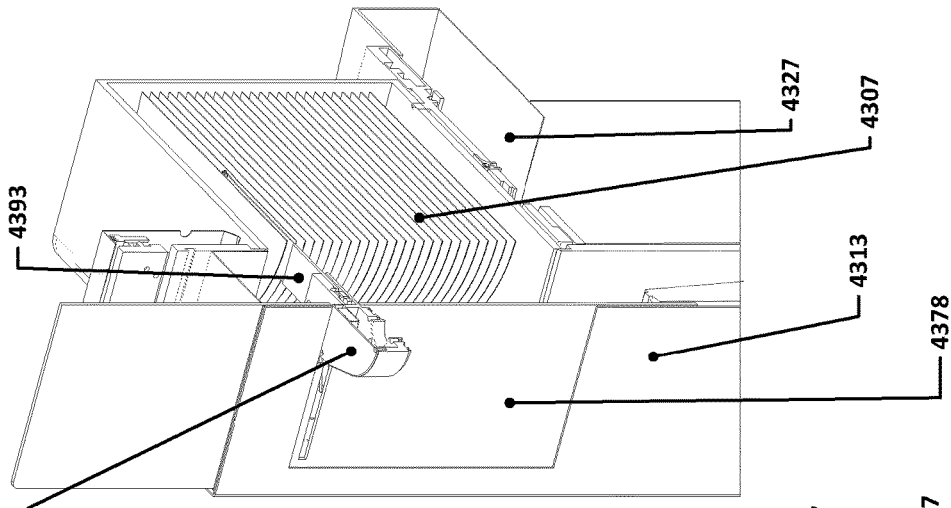
FIGS. 47 through 49 depict further cutaway views of the example load port unit of FIG. 44 with the slot door in different positions.
Figure 48:
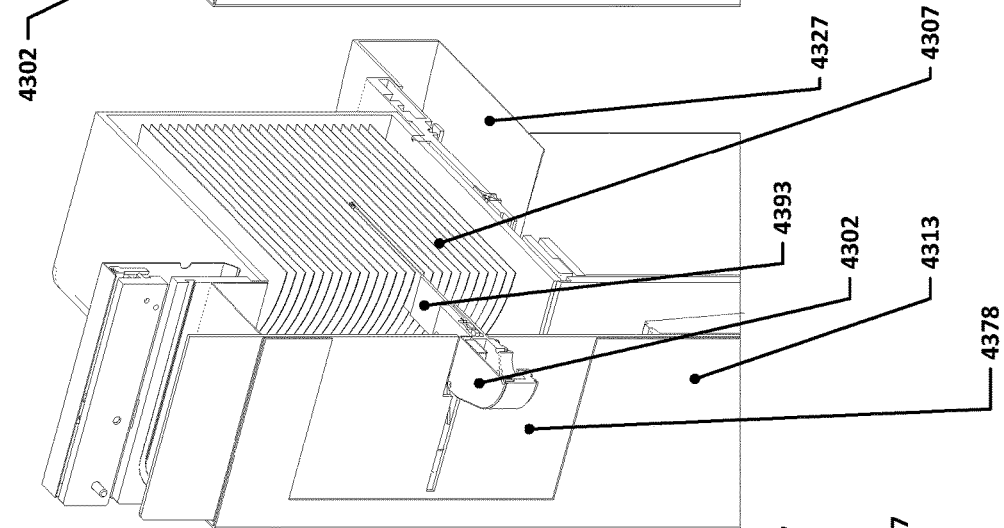
Figure 47:
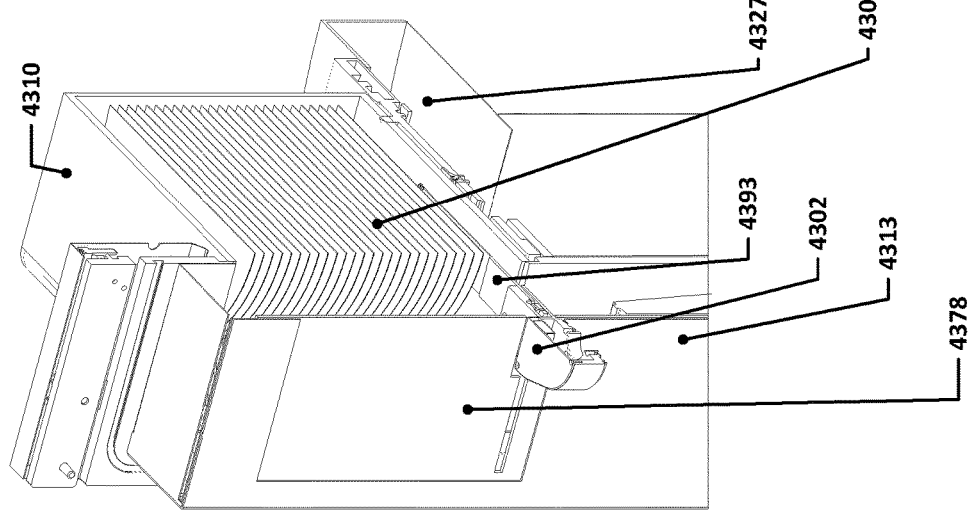
Figure 53:
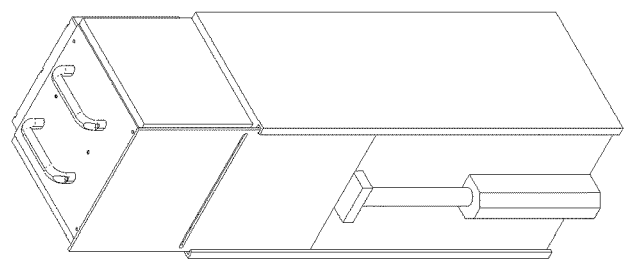
FIGS. 50 through 53 depict isometric views of an example buffer unit and slot door.
Figure 52:
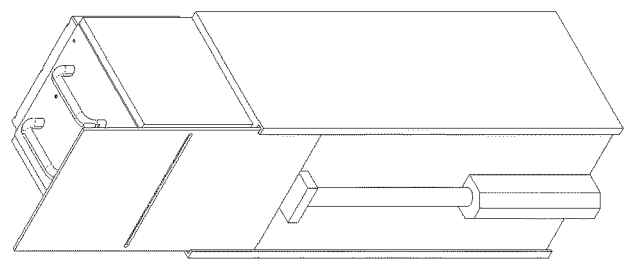
Figure 51:
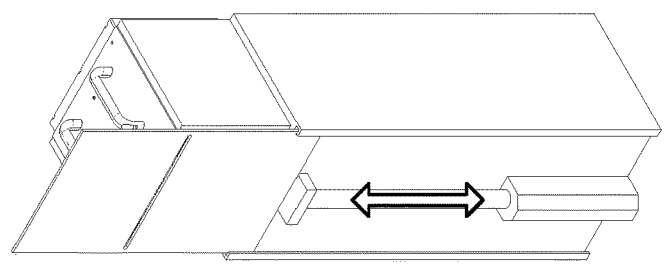
Figure 50:
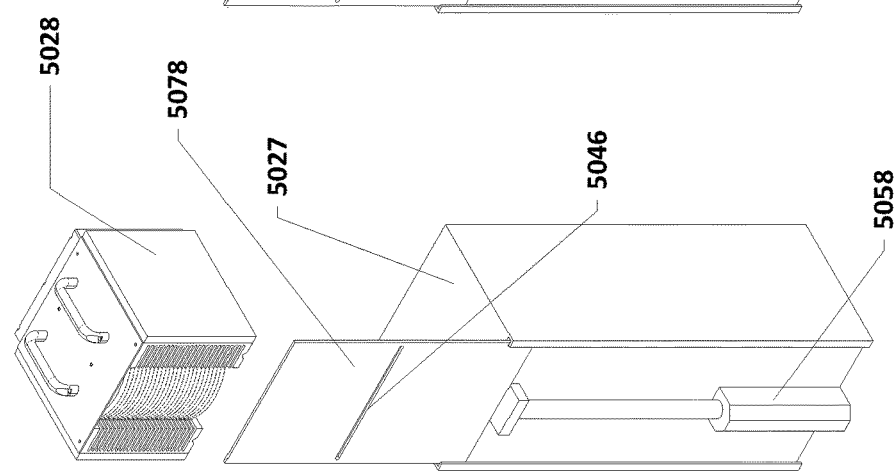

In some implementations, such as those depicted in FIGS. 45 and 46, the slot door 4378 may be moved down (FIG. 45) or up (FIG. 46) such that the horizontal slot 4346 is hidden behind the front surface 4397 of the load port unit 4313, thereby effectively "closing" the slot to gas flow (some minor leakage may still occur, but the bulk of the gas flow through the slot will be terminated in such configurations.) During use, the slot door 4378 may be repositioned such that the slot is in a position allowing for retrieval of, or placement of, one of the wafers in the FOUP 4310, such as is shown in FIGS. 47, 48, and 49 for three different wafer positions. The slot door 4378 may be driven vertically within the load port unit by a linear actuator, such as a ball screw, pneumatic actuator, or hydraulic actuator, or other drive mechanism (not shown); the drive mechanism may be located, for example, within the enclosure volume 4396 (see FIG. 45), which may also enclose hardware and mechanisms for removing a removable FOUP door (which is not included in these simplified representations).

It is to be understood that while the examples herein have focus on slot-door concepts for retrieval or insertion of only one wafer at a time through a slot-door or similar slot-like structure, these concepts may be expanded to slot concepts in which the slots are sized to accommodate the insertion or retrieval of two or more wafers at a time through the slot door or other slot-containing structure. In such cases, the slot may be sized to accommodate 2, 3, 4, or more wafers at a time, although the slot will always be small enough that the entire wafer stack within the apparatus having the slot door or similar slot structure cannot be inserted or retrieved through the slot simultaneously.

The slot-door technology may be used with a variety of different types of semiconductor wafer handling equipment that may contain multiple wafers simultaneously while allowing a wafer handling robot or other type of wafer handling device to interact with those wafers individually or in numbers less than the full number of wafers in the handling equipment. While FOUPs are one example of such multi-wafer storage systems, other examples of such implementations are described below or elsewhere in this disclosure. For example, the slot-door concept may be used with wafer aligners (as discussed herein in more detail), load-locks (as discussed herein in more detail), metrology stations, buffer stations (as discussed herein in more detail), load ports (as discussed herein in more detail), particle removers, wafer tunnels, etc. In general, the slot door concepts discussed herein may be used to partition between any multi-wafer storage area or component held in a buffer gas environment and an adjacent environment which is at atmospheric conditions.

In another implementation, shown in FIGS. 50 through 54, a slot door may be used in conjunction with a wafer buffer. A wafer buffer may, for example, be supported on an interface within an EFEM (as compared to a FOUP that is supported on an interface external to the EFEM), and may be used to temporarily store wafers under certain conditions in between processing stages. A wafer buffer may be heated, for example, and may be supplied with purge gas or inert gas in order to protect the wafers located within the buffer from oxidation or other types of damage. In many respects, the wafer buffer implementation of FIGS. 50 through 54 may be similar to the slot door FOUP load port implementations discussed earlier in this paper, although the wafer buffer may typically not have any door that requires removal, as is the case with a FOUP.

As shown in FIGS. 50 through 54, the wafer buffer 5028 may rest on an interface 5027, which may incorporate a linear actuator or drive mechanism 5058 for moving a slot door 5078 up and down in the vertical direction. A horizontal slot 5046 in the slot door 5078 may be positioned so as to align with the lowest wafer position in the wafer buffer 5028 at one linear actuator position (see FIG. 53) and with the highest wafer position in the buffer at another linear actuator position (see FIG. 51). At the same time, the slot door 5078 itself may be large enough that the slot door 5078 closes off the front of the wafer buffer 5028 regardless of which position the horizontal slot 5046 is in. Thus, as in previous slot door implementations, buffer gas, e.g., purge gas or inert gas, that flows through the wafer buffer 5028 may exit the wafer buffer 5028 either by way of the horizontal slot 5046 or through the gap that may exist between the slot door 5078 and the wafer buffer 5028 housing. Since this gap may be quite small, e.g., on the order of a few millimeters, the cross-sectional flow area available for escaping buffer gas is quite small compared to the cross-sectional flow area of the wafer buffer 5028 opening as a whole.

Figure 54:
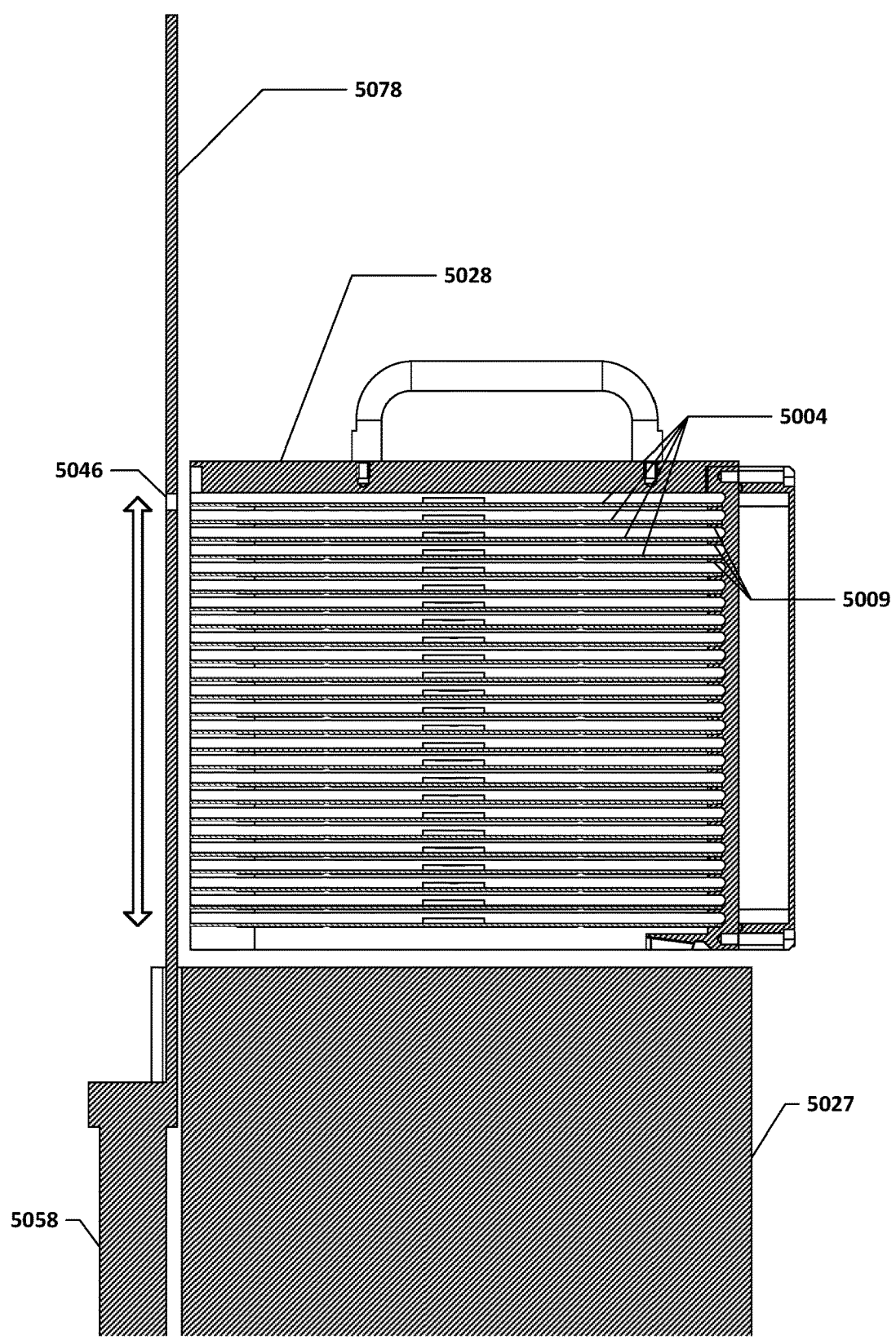
FIG. 54 depicts a side section view of the example buffer unit of FIG. 50.
Figure 55:
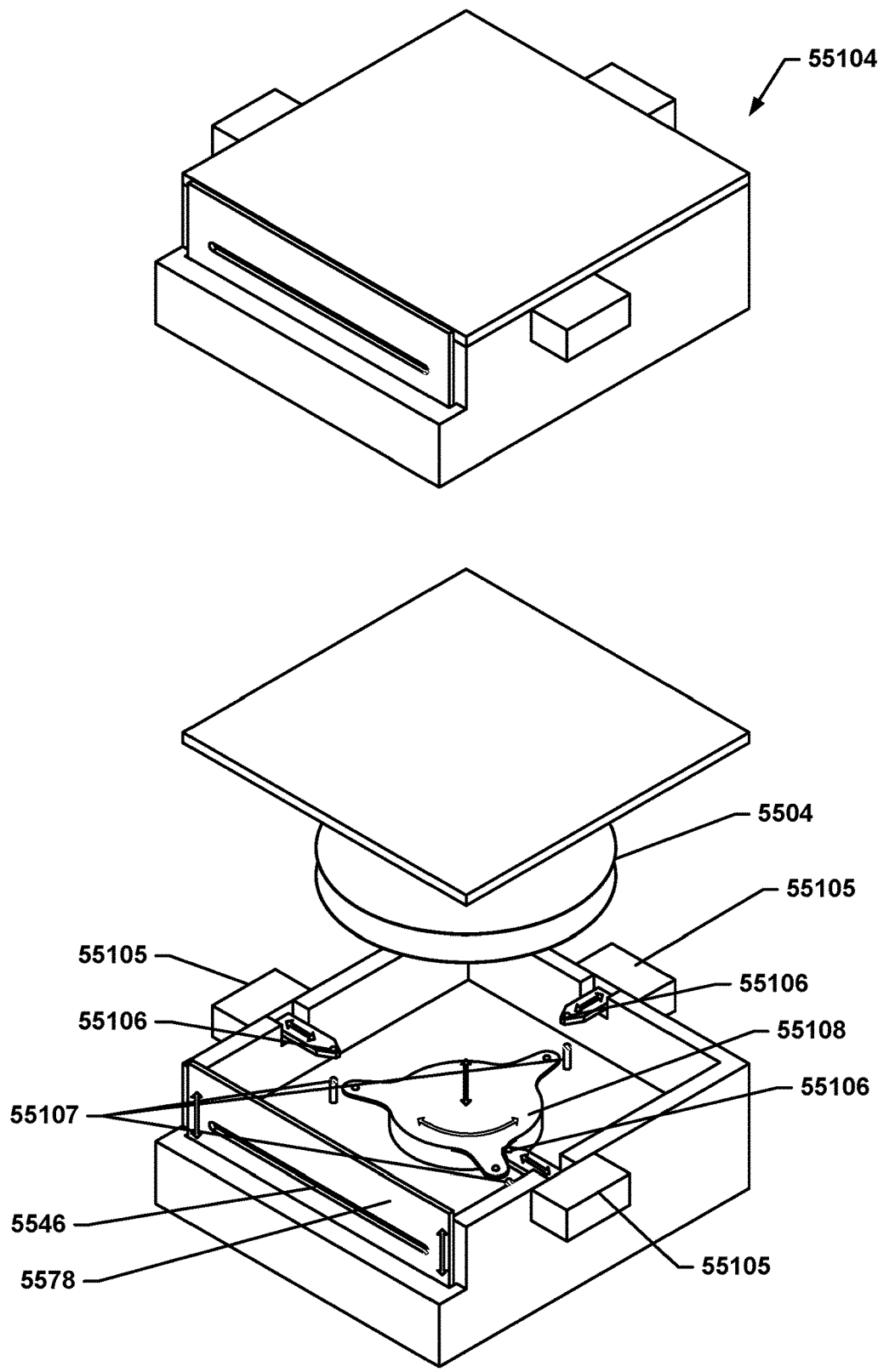
FIG. 55 depicts an isometric exploded view of an example dual-wafer aligner with a slot door.

FIG. 54 depicts a side section view of a portion of the wafer buffer 5028 of FIGS. 50 through 53. As can be seen, the wafer buffer 5028 supports an array of wafers 5004 that are each supported on a corresponding wafer support feature 5009; these wafer support features, or wafer support features similar to them, may also be used in other multi-wafer storage systems discussed herein.

Another implementation in which a slot door may be used is in a wafer aligner. A wafer aligner is a device with a turntable that is able to rotate a wafer such that the wafer is aligned with a desired orientation, after which a robot arm may pick up the wafer for transport to another station in which that angular orientation is desired. In some wafer aligners, a space may be provided above the wafer aligner to store or buffer an additional wafer. FIGS. 55 through 58 depict an example of such a wafer aligner.

In FIGS. 55 through 58, a wafer aligner 55104 with a buffer station is shown. The wafer aligner 55104 may include an aligner turntable 55108 within its interior volume; the aligner turntable 55108 may be capable of both rotating about its center axis and translating along the center axis, e.g., vertically. A pattern of lift pins 55107 may be arranged in a circular array with a diameter larger than the turntable rotation envelope. A robot end effector (not shown) may lay a wafer 5504 onto the lift pins 55107 while the aligner turntable 55108 is lowered to a position below the level of the lift pins 55107. After the robot end effector has withdrawn, the aligner turntable 55108 may be elevated to pick up the wafer 5504 from the lift pins 55107. Once the wafer 5504 is clear of the lift pins 55107, the aligner turntable 55108 may be rotated to achieve the desired angular alignment of the wafer 5504. Once the wafer 5504 is aligned, the wafer 5504 may be lifted further by the aligner turntable 55108. Prior to such an operation, the retractable supports 55106 shown may be retracted towards their respective support actuators 55105 to allow the wafer 5504 to pass by the retractable supports 55106 without collisions. After the aligner turntable 55108 has raised the wafer 5504 higher than the retractable supports 55106, the retractable supports 55106 may be extended towards the wafer 5504 such that the retractable supports 55106 may support the wafer 5504 from below when the aligner turntable 55108 is subsequently lowered. Once the retractable supports 55106 are in the proper extended configuration, the aligner turntable 55108 may be returned to a lower position, thereby leaving the wafer 5504 on the retractable supports 55106. The robot end effector (or a similar end effector from another robot) may then be slid underneath the wafer 5504 to allow the wafer 5504 to be lifted off the retractable supports 55106 and withdrawn from the aligner 55104. It is to be understood that one wafer 5504 may be aligned while the other wafer 5504' is supported by the retractable supports 55106. It is also to be understood that multiple levels of wafer storage, each with its own set of retractable supports 55106, may be included in such an aligner 55104.

In some implementations, the aligner turntable may also be configured to translate horizontally in two axes to allow the rotationally aligned wafer 5504 to also be aligned in the X and Y directions, i.e., centered. In some alternative such implementations, the aligner turntable 55108 may not be capable of translation, but the retractable supports 55106 may be capable of such movement and such centering may be performed on the wafer 5504 while it is supported by the retractable supports 55106.

When the lid is on the aligner 55104, the aligner 55104 may have a largely sealed internal volume, aside from a portion that faces towards the robot. In this implementation, this portion is largely closed off behind a door 5578 with a horizontal slot 5546, similar to the horizontal slots described above with respect to other slot-door implementations discussed herein, that allows a single wafer 5504 to be inserted into or withdrawn from the wafer aligner 55104. Thus, if buffer gas is introduced into the wafer aligner 55104 to slightly overpressurize the wafer aligner 55104 with buffer gas and thereby protect the wafers 5504 that are within, the level of buffer gas flow that is needed to maintain the overpressurization may be considerably lower than would be needed in an implementation with an open front.

Figure 56:
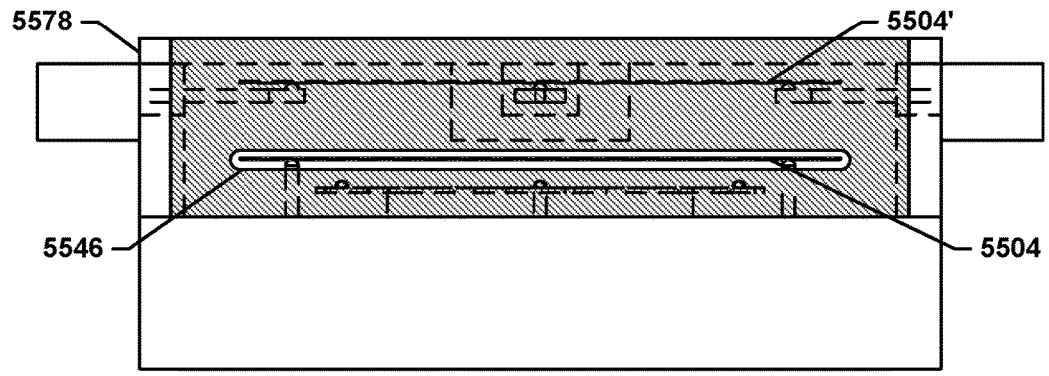
FIGS. 56 through 58 depict front views of the example dual-wafer aligner of FIG. 55 with the slot door in different positions.
Figure 57:
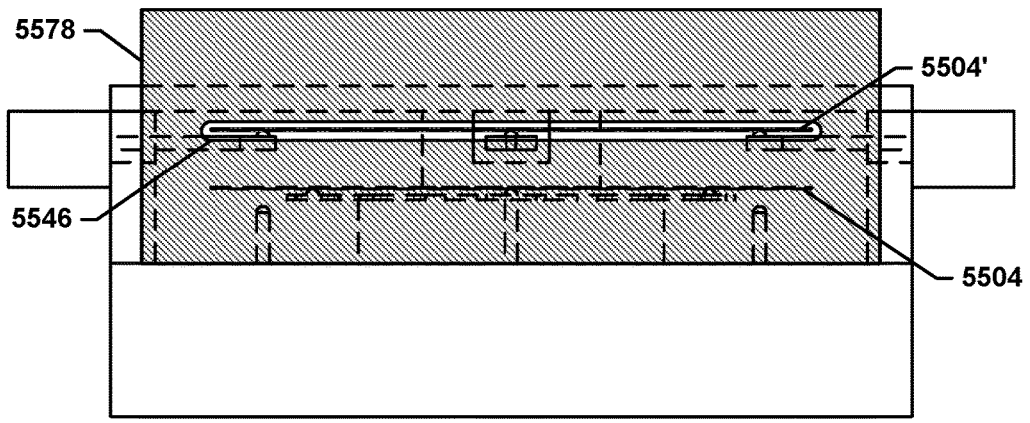
Figure 58:
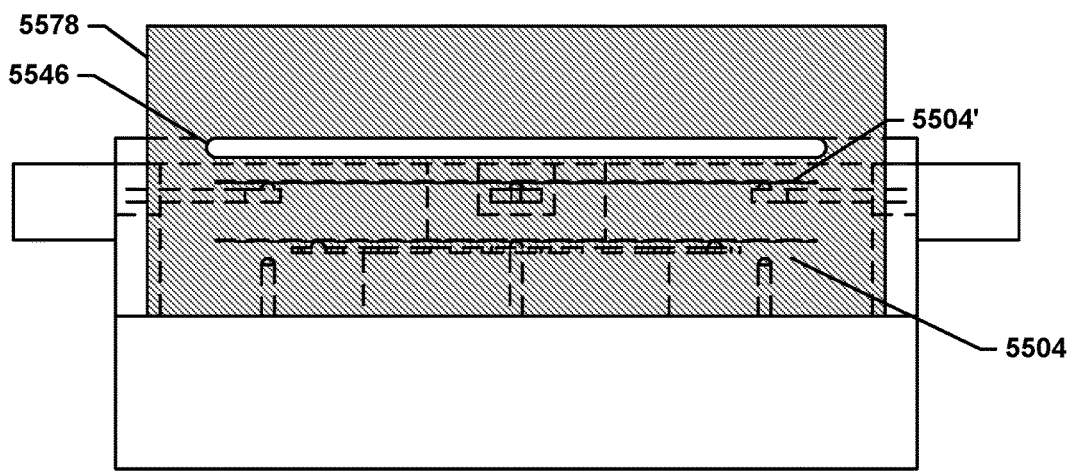

As can be seen in FIG. 56, the door 5578 may be lowered such that the horizontal slot 5546 is aligned with the wafer support plane of the lift pins 55107 when a wafer 5504 is inserted into or withdrawn from the lower position of the wafer aligner 55104. In FIG. 57, the door 5578 has been elevated so as to align the horizontal slot 5546 with the wafer support plane of the retractable supports 55106—this may allow a wafer 5504 to be inserted into or withdrawn from the upper positions of the wafer aligner 55104. In FIG. 58, the door 5578 has been elevated further such that the horizontal slot 5546 overlaps with the lid—this positioning may be used to reduce the cross-sectional area of the gas flow path out of the wafer aligner 55104 further, allowing for a decreased purge gas flow rate while still maintaining a desired overpressurization environment within the wafer aligner 55104.

Figure 59:
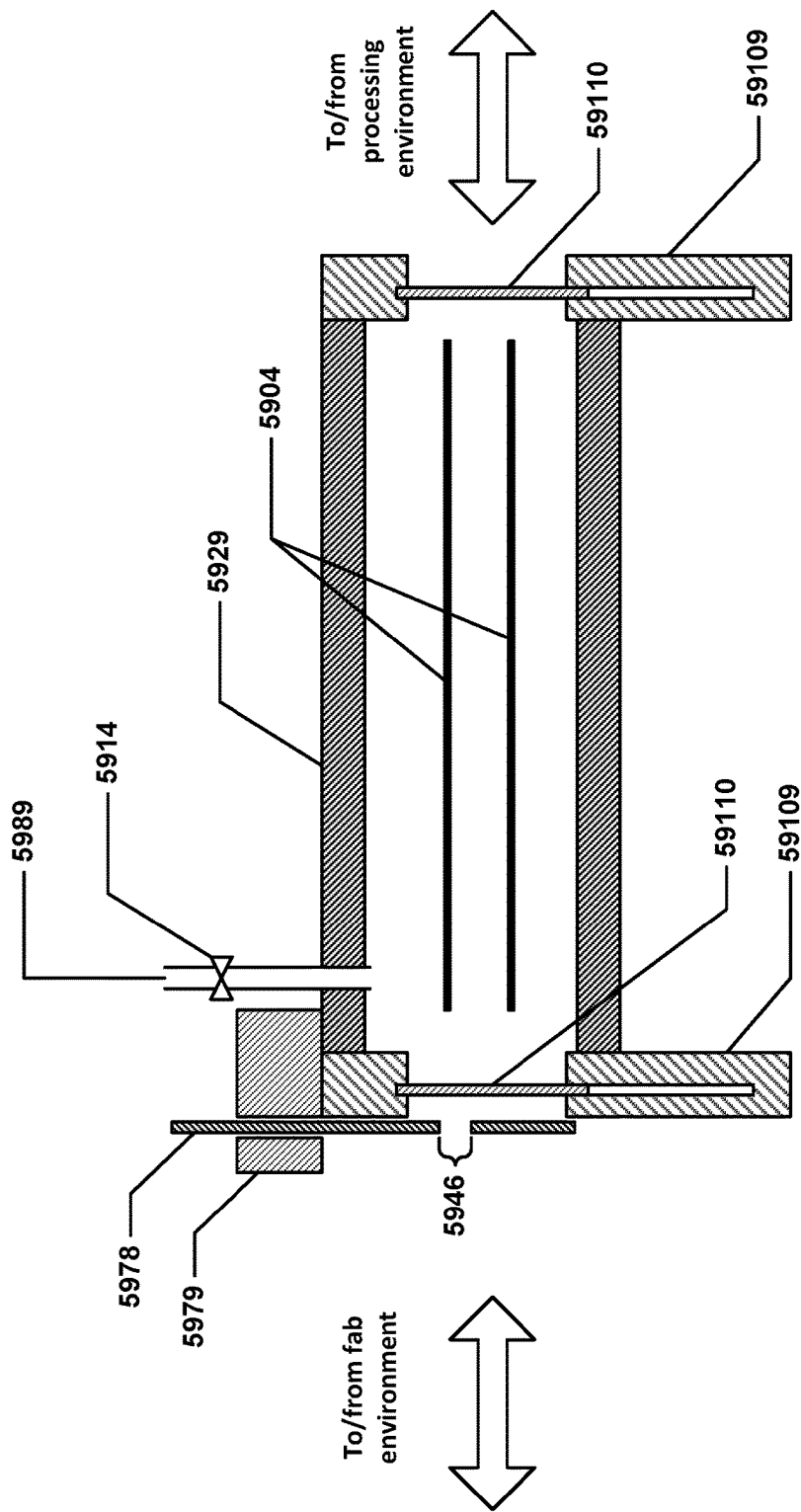
FIG. 59 depicts a side section view of an example dual-wafer load-lock with a slot door.

In another implementation, a slot door may be used with a multi-wafer load-lock in which wafers may be individually loaded or unloaded. FIG. 59 depicts an example of a two-wafer load-lock 5929 equipped with a door 5978 on the atmospheric/fabrication facility side of the load-lock 5929; the door may have a horizontal slot 5946 in it and may be similar in configuration to the other slot-door concepts discussed herein. In FIG. 59, the load-lock 5929 may have internal wafer support features (not shown) for supporting, in this case, two wafers 5904. The load-lock 5929 may have gate valves 59 109 or other hermetically-sealing doors located at opposing ends of the load-lock chamber. The gates 59 110 of the gate valves 59109 may each be operable between a closed position and an open position; in the closed positions, the gates 59110 may hermetically seal the load-lock 5929 chamber volume, allowing the load-lock chamber to be pumped down to a vacuum by a vacuum pump (not shown). When the load-lock chamber reaches a sufficiently low pressure environment, the processing environment gate valve 59109 may be opened, and a wafer handling robot may remove the wafer(s) 5904 from the load-lock.

In order to remove or insert wafers from or into the load-lock 5929 from the atmospheric/fab side of the load-lock 5929, the load-lock 5929 may first be equalized with the atmospheric pressure conditions by flowing a buffer gas into the load-lock 5929, e.g., through the buffer gas inlet 5989 shown. Without such equalization, it may be difficult to open the atmospheric-side gate valve 59109 (or such a valve may be damaged due to the pressure differential), and if the atmospheric-side gate valve 59109 is opened, the lower pressure in the interior of the load-lock 5929 may cause atmospheric air to be drawn into the load-lock chamber, which may contaminate the wafers 5904. By equalizing the load-lock chamber pressure with the atmospheric pressure of the fabrication facility using the buffer gas, such undesirable effects are prevented. Once the pressure is equalized, the atmospheric gate valve 59109 may be opened. The buffer gas may continue to be flowed into the load-lock 5929 while the atmospheric-side gate valve 59109 is open—by maintaining this flow, the load-lock chamber may be slightly overpressurized with respect to the ambient atmospheric pressure, thereby preventing the atmospheric air from flowing into the load-lock chamber, where it may potentially contaminate the wafers.

In order to reduce the amount of buffer gas flow needed to maintain this slight overpressurization, the load-lock 5929 may be equipped with the door 5978 with the horizontal slot 5946. As can be seen, the door 5978 may have a horizontal slot 5946 that is large enough to allow the wafers 5904 to be withdrawn from or inserted into the load-lock 5929 one at a time. The door 5978 is also large enough, however, to block most of the flow of the buffer gas out of the load-lock chamber. Again, a small gap may exist between the door 5978 and the load-lock chamber so that physical contact (and thus potential particulate generation) between the door 5978 and the load-lock chamber is reduced or minimized. The door 5978 may be moved vertically between positions corresponding with one wafer 5904 or the other, as desired, in order to position the horizontal slot 5946 so as to allow the desired wafer 5904 to be inserted into or removed from the load-lock chamber.

It is to be understood that a similar implementation with a stationary horizontal slot or slots may be used in some instances. For example, gate or slit valves that are commonly used in semiconductor processing tools for closing off wafer transfer passages or other routes traversed by wafers are usually purchased from valve manufacturers, and the selection of such valves may be rather limited. Accordingly, obtaining a slit valve or gate valve that has a very small vertical clearance, e.g., a 2.5 mm clearance around the maximum cross-sectional area of a the wafer that will pass through the valve, may not be feasible since such small-aperture slit valves may not be commercially available. However, by placing a stationary plate with a horizontal slot, as described earlier herein, either in front of or behind the slit or gate valve may restrict the flow of buffer gas out of the load-lock to a greater extent than the slit or gate valve alone would be capable of.

Use in Non-EFEM Environments

Some or all of the present inventors also conceived of implementing one or more of the buffer gas microclimate systems discussed herein, e.g., systems such as the horizontal slot concepts and/or buffer gas distributors, in the context of EFEM-less semiconductor processing tools. Such systems may be of particular usefulness in the context of very large, multi-station semiconductor processing tools in which semiconductor wafers may transit large distances outside of the protection of an EFEM or FOUP. Such examples of such large, multi-station semiconductor processing tools may be so large that the interior volume of such tools, were they to have an enclosure around the wafer transfer area, would be so large that implementing a global buffer gas distribution system (similar to that shown in FIGS. 1 through 5 for an EFEM) would require massive amounts of buffer gas to be flowed through the enclosure in order to achieve desirably low concentrations of facility air within the enclosure; such buffer gas flows would, as discussed earlier, present serious cost and/or safety issues.

However, even if it is infeasible to flow buffer gas through the entire wafer transfer volume of such a semiconductor processing tool, the wafers that are handled by such a semiconductor processing tool may still be beneficially protected through the use of one or more of the various buffer gas microclimate systems discussed herein.

One example of a large, multi-station semiconductor processing tool is a multi-station cleaner or cleaning tool. In such a tool, a plurality of semiconductor processing chambers, e.g., cleaning chambers, may be positioned in different positions in three-dimensional space. A chassis or framework of some sort may support the semiconductor processing chambers at the different positions; this chassis or framework may be a spaceframe construction, and may or may not have panels or walls that enclose it.

Figure 60:
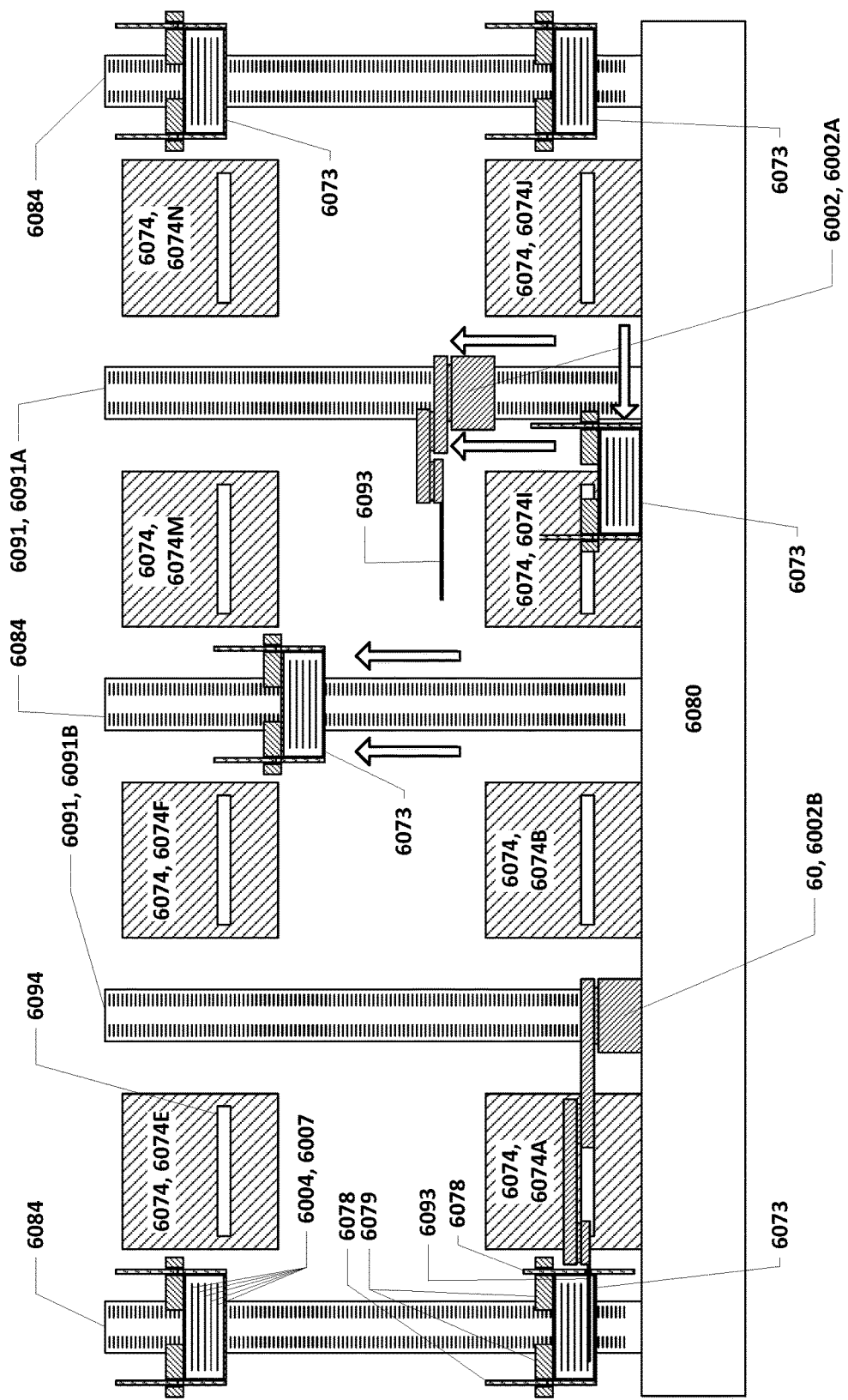
FIG. 60 depicts an example multi-station cleaning tool in side view.

In FIG. 60, a multi-station cleaning tool is shown in side view. The multi-station cleaning tool may have a base that includes a horizontal conveyor system 6080, such as tracks, a conveyor belt, or platforms driven by a linear actuator or drive, such as a ball screw, and may have vertical lift tracks or actuators located at various locations along its length to act as vertical conveyors 6084. There may also be a plurality of process chambers 6074, e.g., cleaning stations 6074A through 6074J, located along the long axis of the base. Such process chambers 6074 may, in some implementations, be arranged in two or more horizontal planes at different elevations, such as is shown in FIG. 60. Each process chamber 6074 may have a wafer load slot or port 6094 or other interface configured to receive a wafer 6004 prior to processing, or through which a processed wafer 6004 may be removed from the process chamber 6074 after processing.

Figure 61:
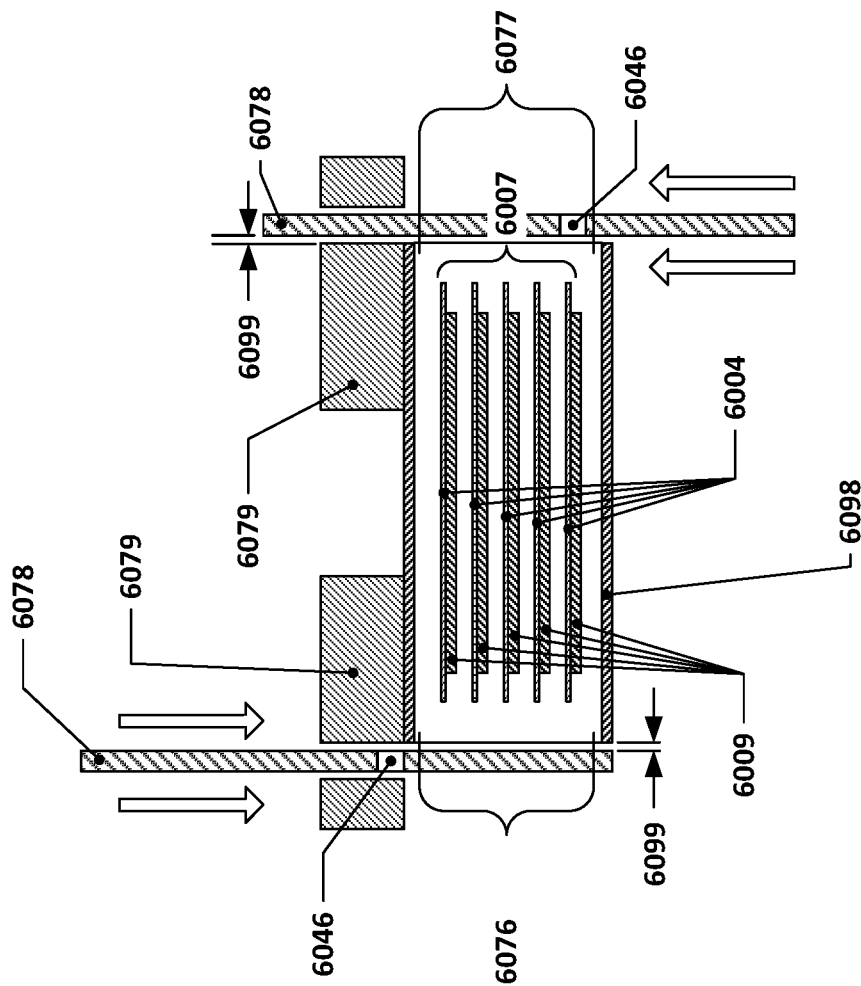
FIG. 61 depicts a cross-sectional view of an example multi-wafer cassette or pod.

Wafers 6004 may be transported through the tool in groups, e.g., in groups of five or ten, using multi-wafer pods or cassettes 6073. FIG. 61 shows a side section view of a multi-wafer cassette 6073. These multi-wafer cassettes or pods 6073 may include a housing 6098 that has, for example, multiple ledges or other wafer support features 6009 within it that may support the wafers 6004 in a stacked, spaced-apart arrangement 6007. Each multi-wafer cassette or pod 6073 may have one or more slot doors 6078, i.e., a sliding door 6078 that includes a horizontal slot 6046, that close off the open end or ends of the multi-wafer cassette or pod 6073, such as front opening 6076 and rear opening 6077. The slot doors 6078 may be connected with slot door actuators or drive mechanisms 6079 configured to slide the slot doors 6078 vertically so as to position the horizontal slot 6046 in locations corresponding with any of the wafer support positions within the multi-wafer pod or cassette 6073. The slot doors 6078 and their accompanying drive mechanisms 6079 may be referred to herein as slot door mechanisms. In some implementations, the slot door actuator may also include a motor or other drive system that may be used to actuate the slot door actuator. In other implementations, the motor or other drive system may be located in the tool and may mechanically interface with the slot door actuator when the multi-wafer pod or cassette 6073 is placed in a particular location or locations. In such implementations, the drive motor or motors would not travel with each multi-wafer pod or cassette 6073, but would instead by fixed in place or attached to other components, such as interfaces of the vertical conveyors 6084 that attach to the multi-wafer cassettes 6073 in order to lift them vertically. As can be seen, the horizontal slot 6046 in the slot door 6078 may be driven so as to be located in front of any of the wafer positions within the multi-wafer pod or cassette 6073 (the right-hand slot door 6078 is positioned to allow access to the lowest wafer position). In some implementations, the slot door 6078 may also be driven such that the horizontal slot 6046 does not overlap with any of the wafer positions, e.g., such as is shown with the left slot door 6078 in FIG. 61. In this case, the amount of buffer gas leakage may be reduced even further—such positioning may be particularly useful in situations when the mulit-wafer pod or cassette 6073 is being transported between different locations in the tool without the removal or insertion of wafers 6004 from or into the multi-wafer pod or cassette 6073.

The slot doors 6078 may generally be at least twice as long or high as the wafer stack 6007 height within the pod or cassette so as to ensure that non-slot portions of the slot doors close off the open ends of the pod or cassette facing the slot doors. For example, if there are N wafers 6004 in the wafer stack 6007 and they (or the wafer supports 6009 that support them) are spaced apart from any neighboring wafers 6004 in the wafer stack 6007 by an average distance d, the slot door 6078 may have a height (along the vertical axis) that is greater than (2·N−1)·d. Correspondingly, the horizontal slot 6046 may have a height that is, at a minimum, less than (N−1)·d; in most implementations, the horizontal slot may have a height, at least in the portions of the horizontal slot flanking a middle portion of the horizontal slot, of 2·d or less or d or less. For example, the horizontal slot may have a height of approximately 5 mm in the portions that flank the middle portion, which may be sufficient clearance for the wafer alone to pass through—the middle portion may have a clearance of ±2.5 mm from the upper and lower surfaces of the end effector/robot arm that pass through the horizontal slot. Each slot door 6078 may be positioned in front of one of the openings, e.g., the front opening 6076 or the rear opening 6077, so as to substantially close off that opening. This guidance generally applies to all of the slot door implementations discussed herein.

Thus, if buffer gas is introduced into the interior of the pod or cassette, most or all of the buffer gas will escape from the pod or cassette by either flowing through the narrow horizontal slot 6046 or by flowing around the edges of the slot door 6078 itself. Since the horizontal slot 6046 may be sized to be only slightly wider than the diameter of the wafer 6004, as well as sized vertically so as to reduce the slot height to a minimum or near-minimum while still allowing wafers to be inserted into and withdrawn from the multi-wafer pod or cassette 6073 using a robot arm 6002, the cross-sectional area of the horizontal slot 6046 may be significantly smaller than the cross-sectional area of the pod or cassette opening, e.g., front opening 6076 or rear opening 6077. The robot arms 6002, e.g., robot arms 6002A and 6002B, may be mounted to vertical robot conveyors 6091, e.g., vertical robot conveyors 6091A and 6091B, that may be used to move the robot arms 6002 up and down to access the multi-wafer cassettes 6073 at whatever vertical elevation they are at. As with various other implementations discussed herein, the slot door 6078 may be offset from the multi-wafer pod or cassette 6073 by a gap 6099 of one or several millimeters to provide operating clearance, thereby allowing the slot door 6078 to translate vertically without rubbing against any (or a reduced number of) facing surfaces. This reduces the potential for particulate contamination, but, at the same time, provides another leak path for buffer gas that is flowed into the multi-wafer pod or cassette 6073. Despite this, the amount of buffer gas that flows through the horizontal slot 6046 and the gap 6099 will still be smaller than if the buffer gas were to flow through the entire opening that is closed off by the slot door 6078. This allows a lower flow rate of buffer gas to be used, which decreases the amount of buffer gas that is needed—this is more economical, quieter, and safer than if larger flow rates of buffer gas were to be used.

Multiple multi-wafer cassettes or pods 6073 may be housed in the tool simultaneously, and each may be independently moved to different positions of the vertical conveyors 6084, and may also be independently moved in the horizontal direction to allow the multi-wafer pods or cassettes 6073 to be re-located to different vertical conveyors. The wafers 6004 in each multi-wafer cassette or pod 6073 may be removed from the multi-wafer cassettes or pods 6073 (or placed into the multi-wafer cassettes or pods 6073) by a wafer handling robot or robot arm 6002, which may have an end effector 6093 that may be able to reach inside the multi-wafer cassette or pod 6073 and withdraw or place a wafer 6004. The robot arms 6002 may also be configured to place or remove wafers 6004 into or from the process chambers 6074. In some implementations, a wafer handling robot or robot arm 6002 may be equipped to remove or place wafers 6004 from or into multi-wafer pods or cassettes 6073 on either side of the wafer handling robot or robot arm 6002; in such cases, the multi-wafer pods or cassettes 6073 may have both a front opening 6076 and a rear opening 6077, as well as slot door mechanisms for each such opening. In other implementations in which the wafers 6004 are only withdrawn from or placed into the multi-wafer cassettes 6073 from one side of the multi-wafer cassettes 6073, there may be only one opening and only one corresponding slot door mechanism for each multi-wafer cassette 6073.

As can be seen, each multi-wafer pod or cassette 6073 may act like a portable mini-environment—when buffer gas is flowed through each multi-wafer pod or cassette 6073, the buffer gas may escape the pod or cassette by flowing out of the slot in the slot door as well as through any gaps between the slot door and the pod or cassette. This buffer gas loss may, as discussed earlier, be at a considerably lower rate than would be the case if the slot doors were not used. The buffer gas may be provided to each pod or cassette by way of a flexible hose or hoses (not shown) connected to a fitting or fittings on the pod or cassette, or by way of a buffer gas delivery system integrated into the vertical or horizontal pod/cassette positioning system, e.g., by way of a gas port or ports in the vertical lift tracks that align with corresponding gas ports in the pod or cassette when the pod or cassette is positioned at a particular location or locations.

As discussed, FIG. 61 depicts a close-up of the pods or cassettes of FIG. 60. As can be seen, the multi-wafer pod or cassette 6073 may have one or more wafers 6004 stored within it. In this case, five wafers 6004 are stored within the multi-wafer pod or cassette 6073, although more or fewer wafers 6004 may be stored in such a manner, depending on the size of the multi-wafer pod or cassette 6073. The walls of the multi-wafer pod or cassette 6073 may have ledges, e.g., wafer support features 6009, configured to support the wafers within the multi-wafer pod or cassette 6073. Alternatively, the multi-wafer pods or cassettes 6073 may have corner-located posts with ledges protruding towards the center of the pods or cassettes; the posts may be spaced apart from one another so as to allow the wafers to pass between the posts in multiple directions, e.g., along an X-axis, along a Y-axis, or along both the X- and Y-axes.

Figure 62:
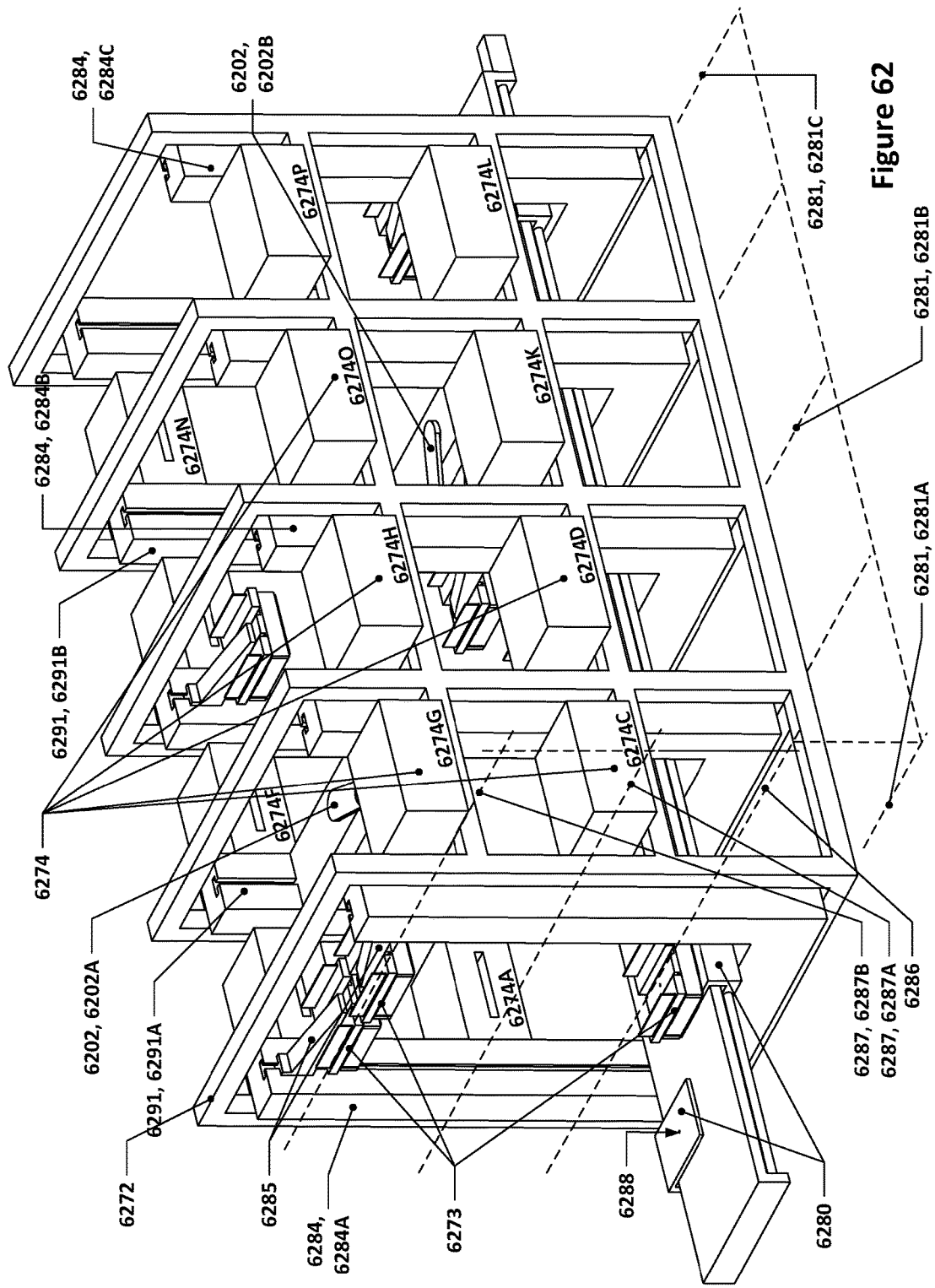
FIG. 62 depicts an isometric view of an example multi-station semiconductor processing tool.
Figure 63:
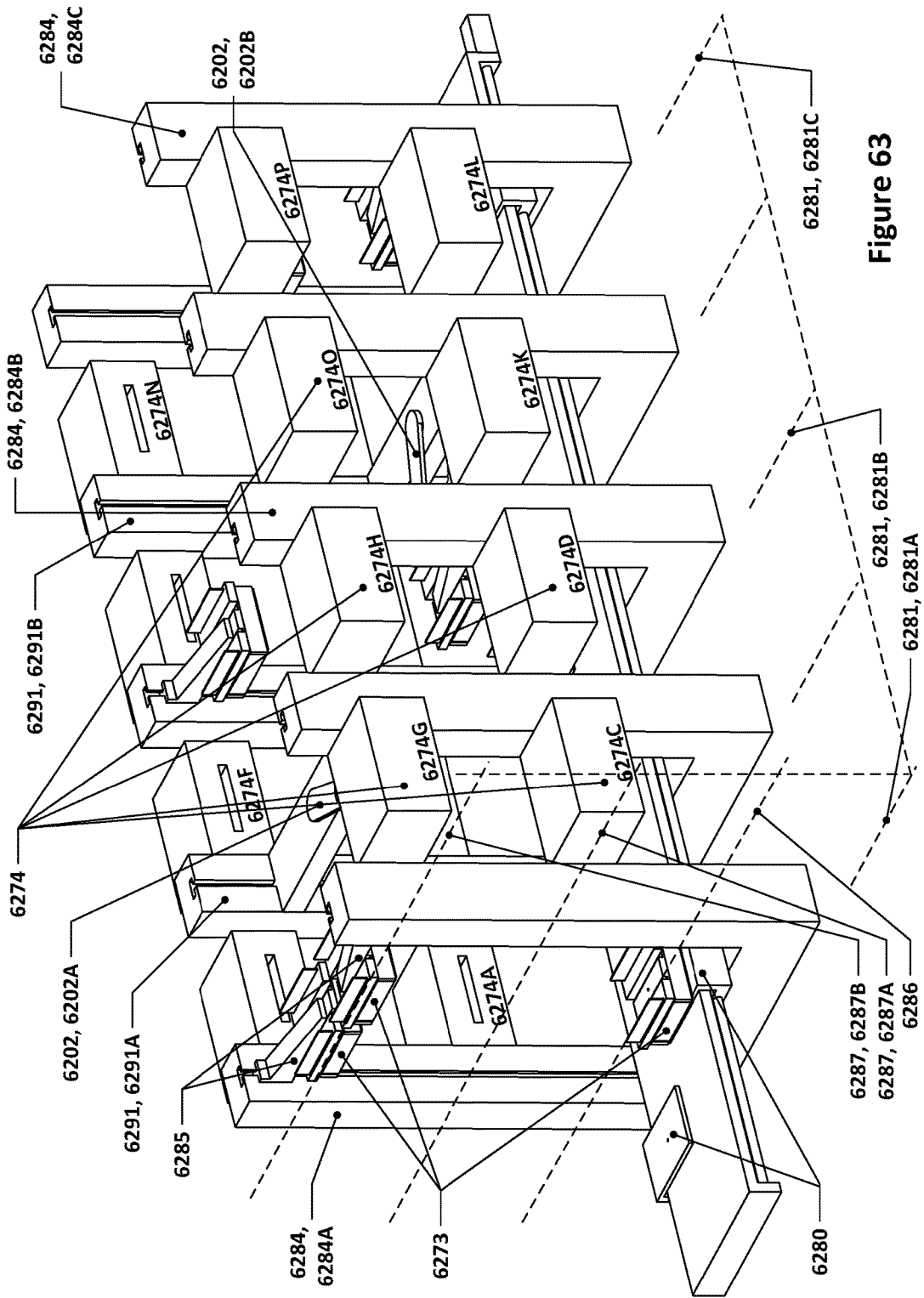
FIG. 63 depicts another isometric view of the example multi-station semiconductor processing tool of FIG. 62.
Figure 64:
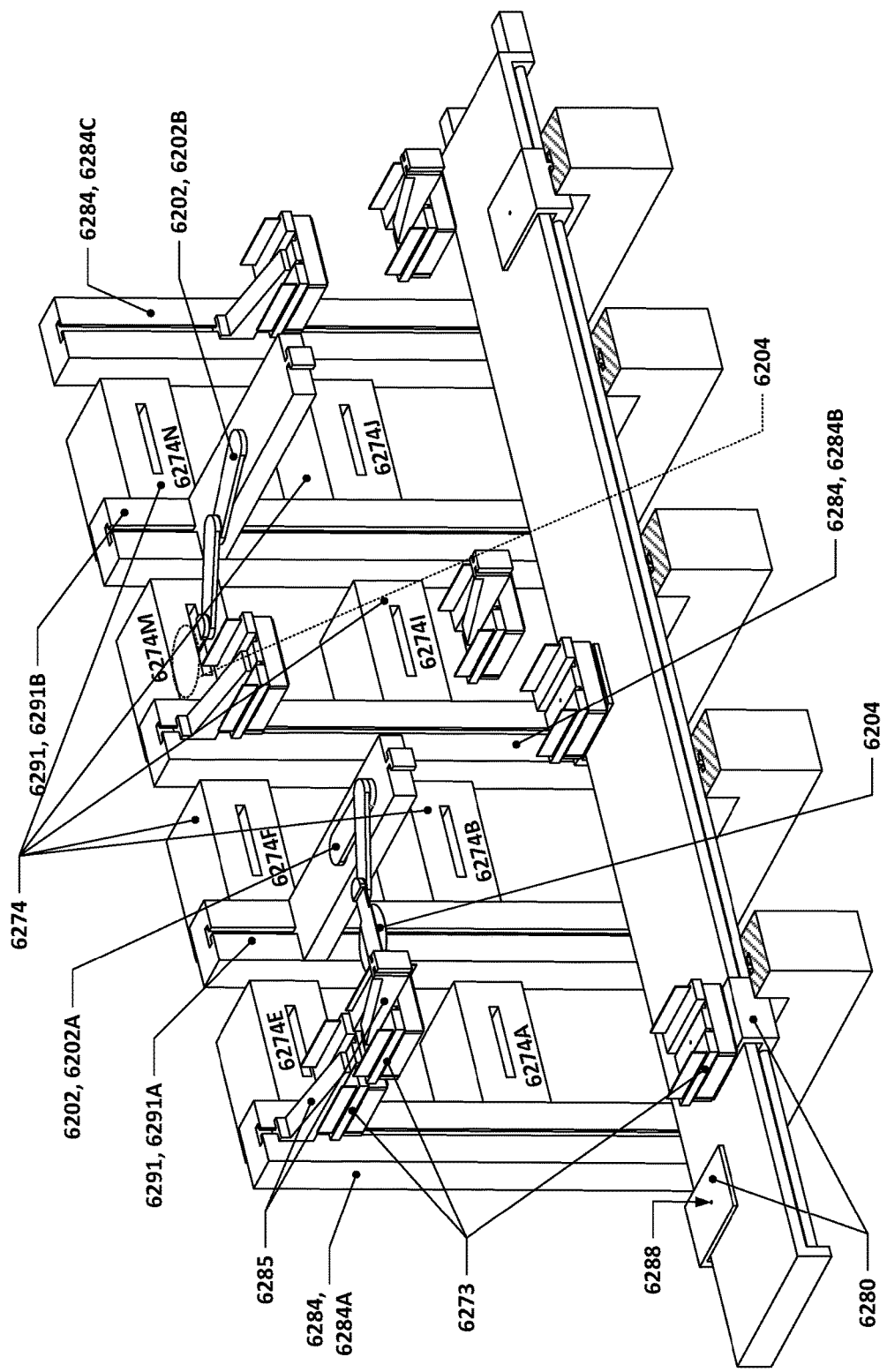
FIG. 64 depicts a further isometric view of the example multi-station semiconductor processing tool of FIG. 62.

FIGS. 62 through 68 show various views of another multi-station semiconductor processing tool or portions thereof. As can be seen in FIG. 62, a multi-station semiconductor processing tool may have a chassis 6272, which may support a plurality of semiconductor processing chambers 6274. FIG. 63 is the same as FIG. 62, but with the chassis 6272 removed for additional clarity. FIG. 64 is a cutaway version of FIG. 63 in which various components have been cut away; these components are the vertical robot arm conveyors 6291 and the vertical wafer cassette conveyors 6284 (the cut planes for these components are cross-hatched). In this example, there are sixteen semiconductor processing chambers 6274A through 6274P arranged in a 2×2×8 rectangular array (where, in A×B×C, A=number of chambers in a first horizontal direction, B=number of chambers in a second, orthogonal horizontal direction, and C=number of chambers in a vertical direction). Such semiconductor processing tools may include other configurations and numbers of semiconductor processing chambers, depending on the particular configuration. For example, such tools may include 2×2×1 arrays, 2×1×2 arrays, 2×2×2 arrays, 2×4×1 arrays, 2×4×2 arrays (as depicted), or any other multi-chamber arrays.

The multi-station semiconductor processing tool may have a horizontal wafer cassette conveyor 6280. In this example, the horizontal wafer cassette conveyor 6280 may be provided by a plurality of platforms that may be translated along the horizontal axis by, for example, ball screws or other linear drive elements. Each platform may have features designed to interface with features on a multi-wafer cassette 6273 to allow the multi-wafer cassette 6273 to be carried by the platforms. The horizontal wafer cassette conveyor 6280 may be configured to transport the multi-wafer cassettes 6273 between a plurality of horizontal locations 6281, such as first horizontal location 6281A, second horizontal location 6281B, and third horizontal location 6281C, each of which may align a multi-wafer cassette 6273 with a vertical wafer cassette conveyor 6284, e.g., vertical wafer cassette conveyor 6284A, 6284B, and 6284C. Each vertical wafer cassette conveyor 6284 may have a mechanical interface 6285 that may latch onto a multi-wafer cassette 6273 that is located in one of the horizontal locations 6281 that corresponds with that vertical wafer cassette conveyor 6284 when the multi-wafer cassette 6273 is supported by the horizontal wafer cassette conveyor 6280 at a baseline vertical location 6286. The mechanical interfaces 6285, and any multi-wafer cassettes 6273 that the mechanical interfaces 6285 are latched onto, may be lifted by their respective vertical wafer cassette conveyors 6284 to different vertical locations 6287, e.g., first vertical cassette location 6287A and second vertical cassette location 6287B.

The multi-station semiconductor processing tool may also include one or more robot arms 6202, such as robot arm 6202A and robot arm 6202B, which may be mounted to corresponding vertical robot arm conveyors 6291A and 6291B. In some implementations, each robot arm 6202 may be positioned between two of the horizontal locations 6281. For example, in the depicted implementation, the robot arm 6202A may be positioned between the first horizontal location 6281A and the second horizontal location 6281B, and the robot arm 6202B may be positioned between the second horizontal location 6281B and the third horizontal location 6281C. The vertical robot arm conveyors 6291 may be configured to move the robot arms 6202 between vertical robot arm locations 6292, e.g., between the first vertical robot arm location 6292A and the second vertical robot arm location 6292B. When in the first vertical robot arm location 6292A, the first robot arm 6202A may be able to access semiconductor wafers 6204 in a multi-wafer cassette 6273 that is positioned in the first vertical cassette location 6287A and also in the first or second horizontal locations 6281A or 6281B and then transfer those wafers to the semiconductor processing chambers 6274A through 6274D. Correspondingly, when in the second vertical robot arm location 6292B, the first robot arm 6202A may be able to access semiconductor wafers 6204 in a multi-wafer cassette 6273 that is positioned in the second vertical cassette location 6287B and also in the first or second horizontal locations 6281A or 6281B and then transfer those wafers to the semiconductor processing chambers 6274E through 6274H. It is to be understood that the vertical cassette locations 6287 and the vertical robot arm locations 6292 do not necessarily refer to fixed locations, but may refer to ranges of locations. For example, when a multi-wafer cassette and a robot arm are positioned at corresponding vertical locations, it may be necessary to move the robot arm by small amounts vertically relative to the multi-wafer cassette in order to access the wafers 6204 that are at different elevations in the wafer stack 6207. Alternatively or additionally, the multi-wafer cassette may be moved by such small vertical amounts in order to bring a particular wafer in the wafer stack 6207 into alignment with the end effector of the robot arm 6202 to allow the robot arm 6202 to remove or insert the wafer 6204. Accordingly, the terms "vertical cassette location" 6287 and "vertical robot arm location" 6292 are to be understood as referring to a particular vertical location +/− the height of the wafer stack 6207.

Similarly, when in the first vertical robot arm location 6292A, the second robot arm 6202B may be able to access semiconductor wafers 6204 in a multi-wafer cassette 6273 that is positioned in the first vertical cassette location 6287A and also in the second or third horizontal locations 6281B or 6281C and then transfer those wafers to the semiconductor processing chambers 6274I through 6274L. Correspondingly, when in the second vertical robot arm location 6292B, the second robot arm 6202B may be able to access semiconductor wafers 6204 in a multi-wafer cassette 6273 that is positioned in the second vertical cassette location 6287B and also in the second or third horizontal locations 6281B or 6281C and then transfer those wafers to the semiconductor processing chambers 6274M through 6274P. The multi-wafer cassettes 6273 may serve as multi-wafer storage systems that may be shuttled through the multi-station semiconductor processing tool in order to allow the wafers contained therein to be transferred to and from various ones of the semiconductor processing chambers.

The multi-wafer cassettes 6273 may be configured to have buffer gas flowed through them. For example, the multi-wafer cassettes 6273 may have one or more buffer gas inlets 6289 (see FIGS. 65 and 66) that may interface with buffer gas ports, e.g., buffer gas port 6288 or corresponding buffer gas ports on the undersides of the mechanical interfaces 6285. When a multi-wafer cassette 6273 is docked on one of the platforms of the horizontal wafer cassette conveyor 6280, buffer gas may be provided to the multi-wafer cassette 6273 via the buffer gas port 6288 and the buffer gas inlet

6289. Correspondingly, when the multi-wafer cassette 6273 is latched onto a mechanical interface 6285, the multi-wafer cassette 6273 may be provided buffer gas through a buffer gas port located in the mechanical interface 6285 and a buffer gas inlet 6289 that interfaces with the buffer gas port in the mechanical interface 6285. Thus, buffer gas may be supplied to the multi-wafer cassette 6273 in any location within the multi-station semiconductor processing tool, thereby allowing the wafers contained within the multi-wafer cassette 6273 to be surrounded by buffer gas and at least somewhat protected from the ambient facility air by the buffer gas.

FIGS. 65 and 66 are views of one of the multi-wafer cassettes 6273; FIG. 65 shows the upper side of the multi-wafer cassette 6273, and FIG. 66 shows the underside of the multi-wafer cassette 6273. The multi-wafer cassette 6273 may have slot-door mechanisms, each with a drive mechanism 6279 and a door 6278 with a horizontal slot 6246. One slot-door mechanism may be positioned such that the corresponding door 6278 is positioned in front of a front opening of the multi-wafer cassette 6273; the other slot-door mechanism may be positioned such that the corresponding door 6278 is positioned in front of a rear opening of the multi-wafer cassette 6273. The multi-wafer cassette 6273 may have buffer gas inlets 6289. The bottom buffer gas inlet 6289 may interface with one of the buffer gas ports 6288 located on the horizontal wafer cassette conveyor 6280; the upper gas inlet 6289 may interface with a buffer gas port located on one of the mechanical interfaces 6285.

FIGS. 67 and 68 depict cutaway views of the multi-wafer cassette 6273 of FIG. 65. In FIG. 67, one side of the multi-wafer cassette 6273 has been removed (the cut surfaces are shown with different types of cross-hatching). As is visible in FIG. 67, a plenum 62101 is located within each side wall of the multi-wafer cassette 6273; the plenum 62101 is interposed between the front and rear openings of the multi-wafer cassette 6273, and may be provided with buffer gas by way of distribution passages 62102, which are each connected with a different one of the buffer gas inlets 6289. The buffer gas inlets 6289 may each be equipped with a one-way valve, e.g., a check-valve, that allows buffer gas to flow into the distribution passages 62102 through the buffer gas inlets 6289, but which may prevent buffer gas flow in the reverse direction. Thus, buffer gas may be introduced into the plenums 62101 through either buffer gas inlet 6289 even when the other buffer gas inlet 6289 is not connected with a buffer gas source. The plenums 62101 may have a plurality of distribution ports 62100 that may be arranged in an array that allows buffer gas to be flowed into each inter-wafer gap between wafers 6204 in the multi-wafer cassette 6273. Of course, in implementations in which the multi-wafer cassettes are not purged with buffer gas, e.g., systems in which only a buffer gas distributor 6205 are used, such features may be omitted.

Figure 69:
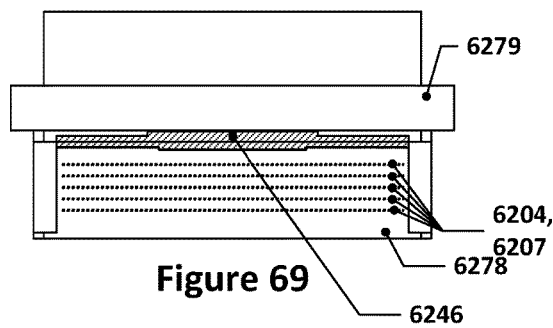
FIGS. 69 through 74 depict front views of the example multi-wafer cassette of FIG. 65 with the door in different positions.
Figure 72:
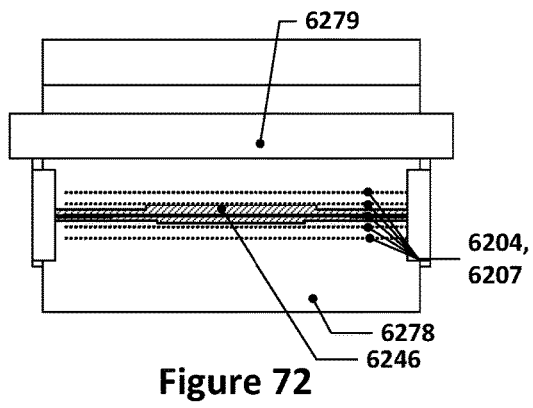
Figure 70:
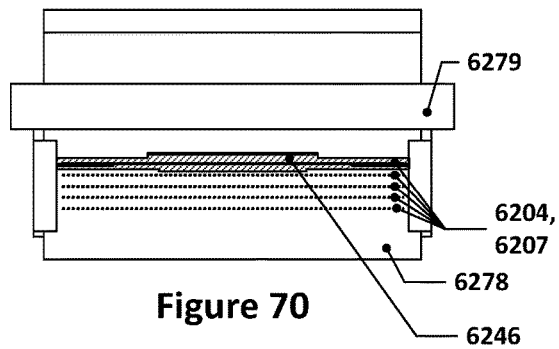
Figure 73:
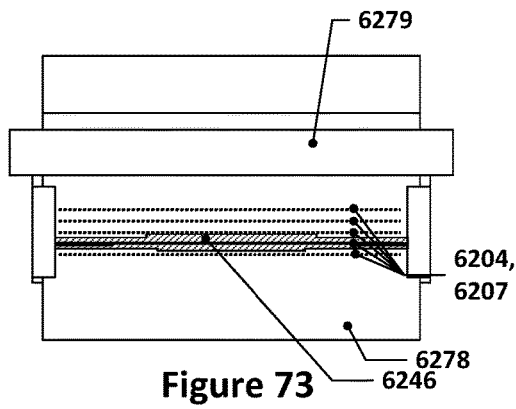
Figure 71:
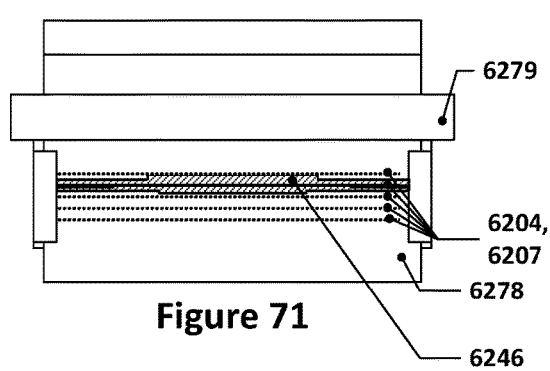
Figure 74:
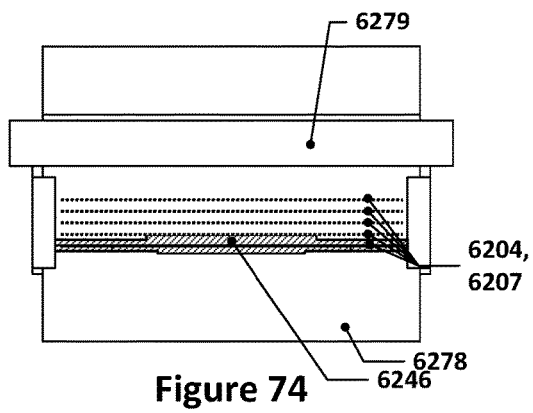

FIGS. 69 through 74 depict front views of a multi-wafer cassette 6273 with the door 6278 in various positions. In FIG. 69, the door 6278 is in a raised position such that the slot 6246 is not aligned with any of the wafers 6204 in the wafer stack 6207. This positioning of the door 6278 may be used when no wafers are being transferred into or out of the multi-wafer cassette 6273. Each of FIGS. 70 through 74 shows the door 6278 positioned so as to align with a different one of the wafers 6204 in the wafer stack 6207.

In practice, the multi-station semiconductor processing tool may be implemented with multi-wafer cassettes 6273 having slot door mechanisms, as shown in FIGS. 65 through 74. The multi-station semiconductor processing tool may also utilize robot arms 6202 with buffer gas distributors 6205, which may be any of the buffer gas distributors discussed herein. In some implementations, only one of these buffer gas microclimate systems may be used, although the dual approach may provide increased buffer gas protection in all locations within the multi-station semiconductor processing tool. In some implementations, one or both ends of the horizontal wafer cassette conveyor may lead to an EFEM with a buffer gas environment similar to other implementations discussed herein. It is also to be understood that multi-station tools such as the multi-station tools discussed above may also be enclosed or semi-enclosed, and buffer gas may also be flowed through the entire tool, similar to how such buffer gas is flowed through the EFEMs discussed earlier herein.

It is also to be understood that a further variant of the slot door concepts discussed herein may involve a horizontal slot with an even further reduced vertical height. In such systems, the door with the horizontal slot may be controlled by a controller, e.g., one or more processors and a memory storing computer-executable instructions for controlling the one or more processors to perform various actions, so as to move in tandem with the vertical movements of the end effector during wafer placement or retrieval through the horizontal slot. Thus, the horizontal slot does not need to incorporate additional height that would ordinarily be necessary to accommodate the small vertical movements that a robot arm may make during picking and placing of a wafer.

Various modifications to the implementations described in this disclosure may be readily apparent to those having ordinary skill in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein.

As is readily apparent from the above discussion, certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

It will be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of this disclosure.

What is claimed is:
1. An apparatus comprising:
   a plurality of wafer processing chambers positioned in different locations;

a chassis that supports the wafer processing chambers at the different locations;

one or more multi-wafer cassettes, each multi-wafer cassette having N wafer support structures arranged in an array along a vertical axis, wherein the wafer support structures are sized to support semiconductor wafers of diameter D, N is an integer greater than 1, and each semiconductor wafer support structure is spaced apart from any adjacent wafer support structure or wafer support structures in the array by an average distance d;

one or more robot arms each having an end effector configured to support a semiconductor wafer during movement of that robot arm, wherein the one or more robot arms are configured to transfer semiconductor wafers from and to the one or more multi-wafer cassettes to the plurality of wafer processing chambers; and at least one buffer gas microclimate system including at least one slot-door mechanism that is part of each of the one or more multi-wafer cassettes, wherein each slot-door mechanism includes a door in the form of a plate with a horizontal slot having a width greater than D and a height less than $(N-1) \cdot d$.

2. The apparatus of claim 1, wherein:

each multi-wafer cassette has a front opening sized to allow wafers to be inserted into or withdrawn from the multi-wafer cassette;

each slot-door mechanism includes
a drive mechanism configured to translate, responsive to a mechanical input, the door vertically relative to the wafer support structures of the multi-wafer cassette of which that door is a part;

each door has a height greater than $(2 \cdot N-1) \cdot d$; and each door is positioned in front of the front opening of the multi-wafer cassette of which that door is a part.

3. The apparatus of claim 1, wherein the at least one buffer gas microclimate system further includes one or more buffer gas distributors configured to flow buffer gas across facing surfaces of the semiconductor wafers supported by the one or more end effectors, wherein:

each of the one or more buffer gas distributors is associated with a different one of the one or more end effectors, each buffer gas distributor is configured to move in tandem with the associated end effector during at least some movements of the robot arm of which the associated end effector is a part, each buffer gas distributor and associated end effector are spaced apart such that that buffer gas distributor and associated end effector are insertable into a stack of N semiconductor wafers supported by the N wafer support structures when the N semiconductor wafers are supported by the N wafer support structures, and each buffer gas distributor and associated end effector are each sized to fit within inter-wafer gaps in the stack of N semiconductor wafers.

4. The apparatus of claim 2, further comprising a horizontal wafer cassette conveyor configured to receive at least one of the one or more multi-wafer cassettes and translate the received at least one of the one or more multi-wafer cassettes between horizontal locations along a horizontal axis, wherein:

the wafer processing chambers are positioned in spaced-apart locations on either side of the horizontal wafer cassette conveyor, and a first robot arm of the one or more robot arms is configured to transport semiconductor wafers between a first multi-wafer cassette of the one or more multi-wafer cassettes and a first wafer processing chamber of the wafer processing chambers, a second wafer processing chamber of the wafer processing chambers, a third wafer processing chamber of the wafer processing chambers, and a fourth wafer processing chamber of the wafer processing chambers when the first multi-wafer cassette is at least positioned in a first horizontal location of the horizontal locations, the first wafer processing chamber and the second wafer processing chamber are located on a first side of the horizontal wafer cassette conveyor, the third wafer processing chamber and the fourth wafer processing chamber are located on a second side of the horizontal wafer cassette conveyor, and the first side of the horizontal wafer cassette conveyor is on an opposite side of the horizontal wafer cassette conveyor from the second side of the horizontal wafer cassette conveyor.

5. The apparatus of claim 4, further comprising one or more vertical wafer cassette conveyors, wherein:

each vertical wafer cassette conveyor is associated with a different one of the horizontal locations;

a first vertical wafer cassette conveyor of the one or more vertical wafer cassette conveyors is associated with the first horizontal location;

each vertical wafer cassette conveyor includes one or more mechanical interfaces;

each mechanical interface of each vertical wafer cassette conveyor is configured to interface with a multi-wafer cassette of the one or more multi-wafer cassettes when that mechanical interface is vertically aligned with that multi-wafer cassette and that multi-wafer cassette is positioned in the horizontal location associated with that vertical wafer cassette conveyor and is supported by the horizontal wafer cassette conveyor in a baseline vertical location;

each vertical wafer cassette conveyor is configured to translate the one or more mechanical interfaces included in that vertical wafer cassette conveyor, and each multi-wafer cassette with which those one or more mechanical interfaces are interfaced, along a vertical axis to one or more vertical cassette locations;

the vertical cassette locations are not located at the same elevation as the baseline vertical location; and the first robot arm is configured to transport semiconductor wafers between the first multi-wafer cassette and the first wafer processing chamber, the second wafer processing chamber, the third wafer processing chamber, and the fourth wafer processing chamber when the first multi-wafer cassette is positioned in the first horizontal location and is also positioned in a first vertical cassette location of the one or more vertical cassette locations by the first vertical wafer cassette conveyor.

6. The apparatus of claim 5, wherein:

each mechanical interface includes at least one buffer gas port, each multi-wafer cassette includes at least one buffer gas inlet, and the at least one buffer gas inlet of each multi-wafer cassette aligns with the at least one buffer gas port of each mechanical interface when that multi-wafer cassette is interfaced with that mechanical interface, thereby allowing buffer gas to be introduced to an interior volume of that multi-wafer cassette via that at least one buffer gas port and at least one buffer gas inlet.

7. The apparatus of claim 5, wherein:
a second vertical wafer cassette conveyor of the one or more vertical wafer cassette conveyors is associated with a second horizontal location of the horizontal locations;
the first robot arm is interposed between the first horizontal location and the second horizontal location;
each multi-wafer cassette also includes a rear opening that is also sized to allow semiconductor wafers to be inserted into or withdrawn from that multi-wafer cassette and that is opposite the front opening of that multi-wafer cassette;
the at least one slot-door mechanism that is part of each of the one or more multi-wafer cassettes includes, for each multi-wafer cassette, a second slot-door mechanism;
the door of each second slot-door mechanism is positioned in front of the rear opening of the multi-wafer cassette of which that second slot-door mechanism is a part;
the first robot arm is also configured to transport semiconductor wafers between a second multi-wafer cassette and the first wafer processing chamber, the second wafer processing chamber, the third wafer processing chamber, and the fourth wafer processing chamber when the second multi-wafer cassette is positioned in the second horizontal location and in the first vertical cassette location by the second vertical wafer cassette conveyor; and
the second multi-wafer cassette is one of the one or more multi-wafer cassettes.

8. The apparatus of claim 7, further comprising:
one or more vertical robot arm conveyors;
a fifth wafer processing chamber of the wafer processing chambers;
a sixth wafer processing chamber of the wafer processing chambers;
a seventh wafer processing chamber of the wafer processing chambers; and
an eighth wafer processing chamber of the wafer processing chambers, wherein:
the fifth wafer processing chamber, the sixth wafer processing chamber, the seventh wafer processing chamber, and the eighth wafer processing chamber are located above the first wafer processing chamber, the second wafer processing chamber, the third wafer processing chamber, and the fourth wafer processing chamber,
each of the one or more vertical robot arm conveyors is interposed between neighboring vertical wafer cassette conveyors,
each vertical robot arm conveyor is configured to translate a corresponding one of the one or more robot arms along the vertical axis to one or more vertical robot arm locations,
a first vertical robot arm location of the one or more vertical robot arm locations is associated with the first vertical cassette location,
a second vertical robot arm location of the one or more vertical robot arm locations is associated with a second vertical cassette location of the one or more vertical cassette locations different from the first vertical cassette location,
the first robot arm is configured to transport semiconductor wafers between the first multi-wafer cassette and the first wafer processing chamber, the second wafer processing chamber, the third wafer processing chamber, and the fourth wafer processing chamber when the first multi-wafer cassette is positioned in the first horizontal location and the first vertical cassette location and the first robot arm is positioned at the first vertical robot arm location, and
the first robot arm is further configured to transport semiconductor wafers between the first multi-wafer cassette and the fifth wafer processing chamber, the sixth wafer processing chamber, the seventh wafer processing chamber, and the eighth wafer processing chamber when the first multi-wafer cassette is positioned in the first horizontal location and the second vertical cassette location and the first robot arm is positioned at the second vertical robot arm location.

9. The apparatus of claim 8, further comprising:
a ninth wafer processing chamber of the wafer processing chambers;
a tenth wafer processing chamber of the wafer processing chambers;
an eleventh wafer processing chamber of the wafer processing chambers;
a twelfth wafer processing chamber of the wafer processing chambers;
a thirteenth wafer processing chamber of the wafer processing chambers;
a fourteenth wafer processing chamber of the wafer processing chambers;
a fifteenth wafer processing chamber of the wafer processing chambers; and
a sixteenth wafer processing chamber of the wafer processing chambers, wherein:
the ninth wafer processing chamber, tenth wafer processing chamber, thirteenth wafer processing chamber, and fourteenth wafer processing chamber are located on the first side of the horizontal wafer cassette conveyor,
the eleventh wafer processing chamber, twelfth wafer processing chamber, fifteenth wafer processing chamber, and sixteenth wafer processing chamber are located on the second side of the horizontal wafer cassette conveyor,
the thirteenth wafer processing chamber, the fourteenth wafer processing chamber, the fifteenth wafer processing chamber, and the sixteenth wafer processing chamber are located above the ninth wafer processing chamber, the tenth wafer processing chamber, the eleventh wafer processing chamber, and the twelfth wafer processing chamber,
the second horizontal location is interposed between the first robot arm and a second robot arm of the one or more robot arms,
the second robot arm is configured to transport semiconductor wafers between the second multi-wafer cassette and the ninth wafer processing chamber, the tenth wafer processing chamber, the eleventh wafer processing chamber, and the twelfth wafer processing chamber when the second multi-wafer cassette is positioned in the second horizontal location and the first vertical cassette location and the second robot arm is positioned at the first vertical robot arm location, and
the second robot arm is further configured to transport semiconductor wafers between the second multi-wafer cassette and the thirteenth wafer processing chamber, the fourteenth wafer processing chamber, the fifteenth wafer processing chamber, and the sixteenth wafer processing chamber when the second multi-wafer cassette is positioned in the second horizontal location and the second vertical cassette location and the second robot arm is positioned at the second vertical robot arm location.

10. The apparatus of claim 9, wherein the at least one buffer gas microclimate system further includes the one or more buffer gas distributors configured to flow buffer gas across facing surfaces of the semiconductor wafers supported by the one or more end effectors, wherein:
   each of the one or more buffer gas distributors is associated with a different one of the one or more end effectors,
   each buffer gas distributor is configured to move in tandem with the associated end effector during at least some movements of the robot arm of which the associated end effector is a part,
   each buffer gas distributor and associated end effector are spaced apart such that that buffer gas distributor and associated end effector are insertable into a stack of N semiconductor wafers supported by the N wafer support structures when the N semiconductor wafers are supported by the N wafer support structures, and
   each buffer gas distributor and associated end effector are each sized to fit within inter-wafer gaps in the stack of N semiconductor wafers.

11. The apparatus of claim 3, further comprising a horizontal wafer cassette conveyor configured to receive at least one of the one or more multi-wafer cassettes and translate the received at least one of the one or more multi-wafer cassettes between horizontal locations along a horizontal axis, wherein:
   the wafer processing chambers are positioned in spaced-apart locations on either side of the horizontal wafer cassette conveyor,
   a first robot arm of the one or more robot arms is configured to transport semiconductor wafers between a first multi-wafer cassette of the one or more multi-wafer cassettes and a first wafer processing chamber of the wafer processing chambers, a second wafer processing chamber of the wafer processing chambers, a third wafer processing chamber of the wafer processing chambers, and a fourth wafer processing chamber of the wafer processing chambers when the first multi-wafer cassette is at least positioned in a first horizontal location of the horizontal locations,
   the first robot arm is associated with a first buffer gas distributor of the one or more buffer gas distributors,
   the first wafer processing chamber and the second wafer processing chamber are located on a first side of the horizontal wafer cassette conveyor,
   the third wafer processing chamber and the fourth wafer processing chamber are located on a second side of the horizontal wafer cassette conveyor, and
   the first side of the horizontal wafer cassette conveyor is on an opposite side of the horizontal wafer cassette conveyor from the second side of the horizontal wafer cassette conveyor.

12. The apparatus of claim 11, further comprising one or more vertical wafer cassette conveyors, wherein:
   each vertical wafer cassette conveyor is associated with a different one of the horizontal locations;
   a first vertical wafer cassette conveyor of the one or more vertical wafer cassette conveyors is associated with the first horizontal location;
   each vertical wafer cassette conveyor includes one or more mechanical interfaces;
   each mechanical interface of each vertical wafer cassette conveyor is configured to interface with a multi-wafer cassette of the one or more multi-wafer cassettes when that mechanical interface is vertically aligned with that multi-wafer cassette and that multi-wafer cassette is positioned in the horizontal location associated with that vertical wafer cassette conveyor and is supported by the horizontal wafer cassette conveyor in a baseline vertical location;
   each vertical wafer cassette conveyor is configured to translate the one or more mechanical interfaces included in that vertical wafer cassette conveyor, and each multi-wafer cassette with which those one or more mechanical interfaces are interfaced, along a vertical axis to one or more vertical cassette locations;
   the vertical cassette locations are not located at the same elevation as the baseline vertical location; and
   the first robot arm is configured to transport semiconductor wafers between the first multi-wafer cassette and the first wafer processing chamber, the second wafer processing chamber, the third wafer processing chamber, and the fourth wafer processing chamber when the first multi-wafer cassette is positioned in the first horizontal location and is also positioned in a first vertical cassette location of the one or more vertical cassette locations by the first vertical wafer cassette conveyor.

13. The apparatus of claim 12, wherein:
   each mechanical interface includes at least one buffer gas port,
   each multi-wafer cassette includes at least one buffer gas inlet, and
   the at least one buffer gas inlet of each multi-wafer cassette aligns with the at least one buffer gas port of each mechanical interface when that multi-wafer cassette is interfaced with that mechanical interface, thereby allowing buffer gas to be introduced to an interior volume of that multi-wafer cassette via that at least one buffer gas port and at least one buffer gas inlet.

14. The apparatus of claim 12, wherein:
   a second vertical wafer cassette conveyor of the one or more vertical wafer cassette conveyors is associated with a second horizontal location of the horizontal locations;
   the first robot arm is interposed between the first horizontal location and the second horizontal location;
   each multi-wafer cassette also includes a rear opening that is also sized to allow semiconductor wafers to be inserted into or withdrawn from that multi-wafer cassette and that is opposite a front opening of that multi-wafer cassette;
   the first robot arm is also configured to transport semiconductor wafers between a second multi-wafer cassette and the first wafer processing chamber, the second wafer processing chamber, the third wafer processing chamber, and the fourth wafer processing chamber when the second multi-wafer cassette is positioned in the second horizontal location and in the first vertical cassette location by the second vertical wafer cassette conveyor; and
   the second multi-wafer cassette is one of the one or more multi-wafer cassettes.

15. The apparatus of claim 14, further comprising:
   one or more vertical robot arm conveyors;
   a fifth wafer processing chamber of the wafer processing chambers;
   a sixth wafer processing chamber of the wafer processing chambers;

a seventh wafer processing chamber of the wafer processing chambers; and
an eighth wafer processing chamber of the wafer processing chambers, wherein:
  the fifth wafer processing chamber, the sixth wafer processing chamber, the seventh wafer processing chamber, and the eighth wafer processing chamber are located above the first wafer processing chamber, the second wafer processing chamber, the third wafer processing chamber, and the fourth wafer processing chamber,
  each of the one or more vertical robot arm conveyors is interposed between neighboring vertical wafer cassette conveyors,
  each vertical robot arm conveyor is configured to translate a corresponding one of the one or more robot arms along the vertical axis to one or more vertical robot arm locations,
  a first vertical robot arm location of the one or more vertical robot arm locations is associated with the first vertical cassette location,
  a second vertical robot arm location of the one or more vertical robot arm locations is associated with a second vertical cassette location of the one or more vertical cassette locations different from the first vertical cassette location,
  the first robot arm is configured to transport semiconductor wafers between the first multi-wafer cassette and the first wafer processing chamber, the second wafer processing chamber, the third wafer processing chamber, and the fourth wafer processing chamber when the first multi-wafer cassette is positioned in the first horizontal location and the first vertical cassette location and the first robot arm is positioned at the first vertical robot arm location, and
  the first robot arm is further configured to transport semiconductor wafers between the first multi-wafer cassette and the fifth wafer processing chamber, the sixth wafer processing chamber, the seventh wafer processing chamber, and the eighth wafer processing chamber when the first multi-wafer cassette is positioned in the first horizontal location and the second vertical cassette location and the first robot arm is positioned at the second vertical robot arm location.

16. The apparatus of claim 15, further comprising:
a ninth wafer processing chamber of the wafer processing chambers;
a tenth wafer processing chamber of the wafer processing chambers;
an eleventh wafer processing chamber of the wafer processing chambers;
a twelfth wafer processing chamber of the wafer processing chambers;
a thirteenth wafer processing chamber of the wafer processing chambers;
a fourteenth wafer processing chamber of the wafer processing chambers;
a fifteenth wafer processing chamber of the wafer processing chambers; and
a sixteenth wafer processing chamber of the wafer processing chambers, wherein:
  the ninth wafer processing chamber, tenth wafer processing chamber, thirteenth wafer processing chamber, and fourteenth wafer processing chamber are located on the first side of the horizontal wafer cassette conveyor,
  the eleventh wafer processing chamber, twelfth wafer processing chamber, fifteenth wafer processing chamber, and sixteenth wafer processing chamber are located on the second side of the horizontal wafer cassette conveyor,
  the thirteenth wafer processing chamber, the fourteenth wafer processing chamber, the fifteenth wafer processing chamber, and the sixteenth wafer processing chamber are located above the ninth wafer processing chamber, the tenth wafer processing chamber, the eleventh wafer processing chamber, and the twelfth wafer processing chamber,
  the second horizontal location is interposed between the first robot arm and a second robot arm of the one or more robot arms,
  the second robot arm is configured to transport semiconductor wafers between the second multi-wafer cassette and the ninth wafer processing chamber, the tenth wafer processing chamber, the eleventh wafer processing chamber, and the twelfth wafer processing chamber when the second multi-wafer cassette is positioned in the second horizontal location and the first vertical cassette location and the second robot arm is positioned at the first vertical robot arm location, and
  the second robot arm is further configured to transport semiconductor wafers between the second multi-wafer cassette and the thirteenth wafer processing chamber, the fourteenth wafer processing chamber, the fifteenth wafer processing chamber, and the sixteenth wafer processing chamber when the second multi-wafer cassette is positioned in the second horizontal location and the second vertical cassette location and the second robot arm is positioned at the second vertical robot arm location.

17. The apparatus of claim 16, wherein the at least one buffer gas microclimate system also includes the at least one slot-door mechanism that is part of each of the one or more multi-wafer cassettes, wherein:
  each multi-wafer cassette has a front opening sized to allow wafers to be inserted into or withdrawn from the multi-wafer cassette;
  each slot-door mechanism includes a drive mechanism configured to translate, responsive to a mechanical input, the door vertically relative to the wafer support structures of the multi-wafer cassette of which that door is a part;
  each door has a height greater than $(2 \cdot N-1) \cdot d$; and
  each door is positioned in front of the front opening of the multi-wafer cassette of which that door is a part.

\* \* \* \* \*